(12) United States Patent
Wang et al.

(10) Patent No.: US 10,175,447 B2
(45) Date of Patent: Jan. 8, 2019

(54) ARRAY IMAGING MODULE AND MOLDED PHOTOSENSITIVE ASSEMBLY AND MANUFACTURING METHOD THEREOF FOR ELECTRONIC DEVICE

(71) Applicant: NINGBO SUNNY OPOTECH CO., LTD., Ningbo, Zhejiang (CN)

(72) Inventors: Mingzhu Wang, Ningbo (CN); Bojie Zhao, Ningbo (CN); Takehiko Tanaka, Ningbo (CN); Nan Guo, Ningbo (CN); Zhenyu Chen, Ningbo (CN); Heng Jiang, Ningbo (CN); Zhongyu Luan, Ningbo (CN); Fengsheng Xi, Ningbo (CN); Feifan Chen, Ningbo (CN); Liang Ding, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 0 days.

(21) Appl. No.: 15/705,225

(22) Filed: Sep. 14, 2017

(65) Prior Publication Data
US 2018/0012923 A1    Jan. 11, 2018

Related U.S. Application Data

(63) Continuation of application No. 15/317,117, filed as application No. PCT/CN2016/103736 on Oct. 28, 2016.

(30) Foreign Application Priority Data

Mar. 12, 2016  (CN) .......................... 2016 1 01434577
Mar. 12, 2016  (CN) ................... 2016 2 01916310 U
(Continued)

(51) Int. Cl.
*G02B 7/02*  (2006.01)
*H01L 21/56*  (2006.01)
(Continued)

(52) U.S. Cl.
CPC ........ *G02B 7/021* (2013.01); *B29C 45/14639* (2013.01); *G02B 3/0075* (2013.01);
(Continued)

(58) Field of Classification Search
CPC ...................... H01L 2924/15153; H05K 1/183
See application file for complete search history.

(56) References Cited

U.S. PATENT DOCUMENTS

| 2001/0004128 A1* | 6/2001 | Park ................... H01L 27/14618 257/680 |
| 2011/0024861 A1* | 2/2011 | Tu ..................... H01L 27/14618 257/434 |

(Continued)

*Primary Examiner* — Charles D Garber
*Assistant Examiner* — Alia Sabur
(74) *Attorney, Agent, or Firm* — Raymond Y. Chan; David and Raymond Patent Firm

(57) ABSTRACT

An array imaging module includes a molded photosensitive assembly which includes a supporting member, at least a circuit board, at least two photosensitive units, at least two lead wires, and a mold sealer. The photosensitive units are coupled at the chip coupling area of the circuit board. The lead wires are electrically connected the photosensitive units at the chip coupling area of the circuit board. The mold sealer includes a main mold body and has two optical windows. When the main mold body is formed, the lead wires, the circuit board and the photosensitive units are sealed and molded by the main mold body of the mold sealer, such that after the main mold body is formed, the main mold body and at least a portion of the circuit board are integrally formed together at a position that the photosensitive units are aligned with the optical windows respectively.

24 Claims, 50 Drawing Sheets

(30) Foreign Application Priority Data

| Mar. 15, 2016 | (CN) | .......................... 2016 1 01494440 |
| Mar. 15, 2016 | (CN) | ...................... 2016 2 0201261 U |
| Apr. 7, 2016 | (CN) | .......................... 2016 1 0214411 |
| Aug. 12, 2016 | (CN) | .......................... 2016 1 0669214 |
| Aug. 12, 2016 | (CN) | ...................... 2016 2 0875781 U |
| Aug. 12, 2016 | (CN) | ...................... 2016 2 0876056 U |

(51) Int. Cl.

| *H01L 25/065* | (2006.01) |
| *G02B 5/20* | (2006.01) |
| *G02B 3/00* | (2006.01) |
| *G02B 7/00* | (2006.01) |
| *H04N 5/225* | (2006.01) |
| *H05K 1/02* | (2006.01) |
| *H05K 1/18* | (2006.01) |
| *B29C 45/14* | (2006.01) |
| *H01L 27/146* | (2006.01) |
| *H04M 1/02* | (2006.01) |
| *B29L 31/34* | (2006.01) |

(52) U.S. Cl.
CPC ............. *G02B 5/201* (2013.01); *G02B 7/006* (2013.01); *H01L 21/565* (2013.01); *H01L 25/0655* (2013.01); *H01L 27/1469* (2013.01); *H01L 27/14618* (2013.01); *H01L 27/14625* (2013.01); *H01L 27/14627* (2013.01); *H01L 27/14634* (2013.01); *H01L 27/14685* (2013.01); *H01L 27/14687* (2013.01); *H04N 5/2252* (2013.01); *H04N 5/2253* (2013.01); *H04N 5/2254* (2013.01); *H04N 5/2257* (2013.01); *H04N 5/2258* (2013.01); *H05K 1/0203* (2013.01); *H05K 1/0274* (2013.01); *H05K 1/183* (2013.01); *H05K 1/185* (2013.01); *B29L 2031/3481* (2013.01); *H01L 27/14636* (2013.01); *H04M 1/0264* (2013.01)

(56) References Cited

U.S. PATENT DOCUMENTS

| 2011/0194023 | A1* | 8/2011 | Tam | ........................ G03B 17/02 348/374 |
| 2015/0138436 | A1* | 5/2015 | Wong | .................. H04N 5/2257 348/374 |
| 2015/0305160 | A1* | 10/2015 | Funahashi | ............... H01L 23/13 348/374 |
| 2017/0064172 | A1* | 3/2017 | Vittu | .................... H04N 5/2253 |

* cited by examiner

ARRAY IMAGING MODULE AND MOLDED PHOTOSENSITIVE ASSEMBLY AND MANUFACTURING METHOD THEREOF FOR ELECTRONIC DEVICE

CROSS REFERENCE OF RELATED APPLICATION

This is a Continuation application that claims the benefit of priority under 35 U.S.C. § 120 to a non-provisional application, application Ser. No. 15/317,117, filed Dec. 8, 2016, which is a non-provisional application that claims priority to international application number PCT/CN2016/103736, international filing date Oct. 28, 2016, and priority under 35 U.S.C. § 119 to a first Chinese invention application, application number CN 201610143457.7, filed Mar. 12, 2016, a second Chinese invention application, application number CN 201620191631.0, filed Mar. 12, 2016, a third Chinese invention application, application number CN 201610149444.0, filed Mar. 15, 2016, a fourth Chinese invention application, application number CN 201620201261.4, filed Mar. 15, 2016, a fifth Chinese invention application, application number CN 201610214411.X, filed Apr. 7, 2016, a sixth Chinese invention application, application number CN 201610669214.7, filed Aug. 12, 2016, a seventh Chinese invention application, application number CN 201620876056.8, filed Aug. 12, 2016, and an eighth Chinese invention application, application number CN 201620875781.3, filed Aug. 12, 2016, the entire contents of each of which are expressly incorporated herewith by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a camera module, and more particularly to an array imaging module and its molded photosensitive assembly and manufacturing method thereof for electronic device.

Description of Related Arts

Nowadays, most of the electronic products incorporate with an integrated circuit board to provide multiple functions in one single electronic component. In particular, it is noted that this integrated multi-function crossovers between trends. For example, the circuit board configuration of the mobile phone which is originally designed for communication purpose has been developed into a mobile electronic device such as smart phone that integrally incorporates with the integrated circuit to provide multiple functions of communication, image capturing, Internet-enabled access, navigation, and other functions. Therefore, the integrated circuit board must provide all-in-one multifunction for the smartphone.

Accordingly, most camera modules in the current mobile electronic devices are single-lens modules. However, this single-lens camera module cannot meet the requirements of high image quality and capturing effectiveness in order to meet the requirement of multi-functional application of the current mobile electronic devices.

An advanced camera module, such as a dual lens camera module, has been already used in the current mobile electronic device, wherein the dual lens camera module is configured to simulate the human eye structure for image capturing. In particular, the features and performances of the dual lens camera module, such as 3D capturing and scanning ability, gesture and location recognition, color fidelity (color accuracy or color balance), rapid focusing ability, panoramic shooting, background field of depth, and other aspects, are better than the features and performances of the single lens camera module. Therefore, there is an important development direction to include more than one lens camera module in the future camera industry. Accordingly, the dual lens camera module generally comprises two imaging modules, such that during the two imaging capturing process of the dual lens camera module, two images are captured by the imaging modules respectively. Due to the position difference between the two imaging modules, the two images will have a spatial position difference. Then, the two images will be processed via an imaging synthesis method to form a final captured image. It is important that the imaging modules must have the uniformity of imaging effects, such as resolution, shading, color, and the deviation in horizontal, vertical, and longitudinal directions, wherein these indications are the major factors to determine the image quality of the dual lens camera module.

However, the current manufacturing and assembling technologies, and the structure of the dual lens camera module cannot guarantee the imaging quality thereof. As shown in FIG. 1, the existing dual lens camera module comprises a circuit board 10P, two lens bases 20P, two imaging modules 30P, and one supporting frame 40P, wherein a lens motor assembly 31P is operatively connected to each of the imaging modules 30P. Accordingly, each of the lens bases 20P is discretely mounted on the circuit board 10P at one side thereof in order to connect the lens bases 20P with each other via the circuit board 10P. The lens motor assembly 31P is coupled at and supported by the corresponding lens base 20P. Each of the lens motor assemblies 31P is enveloped by the supporting frame 40P. As shown in FIG. 1B, the two lens bases 20P can be integrated with each other to form a single base of the dual lens camera module according to the existing technology. In other words, the lens motor assemblies 31P are mounted at different positions of the lens base 20P. It is appreciated that, through the existing assembling process of the existing dual lens camera module, each of the lens bases 20P is individually coupled at the circuit board 10P, such that the dimension, position, etc. . . . of each of the lens bases 20P is hard to control. In other words, the parameters, such as dimension and assembling position, of the dual lens camera modules are inconstant. According to the existing dual lens camera module, as shown in FIG. 1A, the lens bases 20P are individual components and are electrically coupled to the circuit board 10P in order to connect the lens bases 20P with each other. Accordingly, the circuit board 10P is a PCB circuit board, wherein the rigidity of the circuit board 10P is relatively weak, such that the circuit board 10P is easy to be deformed or bent. As a result, the overall rigidity of the dual lens camera module is hard to control and ensure. After the dual lens camera module is assembled, there will be a deviation between the two imaging modules 30P during the operation of the dual lens camera module. For example, the distance between the lens motor assemblies 31P cannot be ensured, the positioning tolerance of the lens motor assemblies 31P is relatively large, and the optical axis of each of the imaging modules 30P is easily deviated from its original preset position. Any one of these situations will affect the image quality of the dual lens camera module. For example, the uncontrollable factors and adverse effects will affect the imaging synthesis process to form the final captured image. In addition, since the lens motor assemblies 31P are wrapped within the supporting frame 40P, it is necessary to apply adhesive to a gap between the lens motor assembly 31P and the supporting frame 40P. As a result, the overall size of the dual lens camera module will further be relatively increased.

Furthermore, the assembly of the dual lens camera module is based on the conventional COB (Chip On Board) assembling process. The circuit board 10P generally comprises a circuit protrusion 11P and a photosensitive chip 12P electrically coupled on the circuit board 10P via a connecting wire such as gold wire 121P. Accordingly, the gold wire 121P has an arc-shape protruded from the board body of the circuit board, such that the circuit protrusion 11P and the gold wire 121P protruded from the circuit board 10P will adversely affect the assembling process of the dual lens camera module.

Since the circuit protrusion 11P and the gold wire 121P are protruded and exposed from the circuit board 10P, the assembling process will be unavoidably affect by these exposing components. For example, the adhering process of the lens base 20P and the welding process of the lens motor assembly 31P will be affected by the circuit protrusion 11P and the gold wire 121P. Accordingly, welding resisting agent and dust may be adhered to the lens base 20P during the welding process of the lens motor assembly 31P. Since the circuit protrusion 11P and the photosensitive chip 12P are positioned to create a gap therebetween, the dust will be accumulated at the gap thereof. It will contaminate the photosensitive chip 12P, such that the photosensitive chip 12P will produce an undesirable result, such as black spots, to affect the image quality.

Furthermore, the lens base 20P is located at an exterior side of the circuit protrusion 11P. When the lens base 20P is mounted on the circuit board 10P, a safety clearance must be provided between the lens base 20P and the circuit protrusion 11P. In particular, the safety clearance includes a horizontal direction and the upward direction of the lens base 20P with respect to the circuit board 10P. As a result, the thickness of the dual lens camera module will be substantially increased. In other words, it is almost impossible to reduce the overall thickness of the dual lens camera module.

Also, comparing the molding of the dual lens camera module with the molding of the single lens camera module, the coordination of the dual lens camera is higher than that of the single lens camera module. For example, the optical axes of the imaging modules are required being coincident and the optical axes of the lens through the conventional COB process must be consistent. Collectively, the overall size of the dual lens camera is relatively large, the rigidity of the circuit board is relatively weak, the flatness of the circuit board is relatively sensitive, and the thickness of the circuit board is relatively large.

SUMMARY OF THE PRESENT INVENTION

The invention is advantageous in that it provides an array imaging module and its molded photosensitive assembly and manufacturing method for electronic device, wherein the molded photosensitive assembly comprises mold sealer and a photosensitive device, wherein the photosensitive device comprises a circuit board and at least two photosensitive units which are electrically connected to the circuit board are sealed by the mold sealer to form an integrated structure.

Another advantage of the invention is to an array imaging module and molded photosensitive assembly and manufacturing method for electronic device, wherein the photosensitive units are electrically connected to the circuit board via one or more lead wires, wherein the lead wires are enclosed and encapsulated by the mold sealer.

Another advantage of the invention is to an array imaging module and its molded photosensitive assembly and manufacturing method for electronic device, wherein the mold sealer is extended from a non-photosensitive area of the photosensitive unit and is inwardly extended towards the photosensitive area of the photosensitive units, so as to minimize a periphery size of the mold sealer.

Another advantage of the invention is to an array imaging module and its molded photosensitive assembly and manufacturing method for electronic device, wherein the photosensitive device comprises at least an electronic element protruded from the circuit board, wherein the electronic element is enclosed by the mold sealer to prevent the exposure of the electronic element to outside.

Another advantage of the invention is to an array imaging module and its molded photosensitive assembly and manufacturing method for electronic device, wherein the mold sealer comprises a light filter mounting portion to support a plurality of light filters without any additional support.

Another advantage of the invention is to an array imaging module and its molded photosensitive assembly and manufacturing method for electronic device, wherein the mold sealer has a plurality of inner indentation grooves to engage with the photosensitive unit, such that a relative height difference between the circuit board and the photosensitive unit will be reduced to minimize the height of the array imaging module.

Another advantage of the invention is to an array imaging module and its molded photosensitive assembly and manufacturing method for electronic device, wherein the circuit board comprises a plurality of conductive channels and a plurality of outer indention grooves correspondingly formed therewith, such that the photosensitive unit can be coupled at the rear side of the circuit board via a Flip Chip (FC) method.

Another advantage of the invention is to an array imaging module and its molded photosensitive assembly and manufacturing method for electronic device, wherein the reinforcing layer is coupled at the bottom side of the circuit board not only to reinforce the strength of the circuit board but also to enhance the heat dissipation of the circuit board.

Another advantage of the invention is to an array imaging module and its molded photosensitive assembly and manufacturing method for electronic device, wherein the circuit board further comprises at least a reinforcing slot thereon and the mold sealer is extended into the reinforcing slot to enhance the strength of the circuit board.

Another advantage of the invention is to an array imaging module and its molded photosensitive assembly and manufacturing method for electronic device, wherein the mold sealer comprises a light filter mounting portion to support a plurality of light filters, so as to retain the respective light filters in position.

Another advantage of the invention is to an array imaging module and its molded photosensitive assembly and manufacturing method for electronic device, wherein the molded photosensitive assembly comprises at least a supporting member biasing against the engaging surface of the upper mold body during the molding process to protect the lead wires from being damaged or deformed.

Another advantage of the invention is to an array imaging module and its molded photosensitive assembly and manufacturing method for electronic device, wherein when the upper mold body and the lower mold body of the mold are closed and engaged with each other during the molding process, the supporting member is upwardly extended to bias against the engaging surface of the upper mold body to prevent the engaging surface of the upper mold body contacting with the lead wires so as to prevent the deformation of the lead wires.

Another advantage of the invention is to an array imaging module and its molded photosensitive assembly and manufacturing method for electronic device, wherein when the upper mold body and the lower mold body of the mold are closed and engaged with each other during the molding process, the supporting member provides a safety distance of the lead wires to prevent the engaging surface of the upper mold body pressing against the lead wires.

Another advantage of the invention is to an array imaging module and its molded photosensitive assembly and manufacturing method for electronic device, wherein when the upper mold body and the lower mold body of the mold are closed and engaged with each other during the molding process, the supporting member will absorb the impact force of the engaging surface of the upper mold body, so as to prevent the damage of the photosensitive unit, the circuit board, and the lead wires.

Another advantage of the invention is to an array imaging module and its molded photosensitive assembly and manufacturing method for electronic device, wherein when the upper mold body and the lower mold body of the mold are closed and engaged with each other during the molding process, the mold engaging surface of the upper mold body and the top side of the supporting body are tightly engaged with each other in a surface-to-surface engaging manner to prevent the edge trimming of the mold sealer, so as to enhance the imaging quality of the array imaging module.

Another advantage of the invention is to an array imaging module and its molded photosensitive assembly and manufacturing method for electronic device, wherein when the upper mold body and the lower mold body of the mold are closed and engaged with each other, the mold engaging surface of the upper mold body and the top side of the supporting body are tightly engaged with each other to form a closed environment during the molding process, so as to prevent the mold material entering into the closed environment to contaminate the photosensitive area of the photosensitive unit.

Another advantage of the invention is to an array imaging module and its molded photosensitive assembly and manufacturing method for electronic device, wherein the mold comprises an enclosing film provided at the mold engaging surface of the upper mold body, wherein when the upper mold body and the lower mold body are coupled with each other, the enclosing film is sandwiched between the mold engaging surface of the upper mold body and the top side of the supporting body, so as to prevent the damage of the photosensitive unit, the circuit board, and the lead wires.

Another advantage of the invention is to an array imaging module and its molded photosensitive assembly and manufacturing method for electronic device, wherein when the upper mold body and the lower mold body are coupled with each other, the enclosing film is sandwiched between the mold engaging surface of the upper mold body and the top side of the supporting body, to form the photosensitive area of the photosensitive unit in a closed environment so as to prevent the mold material entering into the closed environment to contaminate the photosensitive area of the photosensitive unit.

Another advantage of the invention is to an array imaging module and its molded photosensitive assembly and manufacturing method for electronic device, wherein when the mold engaging surface of the upper mold body is biased against the top side of the supporting body, the supporting member will not be deformed to prevent the deformation of the lead wire so as to maintain the electrical conductivity of the lead wires.

Another advantage of the invention is to an array imaging module and its molded photosensitive assembly and manufacturing method for electronic device, wherein the supporting member is extended to enclose at least a portion of the non-photosensitive area of the photosensitive unit to block the mold material entering into the photosensitive area of the photosensitive unit from the non-photosensitive area thereof so as to prevent the contamination of the photosensitive area of the photosensitive unit.

Another advantage of the invention is to an array imaging module and its molded photosensitive assembly and manufacturing method for electronic device, wherein the supporting member is configured to enclose the connection between the chip connector of the photosensitive unit and the circuit connector of the circuit board, such that during the molding process, the supporting member will block the mold material to enter to the connection so as to enhance the reliability of the electrical connection between the photosensitive unit and the circuit board.

Another advantage of the invention is to an array imaging module and its molded photosensitive assembly and manufacturing method for electronic device, wherein the supporting member encloses at least a portion of the peripheral portion of the circuit board during the molding process so as to block the impact force of the mold material to the lead wires.

Another advantage of the invention is to an array imaging module and its molded photosensitive assembly and manufacturing method for electronic device, wherein the supporting member encloses at least a portion of the peripheral portion of the circuit board and locates away from the photosensitive area of the photosensitive unit, such that during the formation of the supporting frame, the supporting frame will not contaminate of the photosensitive area of the photosensitive unit, so as to prevent any dark spot at the photosensitive unit.

Another advantage of the invention is to an array imaging module and its molded photosensitive assembly and manufacturing method for electronic device, wherein the supporting member encloses at least a portion of the peripheral portion of the circuit board and at least a portion of the non-photosensitive area of the photosensitive unit to securely retain the circuit board and the photosensitive unit. Therefore, when the upper mold body and the lower mold body are coupled with each other to form a mold cavity therebetween, the supporting member is able to retain the circuit board and the photosensitive unit to prevent the displacement thereof.

Another advantage of the invention is to an array imaging module and its molded photosensitive assembly and manufacturing method for electronic device, wherein the supporting member encloses at least a portion of the peripheral portion of the circuit board and at least a portion of the non-photosensitive area of the photosensitive unit, such that during the molding process, the supporting member can block the mold material entering to the clearance between the photosensitive unit and the circuit board.

Another advantage of the invention is to an array imaging module and its molded photosensitive assembly and manufacturing method for electronic device, wherein the supporting member encloses at least a portion of each of the lead wires, such that during the molding process, the lead wires are protected by the supporting member to maintain the electrical conductivity of the lead wires.

Another advantage of the invention is to an array imaging module and its molded photosensitive assembly and manufacturing method for electronic device, wherein the supporting member encloses at least a portion of each of the lead wires, such that during the operation of the array imaging module, the stray light can be prevented from entering the interior of the array imaging module so as to enhance the imaging quality of the array imaging module.

Another advantage of the invention is to an array imaging module and its molded photosensitive assembly and manufacturing method for electronic device, wherein the supporting member has a predetermined adhesive ability to adhere the contaminants, such as welding powders, during welding process of the electronic element, so as to prevent the contamination of the photosensitive area of the photosensitive unit.

Another advantage of the invention is to an array imaging module and its molded photosensitive assembly and manufacturing method for electronic device, wherein the top side of the supporting member is located above the top side of the chip connector of the photosensitive unit to prevent the damage of the chip connector of the photosensitive unit during the molding process.

Another advantage of the invention is to an array imaging module and its molded photosensitive assembly and manufacturing method for electronic device, wherein the supporting member encloses the chip connector of the photosensitive unit, such that during the molding process, the supporting member will block the mold material entering to or enclosing with the chip connector of the photosensitive unit, so as to protect the chip connector of the photosensitive unit.

Another advantage of the invention is to an array imaging module and its molded photosensitive assembly and manufacturing method for electronic device, wherein the supporting member is formed at an outer portion of the chip connector of the photosensitive unit to prevent the mold material contacting with the chip connector of the photosensitive unit during molding process. In other words, the supporting member will block the mold material entering to or enclosing with the chip connector of the photosensitive unit, so as to protect the chip connector of the photosensitive unit.

Another advantage of the invention is to an array imaging module and its molded photosensitive assembly and manufacturing method for electronic device, wherein the supporter has at least two supporting cavities to couple with the drivers or the supporting members for ensuring the optical lenses to be coaxially aligned with the drivers respectively.

Another advantage of the invention is to an array imaging module and its molded photosensitive assembly and manufacturing method for electronic device, wherein the light filter is retained between the respective photosensitive unit and the respective optical lens for filtering out the stray light from the optical lens so as to ensure the light entering into the interior of the array imaging module for enhancing the imaging quality of the array imaging module.

Additional advantages and features of the invention will become apparent from the description which follows, and may be realized by means of the instrumentalities and combinations particular point out in the appended claims.

According to the present invention, the foregoing and other objects and advantages are attained by a molded photosensitive assembly of an array imaging module, which comprises:

a mold sealer; and a photosensitive device which comprises at least a circuit board and at least two photosensitive units electrically coupled at the circuit board, wherein the circuit board and the photosensitive units are sealed by the mold sealer to form a one piece integrated device.

In one embodiment, the mold sealer has two optical windows aligned with the photosensitive units to form two light channels for the photosensitive units respectively.

In one embodiment, each of the optical windows of the mold sealer is configured to have a tapered size that a cross section of the optical window is gradually increased from bottom to top.

In one embodiment, a top side of the mold sealer is arranged for supporting a supporter, an optical lens, a driver or a light filter.

In one embodiment, the mold sealer further has at least a coupling slot formed at a top side thereof and extended corresponding to the optical window for engaging with the supporter, the optical lens, the driver, or the light filter.

In one embodiment, the mold sealer has an enclosing portion, a light filter mounting portion, and a lens mounting portion, wherein the light filter mounting portion and the lens mounting portion integrally and upwardly extended from the enclosing portion to form a step-like platform to spacedly support the light filter and the optical lens in position.

In one embodiment, the light filter mounting portion has two mounting slots located corresponding to the optical window to form a first step of the step-like platform so as to support the light filter thereat. The lens mounting portion further has two lens mounting slots located corresponding to the optical window to form a second step of the step-like platform so as to support the optical lens thereat.

In one embodiment, the lens mounting portion further has two lens inner walls, wherein each of the lens inner walls is a flat surface to couple with the optical lens without any threaded structure.

In one embodiment, the photosensitive device comprises at least a lead wire electrically connected the photosensitive unit with the circuit board, wherein the lead wire is enclosed by the mold sealer to prevent the lead wire from being exposure outside.

In one embodiment, the lead wire can be a gold wire, silver wire, cooper wire or aluminum wire.

In one embodiment, the lead wire has a curved configuration to electrically connect between the photosensitive unit and the circuit board.

In one embodiment, each photosensitive unit has a photosensitive area and a non-photosensitive area, wherein the photosensitive area is encircled within the non-photosensitive area. The mold sealer is extended inwardly from the non-photosensitive area towards the photosensitive area to minimize the peripheral size of the mold sealer.

In one embodiment, the photosensitive device comprises at least an electronic element protruded from the circuit board, wherein the mold sealer encloses the electronic element to prevent the electronic element from being exposure outside.

In one embodiment, the electronic element can be a resistor, a capacitor, a diode, a triode, a potentiometer, a relay, a driver, a processor, or a combination of above.

In one embodiment, the photosensitive device comprises at least two light filters covering the photosensitive units respectively, wherein the mold sealer encloses the circuit board, the photosensitive units, and the light filters, such that each of the photosensitive units is protected by the respective light filter to reduce the focal length and the height of the array imaging module.

In one embodiment, the photosensitive device further comprises a reinforcing layer overlapped and connected to the circuit board to reinforce the strength of the circuit board.

In one embodiment, the reinforcing layer is a metal panel to enhance the heat dissipation of the circuit board.

In one embodiment, the photosensitive device further comprises a shielding layer that encloses the circuit board and the mold sealer to enhance the strength of the circuit board and to prevent any electromagnetic interference of the molded photosensitive assembly.

In one embodiment, the shielding layer can be a metal panel or a metal net.

In one embodiment, the photosensitive device has a least a reinforcing slot, wherein the mold sealer is extended into the reinforcing slot to enhance the strength of the circuit board.

In one embodiment, the reinforcing slot is an indention cavity.

In one embodiment, the reinforcing slot is a through slot, such that the mold sealer is extended through the circuit board to maximize a contacting area therebetween and to integrally form with the circuit board so as to combine the mold sealer with the circuit board. In addition, the reinforcing slot as the through slot can be easily formed on the circuit board.

In one embodiment, the circuit board can be a soft-hard combination board, a ceramic substrate, a hard PCB board, or a FPC.

In one embodiment, the mold material of the mold sealer can be nylon, LCP (Liquid Crystal Polymer), PP (Polypropylene), or the combination of above.

In one embodiment, the molded photosensitive assembly further comprises at least two motor connecting units, each of the motor connecting units having a first connecting wire embedded in the mold sealer and electrically connected to the circuit board. The first connecting wire has a first motor connecting end exposed and extended above the top side of the mold sealer to electrically connect to the driver connecting terminal of the driver.

In one embodiment, the molded photosensitive assembly further comprises at least two motor connecting units, each of the motor connecting units having at least a connecting wire and a terminal slot. The connecting wire is embedded in the mold sealer and electrically connected to the circuit board. The first terminal slot of the motor connecting unit is extended to the top side of the mold sealer. The connecting wire is set at the mold sealer and is extended to the bottom wall surface of the terminal slot. The connecting wire comprises a second motor connecting end provided at the mold sealer and extended to the bottom wall surface of the terminal slot, wherein the second motor connecting end is electrically coupled to the driver connecting terminal of the driver.

In one embodiment, the molded photosensitive assembly further comprises at least two motor connecting units, each of the motor connecting units having at least a terminal slot and at least a circuit terminal. The circuit terminal is pre-set at the circuit board and electrically connected to the circuit board. The terminal slot is provided in the mold sealer and is extended from the circuit board to the top side of the mold sealer. The circuit terminal is extended corresponding to the terminal slot for connecting with the driver connecting terminal of the driver.

In one embodiment, the molded photosensitive assembly further comprises at least two motor connecting units, each of the motor connecting units having at least an engraving circuit electrically connected to the circuit board, wherein the engraving circuit is embedded in the mold sealer for connecting with the driver connecting terminal of the driver.

In one embodiment, the engraving circuit is formed by Laser Direct Structuring (LDS) to be embedded in the mold sealer.

In accordance with another aspect of the invention, the present invention comprises an array imaging module, which comprises:

a molded photosensitive assembly which comprises a mold sealer and a photosensitive device which comprises a circuit board and at least two photosensitive units electrically coupled at the circuit board, wherein the circuit board and the photosensitive units are sealed by the mold sealer to form a one piece integrated device; and at least two optical lenses coupled to the molded photosensitive assembly and located along two photosensitive paths of the photosensitive units respectively.

In one embodiment, the array imaging module further comprises a supporter coupled at the photosensitive units, and at least two light filters being supported by the supporter.

In one embodiment, the array imaging module further comprises at least two drivers operatively coupled to the two optical lenses respectively, wherein the drivers are coupled to the photosensitive units respectively.

In one embodiment, the array imaging module further comprises at least two light filters coupled to the photosensitive units respectively.

In one embodiment, the array imaging module further comprises at least two light filters integrally formed with the photosensitive units respectively by the mold sealer.

In accordance with another aspect of the invention, the present invention comprises a manufacturing method of a molded photosensitive assembly of an array imaging module, which comprises a step of: molding a mold sealer to integrally enclose, package and seal a circuit board and at least two photosensitive units.

In one embodiment, before the molding step, the method further comprises a step of electrically connecting the photosensitive units to the circuit board via at least a lead wire.

In one embodiment, the molding step further comprises a step of enclosing the lead wire by the mold sealer.

In one embodiment, the molding step further comprises a step of extending the mold sealer to a non-photosensitive area of the photosensitive unit.

In one embodiment, the method further comprises a step of forming at least a coupling slot at a top side of the mold sealer for engaging with the supporter, the optical lenses, the drivers or the light filters.

In one embodiment, the method further comprises a step of forming a step-like platform that upwardly extends from an inner side of the mold sealer for spacedly supporting the light filters and the optical lenses in position.

In one embodiment, the molding step further comprises a step of forming a threaded structure at an inner wall of the mold sealer for coupling with the optical lenses with a corresponding threaded configuration.

In one embodiment, before the molding step, the method further comprises a step of forming at least a reinforcing slot, which is an indention cavity, at the circuit board, wherein the mold sealer is extended into the reinforcing slot to enhance the strength of the circuit board.

In one embodiment, before the molding step, the method further comprises a step of forming at least a reinforcing slot, which is a through slot, at the circuit board, wherein the mold sealer is extended into the reinforcing slot to enhance the strength of the circuit board.

In one embodiment, before the molding step, the method further comprises a step of forming at least a reinforcing layer overlapped and connected to the circuit board to reinforce the strength of the circuit board.

In one embodiment, the molding step further comprises a step of forming a shielding layer that encloses the circuit board and the mold sealer to enhance the strength of the circuit board and to prevent any electromagnetic interference of the molded photosensitive assembly.

In one embodiment, the molding step further comprises a step of pre-setting a plurality of connecting wires in the mold sealer that are electrically connected to the circuit board for electrically connecting with the drivers respectively.

In one embodiment, the molding step further comprises a step of pre-setting a plurality of terminal slots at the top side of the mold sealer for enabling the driver connecting terminals of the connecting wires exposing at the terminal slots respectively.

In one embodiment, the molding step further comprises a step of pre-setting a plurality of terminal slots in the mold sealer and a plurality of circuit terminals at the circuit board and extended to expose at the terminal slots respectively for the driver connecting terminals of the drivers inserted into the terminal slots to connect with the circuit terminals respectively.

In one embodiment, the molding step further comprises a step of pre-setting a plurality of engraving circuits electrically connected to the circuit board, wherein the engraving circuits are embedded in the mold sealer for electrically connecting with the drivers respectively.

In one embodiment, the engraving circuit is formed by Laser Direct Structuring (LDS) to be embedded in the mold sealer.

In accordance with another aspect of the invention, the present invention comprises a molded photosensitive assembly, which comprises:

a supporting member formed by a first medium;

at least a circuit board which has a chip coupling area;

at least two photosensitive units coupled at the chip coupling area of said circuit board;

at least two lead wires each having two ends, wherein the ends of the lead wires are electrically connected to the chip connectors of the photosensitive units and the chip coupling areas of said circuit board respectively; and a mold sealer which is made of a second medium, wherein the mold sealer comprises a main mold body and has at least two optical windows, wherein when the main mold body of the mold sealer is formed, the lead wires, the circuit board, and the photosensitive units are sealed and molded by the main mold body of the mold sealer, such that after the main mold body is formed, the main mold body and at least a portion of the circuit board are integrally formed together at a position that the photosensitive units are aligned with the optical windows respectively.

In one embodiment, the molded photosensitive assembly is constructed to have two supporting members, one circuit board, two photosensitive units and two sets of lead wires, wherein the circuit board has two chip coupling areas.

In one embodiment, the molded photosensitive assembly is constructed to have two supporting members, two circuit boards, two photosensitive units and two sets of lead wires, wherein each of the circuit boards has one chip coupling area.

In one embodiment, the molded photosensitive assembly further comprises at least an electronic element, wherein the circuit board further has a peripheral area integrally extended from the chip coupling area, wherein the electronic element is electrically coupled at the peripheral area of the circuit board, wherein the supporter is located between the electronic element and a photosensitive area of the photosensitive unit.

In one embodiment, the supporting member comprises an encircling frame shaped supporting body and has a through hole, wherein the supporting body is coupled at the photosensitive unit out of the photosensitive area thereof, wherein the photosensitive area of the photosensitive unit is aligned with the through hole, wherein at least a portion of the supporting member is enclosed by the mold sealer.

In one embodiment, the supporting member has a top side, an inner lateral side, and an outer lateral side, wherein the inner lateral side and the outer lateral side are inwardly and outwardly extended from the top side respectively, wherein the through hole is formed within the inner lateral side, wherein at least the outer lateral side of the supporting member is enclosed by the mold sealer.

In one embodiment, the supporting member has a top side, an inner lateral side, and an outer lateral side, wherein the inner lateral side and the outer lateral side are inwardly and outwardly extended from the top side respectively, wherein the through hole is formed within the inner lateral side, wherein at least the outer lateral side and the top side of the supporting member are enclosed by the mold sealer.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of the chip inner lateral side of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of the chip connecting portion of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of the chip outer lateral side of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of each of the chip inner lateral side and the chip connecting portion of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of each of the chip outer lateral side and the chip connecting portion of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of the chip inner lateral side, the chip connecting portion, and at least a portion of chip outer lateral side of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein at least a portion of the chip inner lateral side and at least a portion of chip outer lateral side of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein the chip inner lateral side, at least a portion of the chip connecting portion, and at least a portion of chip outer lateral side of the photosensitive unit are enclosed by the supporting body.

In one embodiment, the non-photosensitive area of the photosensitive unit has a chip inner lateral side, a chip connecting portion, and a chip outer lateral side, wherein the chip connector is formed at the chip connecting portion, wherein the chip connecting portion is located between the chip inner lateral side and the chip outer lateral side, wherein the chip inner lateral side, the chip connecting portion, at least a portion of chip outer lateral side of the photosensitive unit, and at least a portion of the outer peripheral portion of the photosensitive unit are enclosed by the supporting body.

In one embodiment, at least a portion of the chip connecting portion of the photosensitive unit is enclosed by the supporting body.

In one embodiment, at least a portion of the chip inner lateral side of the photosensitive unit is enclosed by the supporting body.

In one embodiment, at least a portion of the chip outer lateral side of the photosensitive unit is enclosed by the supporting body.

In accordance with another aspect of the invention, the present invention comprises an array imaging module, comprising:

at least two optical lenses; and
a molded photosensitive assembly, which comprises:
a supporting member formed by a first medium;
at least a circuit board each having at least a chip coupling area;
at least two photosensitive units each of which is coupled at the chip coupling area of the circuit board;
at least two lead wires electrically coupling between chip connectors of the photosensitive units and the chip coupling areas of said circuit board respectively; and
a mold sealer which is made of a second medium, wherein the mold sealer comprises a main mold body and has at least two optical windows, wherein when the main mold body of the mold sealer is formed, the lead wires, the circuit board and the photosensitive units are sealed and molded by the main mold body of the mold sealer, such that after the main mold body is formed, the main mold body and at least a portion of the circuit board are integrally formed together at a position that the photosensitive units are aligned with the optical windows respectively, wherein the optical lenses are installed aligned the photosensitive paths of the photosensitive units so as to provide at least of light channels via the optical windows for the optical lenses and the photosensitive units respectively.

In one embodiment, the array imaging module further comprises at least two drivers, wherein the optical lenses are operatively coupled with the drivers respectively, wherein the drivers are installed at a top side of the main mold body of the mold sealer.

In one embodiment, the array imaging module further comprises at least a driver and at least a lens barrel, wherein each of the optical lenses is operatively coupled at the respective driver and lens barrel, wherein the driver and the lens barrel are coupled at the top side of the main mold body of the mold sealer at different locations.

In one embodiment, the lens barrel is integrally extended from the top side of the main mold body of the mold sealer.

In one embodiment, the lens barrel is mounted at the top side of the main mold body of the mold sealer.

In one embodiment, the array imaging module further comprises at least two lens barrels which are integrally extended from the top side of the main mold body of the mold sealer, wherein the optical lenses are operatively coupled to the lens barrels respectively.

In one embodiment, the array imaging module further comprises at least two lens barrels, wherein one of the lens barrels is integrally extended from the top side of the main mold body of the mold sealer and another lens barrel is mounted at top side of the main mold body of the mold sealer, wherein the optical lenses are operatively coupled to the lens barrels respectively.

In one embodiment, the array imaging module further comprises at least two lens barrels which are coupled at a top side of the main mold body of the mold sealer, wherein the optical lenses are operatively coupled to the lens barrels respectively.

In one embodiment, the array imaging module further comprises a supporter having at least two supporting cavities, wherein the drivers are received at the supporting cavities respectively.

In one embodiment, the array imaging module further comprises a supporter having at least two supporting cavities, wherein the driver and the lens barrel are received at the supporting cavities respectively.

In one embodiment, the array imaging module further comprises a supporter having at least two supporting cavities, wherein the lens barrels are received at the supporting cavities respectively.

In one embodiment, a filler is filled between an outer casing of the driver and an inner wall of the supporter.

In one embodiment, a filler is filled between an outer casing of the driver and an inner wall of the supporter, and between the lens barrel and the inner wall of the supporter.

In one embodiment, a filler is filled between the lens barrel and an inner wall of the supporter.

In one embodiment, the filler is adhesive.

In one embodiment, the array imaging module further comprises at least a light filter coupled at the top side of the main mold body of the mold sealer, wherein the light filter is supported between the optical lens and the photosensitive unit.

In one embodiment, the main mold body has at least two inner lateral top surfaces and an outer lateral top surface, wherein the light filter is coupled at the inner lateral top surface of the main mold body, and the driver is coupled at the outer lateral top surface of the main mold body.

In one embodiment, the inner lateral top surface of the main mold body is located below the outer lateral top surface to form at least an indention slot, wherein the light filter is coupled at the inner lateral top surface within the indention slot.

In one embodiment, the array imaging module further comprises a supporting member and at least a light filter, wherein the light filter is coupled at the supporting member, wherein the supporting member is coupled at a top side of the main mold body, so as to retain the light filter at a position between the optical lens and the photosensitive unit.

In one embodiment, the main mold body has at least two inner lateral top surfaces and an outer lateral top surface, wherein the supporting member is coupled at the inner lateral top surface of the main mold body, and the driver is coupled at the outer lateral top surface of the main mold body.

In one embodiment, the inner lateral top surface of the main mold body is located below the outer lateral top surface to form at least an indention slot, wherein the supporting member is coupled at the inner lateral top surface within the indention slot.

In one embodiment, the supporting member has an encircling frame shape supporting body and a through hole, wherein the supporting body is coupled at the photosensitive unit out of the photosensitive area thereof, wherein the photosensitive area of the photosensitive unit is aligned with the through hole, wherein at least a portion of the supporting member is enclosed by the mold sealer.

In one embodiment, at least a portion of the peripheral portion of the circuit board is enclosed by the supporting member.

In one embodiment, at least a portion of the non-photosensitive area of the photosensitive unit is enclosed by the supporting member.

In one embodiment, at least a portion of the peripheral portion of the circuit board and at least a portion of the non-photosensitive area of the photosensitive unit are enclosed by the supporting member.

In one embodiment, the supporting member has a predetermined elasticity.

In one embodiment, the supporting member has a predetermined adhesive ability.

In one embodiment, the supporting member is made of adhesive after solidification.

In one embodiment, the Shore A hardness of the supporting body has a range between A50 and A80.

In one embodiment, the elasticity of the supporting body has a range between 0.1 Gpa and 1 Gpa.

In one embodiment, the thickness of the supporting member is larger than or equal to an apex of the lead wire being bent in a curve configuration.

In one embodiment, at least two drivers are integrally formed at a motor carrier.

In accordance with another aspect of the invention, the present invention comprises an electronic device, comprising:

an electronic device body; and at least an array imaging module mounted in the device body for image capturing, wherein the array imaging module comprises:

at least two optical lenses; and a molded photosensitive assembly which comprises:

a supporting member formed by a first medium;

at least a circuit board which has a chip coupling area;

at least two photosensitive units coupled at the chip coupling area of said circuit board;

at least two lead wires electrically coupling between chip connectors of the photosensitive units and the chip coupling areas of said circuit board respectively;

a mold sealer which is made of a second medium, wherein the mold sealer has a main mold body and at least two optical windows, wherein when the main mold body of the mold sealer is formed, the lead wires, the circuit board and the photosensitive units are molded and protected by the main mold body of the mold sealer, such that after the main mold body is formed, the main mold body and at least a portion of the circuit board are integrally formed together to form an integral body positioned at a position that the photosensitive units are aligned with the optical windows respectively, wherein the optical lenses are installed to align with the photosensitive paths of the photosensitive units respectively, so as to provide a light channel for each of optical lenses and the respective photosensitive unit via the respective optical window.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
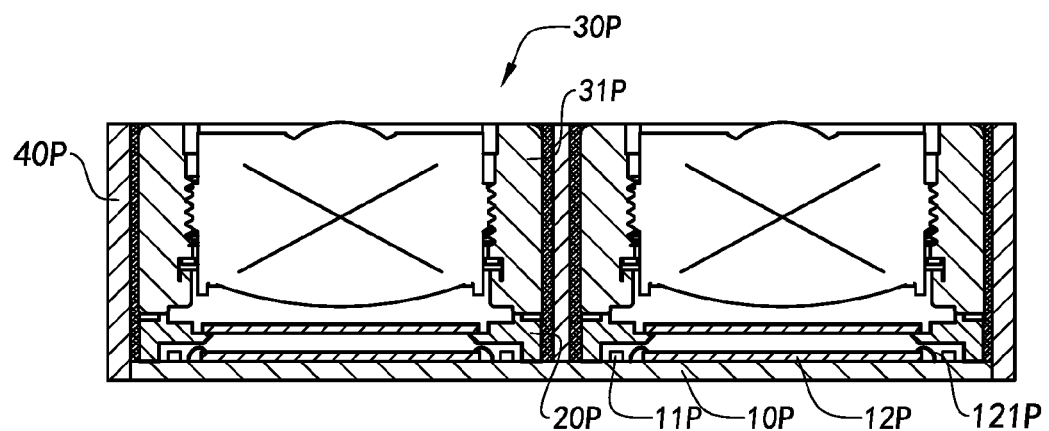
FIGS. 1A and 1B illustrate a conventional dual lens camera module.
Figure 1B:
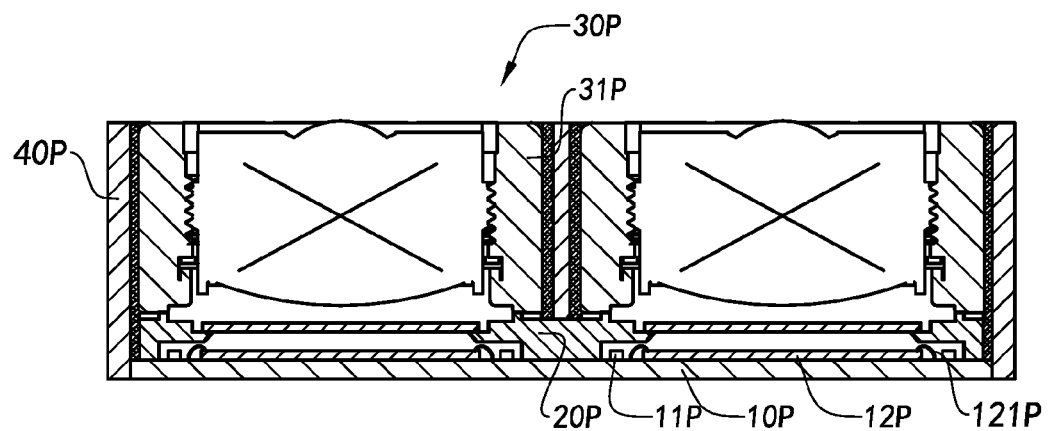
Figure 2:
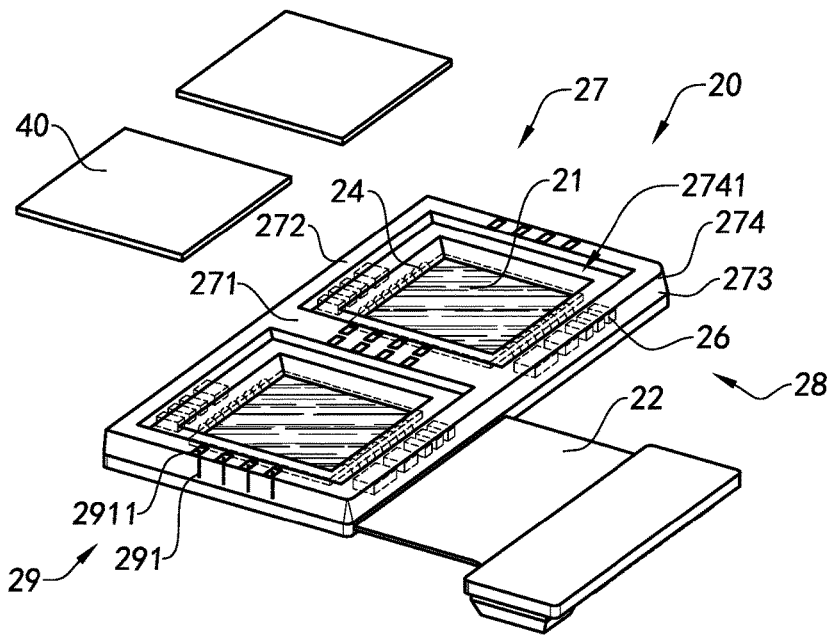
FIG. 2 is a perspective view of an array imaging module according to a first preferred embodiment of the present invention.
Figure 3:
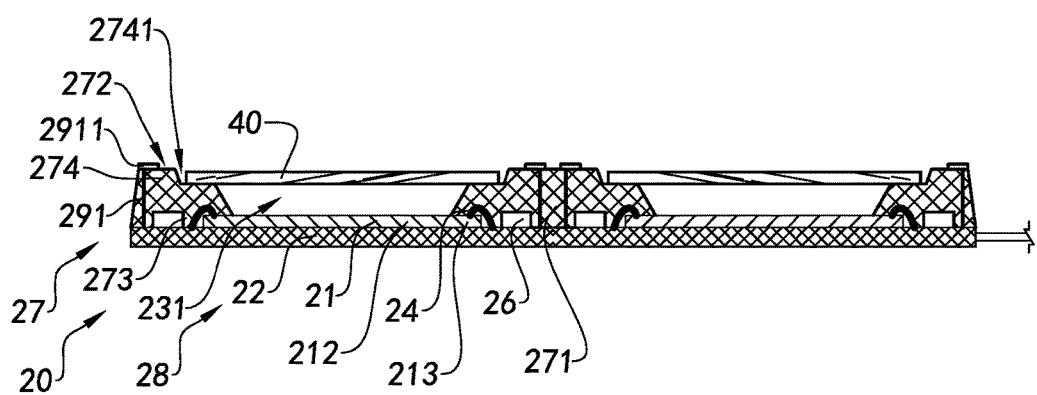
FIG. 3 is a sectional view of the array imaging module according to the first preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

It is appreciated that the terms "longitudinal", "transverse", "upper", "lower", "front", "rear", "left", "right", "vertical", "horizontal", "top", "bottom", "exterior", and "interior" in the following description refer to the orientation or positioning relationship in the accompanying drawings for easy understanding of the present invention without limiting the actual location or orientation of the present invention. Therefore, the above terms should not be an actual location limitation of the elements of the present invention.

Referring to FIGS. 2 to 6A, an array imaging module according to a first embodiment of the present invention is illustrated, wherein the array imaging module comprises a molded photosensitive assembly 20 used to assemble and produce the array imaging module. The molded photosensitive assembly 20 comprises a mold sealer 27 (also named as molded base in other embodiments) and a photosensitive device 28 which is integrally sealed by and coupled to the mold sealer 27. For example, the mold sealer 27 is molded and formed at the photosensitive device 28.

The photosensitive device 28 comprises a circuit board 22 and at least two photosensitive units 21 which are electrically coupled at the circuit board 22. In one embodiment, the photosensitive units 21 are molded and connected to the circuit board 22. In particular, the mold sealer 27 is molded and formed at the photosensitive device 28 by Molding on Chip (MOC) method.

The mold sealer 27 has two optical windows 231, wherein the mold sealer 27 is formed at an outer periphery of the photosensitive unit 21. Two optical lenses 10 are located along optical paths of the photosensitive units 21 respectively. In particular, the optical lenses 10 are supported at the optical windows 231 of the mold sealer 27 corresponding to the locations of the circuit board 22.

The mold sealer 27 comprises a connecting body 271 and two outer annular bodies 272, wherein the connecting body 271 is integrally extended between the outer annular bodies 272, such that the optical windows 231 are defined at the outer annular bodies 272 respectively. Accordingly, the photosensitive units 21 are positioned at two sides of the connecting body 271 respectively. It is worth mentioning that the connecting body 271 serves as a common sharing portion for the optical lenses 10, such that when the optical lenses 10 are coupled at the connecting body 271, same portions of the optical lenses 10 will occupy the connecting body 271.

According to the preferred embodiment, the photosensitive device 28 comprises a connecting circuit (not shown in drawings) and at least an electronic element 26. The connecting circuit is pre-formed on the circuit board 22. The electronic element 26 is electrically connected to the connecting circuit to couple at the circuit board 22, wherein the electronic element 26 is electrically connected to the photosensitive units 21 for operating the photosensitive process of the photosensitive units 21. The electronic element 26 is outwardly protruded from the circuit board 22. The electronic element 26 can be, but not limit to, a resistor, a capacitor, a diode, a triode, a potentiometer, a relay, a processor, a driver, or etc.

It is worth mentioning that the electronic element 26 is enclosed by the mold sealer 27 to prevent the exposure of the electronic element 26 from air outside. In other words, the electronic element 26 is hidden within the mold sealer 27 to prevent any contamination, such as dust, from the surroundings during the operation of the array imaging module. Unlike the conventional camera module, the electronic element 26, such as the capacitor, is exposed to the surroundings. Therefore, the mold sealer 27 of the present invention can prevent any dust or residue remaining at the surface of the electronic element 26 to contaminate the photosensitive unit 21 which may cause a black spot and the like on the image.

It is worth mentioning that the electronic element 26 is protruded from the circuit board 22 in one embodiment. In another embodiment, the electronic element 26 is embedded in the circuit board 22, such that the electronic element 26 is not protruded from the circuit board 22. It is appreciated that the structure, type, and location of the electronic element 26 should not be restricted. Accordingly, the electronic element 26 can be enclosed by the connecting body 271 at a position between the two photosensitive units 21. Therefore, unlike the conventional camera module, the array imaging module of the present invention does not require any additional installing space for the electronic element 26 so as to reduce the overall size of the array imaging module.

According to the preferred embodiment, the photosensitive device 28 further comprises a plurality of connecting elements such as lead wires 24 for electrically connecting to the photosensitive units 21 and the circuit board 22. In particular, the lead wire 24 can be, but not limit to, gold wire, aluminum wire, copper wire, or silver wire. In addition, the lead wire 24 has a curved configuration to electrically connect between the photosensitive units 21 and the circuit board 22.

It is worth mentioning that each of the lead wires 24 is sealed and embedded in the mold sealer 27, wherein the lead wires 24 are enclosed by the mold sealer 27, so as to prevent the exposure of the lead wires 24 to outside. When assembling the array imaging module, the lead wires 24 will not be damaged by any external contact or any external factor, such as temperature. Therefore, the lead wires 24 can effectively and stably transmit signal between the photosensitive units 21 and the circuit board 22. The embedded lead wires 24 of the present invention are superior than the exposed wires of the conventional camera module.

In one embodiment, the optical window 231 of the mold sealer 27 can be configured to have a tapered size that a cross section of the optical window 231 is gradually increased from bottom to top.

It is worth mentioning that the electronic element 26 and the lead wires 24 are enclosed by the mold sealer 27, such that the electronic element 26 and the lead wires 24 are protected by the mold sealer 27. It is appreciated that the mold sealer 27 can be directly molded and formed at the circuit board 22 while the one or more electronic elements 26 are embedded in the circuit board 22. In addition, the mold sealer 27 can also formed at different locations of the electronic elements 26, such as at an outer periphery of the electronic elements 26 or surrounding the electronic elements 26.

Furthermore, each of the photosensitive unit 21 has a photosensitive area 212 and a non-photosensitive area 213, wherein the photosensitive area 212 is encircled within the non-photosensitive area 212 and is arranged for providing photosensitive effect. The lead wires 24 are operatively linked to the non-photosensitive area 213.

According to the preferred embodiment, the mold sealer 27 is extended to the non-photosensitive area 213 of the photosensitive unit 21 and is overlappedly coupled at the circuit board 22 via the molding process. Through the molding process, such as Molding on Chip (MOC) method, the mold sealer 27 can be enlarged its covering area at its inward direction, so as to reduce the outward extension of the mold sealer 27. As a result, the size of the mold sealer 27 can be reduced to minimize the length and width size of the array imaging module.

According to the preferred embodiment, the mold sealer 27 is protrudedly encircled around an outer periphery of the photosensitive area 212 of the photosensitive unit 21. In particular, the mold sealer 27 is integrally connected to the photosensitive unit 21 to provide a good sealing effect therefor. In other words, when the molded photosensitive assembly 20 is assembled, the photosensitive device is sealed and enclosed therewithin to form a closed environment.

Figure 4:
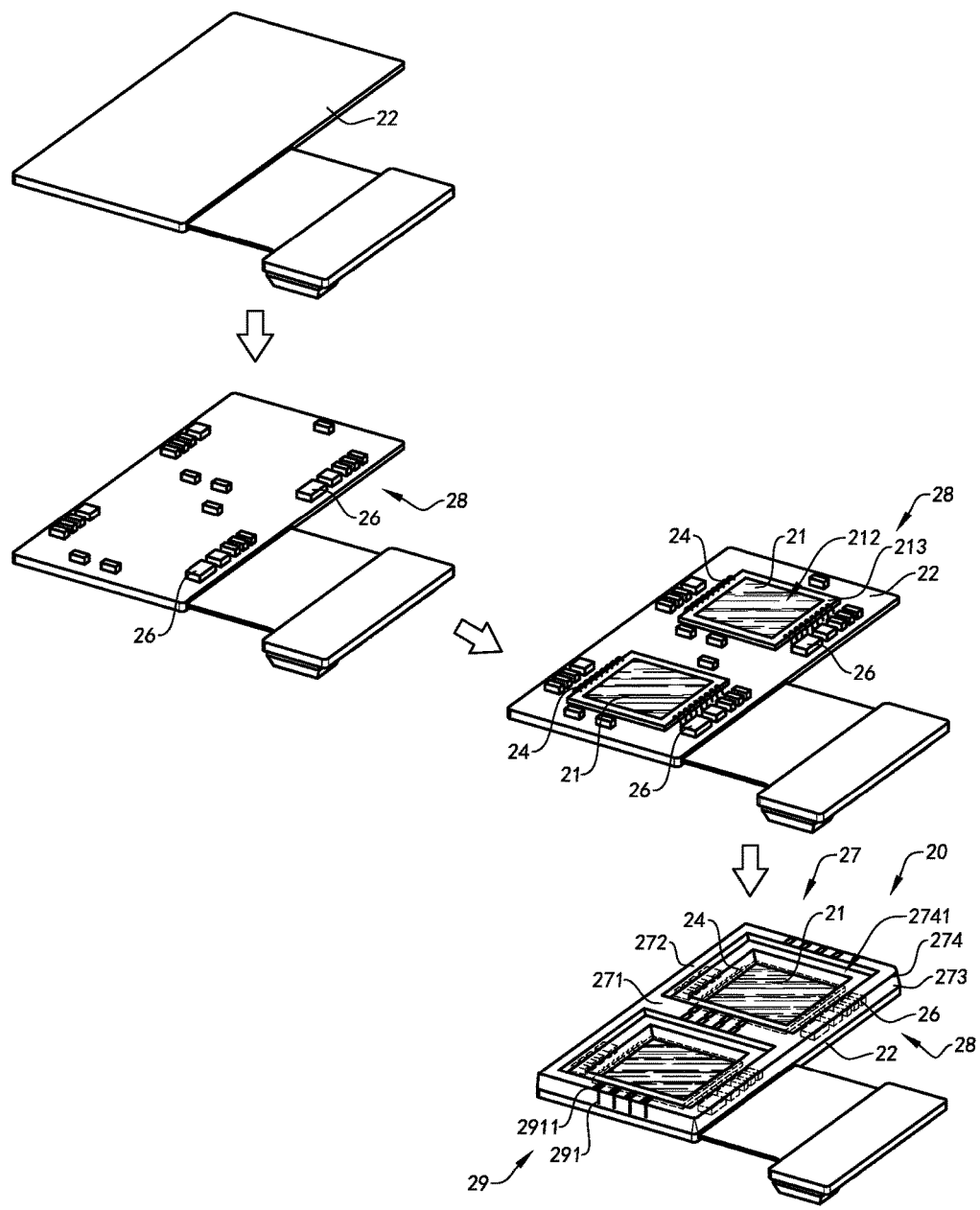
FIG. 4 is a perspective view illustrating the manufacturing process of the array imaging module according to the first preferred embodiment of the present invention.
Figure 5:
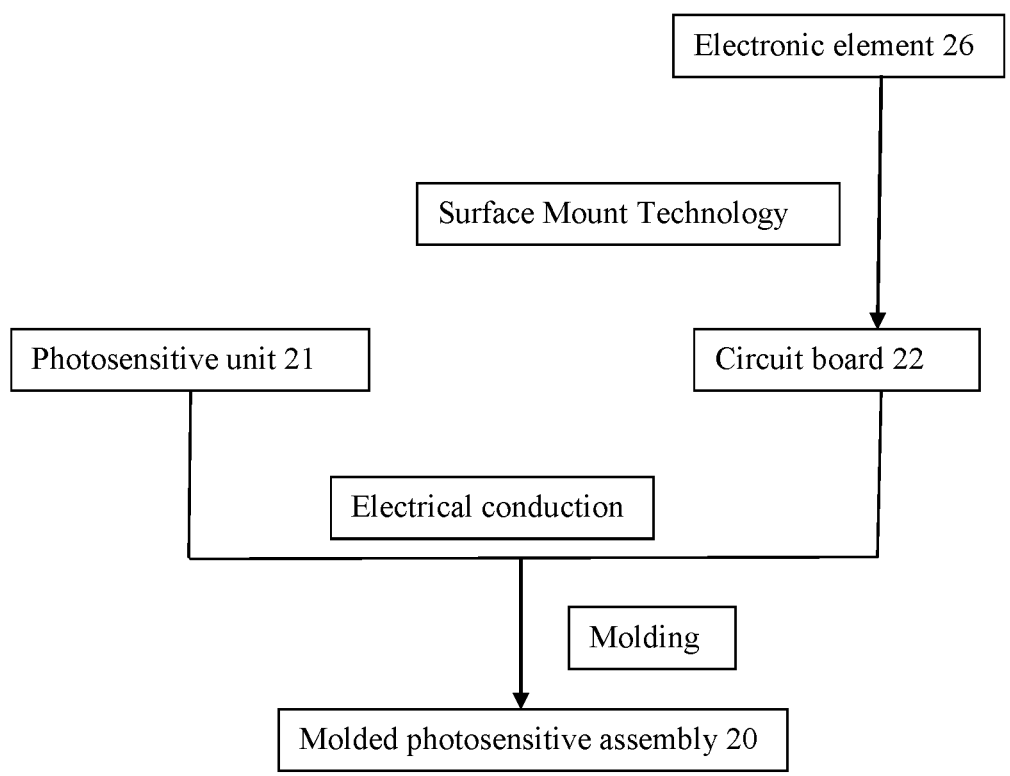
FIG. 5 is a block diagram illustrating the manufacturing process of the array imaging module according to the first preferred embodiment of the present invention.

Referring to FIGS. 4 and 5, during the manufacturing process of the molded photosensitive assembly 20, the circuit board 22, which can be a conventional circuit board, can be used for supporting the two photosensitive units 21, such as coupling the two photosensitive units 21 on the circuit board 22. Then, the two photosensitive units 21 can be electrically connected to the circuit board 22 via the lead wires 24, such as gold wire connection. Then, the photosensitive units 21 and the circuit board 22 can be initially packed and sealed by molding process to form an integral body. For example, by using a mold injection machine for introducing or injecting mold material via Insert Molding technology and Surface Mount Technology to mold and form the mold sealer 27 or via a semiconductor packaging technology and press mold technology to mold and form the mold sealer 27. The circuit board 22 can be, but not limited to, a soft-hard combination board, ceramic substrate (non-flexible board), or a hard PCB board (non-flexible board). The molding process can be, but not limit to, the injection molding process or press-molding process. The injection mold material can be nylon, LCP (Liquid Crystal Polymer), PP (Polypropylene), or the like. It is appreciated that different materials can be selectively used in different molding processes and should not be restricted in the present invention. The process of forming the mold sealer 27 should not be restricted in the present invention.

Furthermore, the mold sealer 27 has an enclosing portion 273 and a light filter mounting portion 274 integrally extended from the enclosing portion 273. The enclosing portion 273 is molded and coupled at the circuit board 22 to enclose the one or more electronic elements 26 and the lead wires 24. The light filter mounting portion 274 is arranged for coupling with a light filter 40. In other words, when assembling the molded photosensitive assembly 20 of the array imaging module, the light filter 40 can be coupled at the light filter mounting portion 274 to ensure the light filter 40 to be aligned along the photosensitive path of the respective photosensitive unit 21 without any additional light filter supporting frame. Therefore, the mold sealer 27 also serves as a supporter to support the light filter 40. Due to the molding process, the size and shape of the mold sealer 27 can be modified to have a flatness, such that the light filter 40 can be stably coupled at the light filter mounting portion 274, wherein this feature cannot be achieved by the conventional camera module.

In addition, the light filter mounting portion 274 has two coupling slots 2741 formed corresponding to the optical windows 231 for engaging with the photosensitive units 21 respectively. Therefore, the light filter mounting portion 274 provides enough space for the light filter 40 to prevent the light filter 40 being protruded from a top side of the light filter mounting portion 274. In other words, the two coupling slots 2741 are formed at the light filter mounting portion 274 that the light filters 40 are engaged with the coupling slots 2741 without protruding out of the top side of the light filter mounting portion 274. Accordingly, the light filter 40 can be an infrared cut-off light filter, IRCF.

It is worth mentioning that the coupling slots 2741 can be engaged with the light filters 40 respectively in one embodiment. In another embodiment, the coupling slots 2741 can be used for engaging with motors or lens barrels of the array imaging module respectively. It is appreciated that the size and shape of the coupling slot 2741 should not be restricted in the present invention.

It is worth mentioning that the inner wall of the mold sealer 27 can be configured corresponding to the shape of the lead wire 24. For example, the inner wall of the mold sealer 27 can be configured in a slanted manner to not only enclose the lead wire 24 but also reduce any reflected stray light from the inner wall of the mold sealer 27 so as to enhance the imaging quality of the array imaging module. It is appreciated that the shape of the mold sealer 27 should not be restricted in the present invention.

Furthermore, according to the preferred embodiment, the molded photosensitive assembly 20 comprises at least two motor connecting units 29, wherein each of the motor connecting units 29 is arranged to connect to a driver 30. The driver 30 comprises at least a driver connecting terminal 31. Each of the motor connecting units 29 comprises a first connecting wire 291 that electrically connects to the driver 30 and the circuit board 22. In particular, the first connecting wire 291 is electrically connected to the circuit board 22. In other words, the first connecting wire 291 is electrically connected to the connecting circuit of the circuit board 22. Accordingly, the first connecting wire 291 is enclosed in the mold sealer 27 and extended to the top side of the mold sealer 27. The first connecting wire 291 has a motor connecting end 2911 extended above and exposed from the top side of the mold sealer 27 to electrically connect to the driver connecting terminal 31 of the driver 30. It is worth mentioning that the first connecting wire 291 can be embedded in the mold sealer 27 during the mold sealer 27 is formed. In view of the conventional camera module, the driver must be electrically connected to the circuit board via a separated wire by welding two ends of the wire at the driver and the circuit board, such that the manufacturing process of the conventional camera module is complicated. In the preferred embodiment, the first connecting wire 291 is pre-formed in the mold sealer 27 to replace the conventional welding process of the separated wire. Therefore, the driver connecting terminal 31 can be electrically connected to the motor connecting end 2911 of the first connecting wire 291 via an anisotropic conductive film or welding.

It is worth mentioning that the embedded location of the first connecting wire 291 and the exposing location of the motor connecting end 2911 can be modified according to the requirement of the driver 30. For example, the motor connecting end 2911 of the first connecting wire 291 is located at an outer peripheral portion of the mold sealer 27, i.e. the top side of the mold sealer 27 in one embodiment. In another embodiment, the motor connecting end 2911 of the first connecting wire 291 is located at an inner peripheral portion of the mold sealer 27, i.e. the bottom side of the coupling slot 2741. Therefore, different locations of the first connecting wire 291 are designed for connecting different drivers 30. In other words, when the driver 30 is required for installing at the top side of the mold sealer 27, the motor connecting end 2911 of the first connecting wire 291 is extended to the outer peripheral portion of the mold sealer 27 at the top side thereof. When the driver 30 is required for installing at the coupling slot 2741, the motor connecting end 2911 of the first connecting wire 291 is extended to the inner peripheral portion of the mold sealer 27 at the bottom side of the coupling slot 2741.

In other words, during the manufacturing process of the molded photosensitive assembly 20, the photosensitive unit 21 is initially mounted on and electrically connected to the circuit board 22, and then the mold sealer 27 is molded on the circuit board 22 via the MOC (Molding on Chip) method. During the molding process, the first connecting wire 291 is pre-formed and embedded in the mold sealer 27 to ensure the first connecting wire 291 to be electrically connected to the circuit board 22. At the same time, the motor connecting end 2911 of the first connecting wire 291 is exposed out of the top side of the mold sealer 27 for electrically connecting to the driver connecting terminal 31 of the driver 30. For example, when the molded photosensitive assembly 20 is in use for the array imaging module, the driver connecting terminal 31 of the driver 30 can be connected to the motor connecting end 2911 of the first connecting wire 291 by welding. Therefore, the driver 30 is electrically connected to the circuit board 22 without any additional separated wire, so as to reduce the length of the driver connecting terminal 31 of the driver 30.

Referring to FIGS. 2 to 6A, the array imaging module can be an Automatic Focus Camera Module (AFCM). The array imaging module is constructed to have the molded photosensitive assembly 20, two light filters 40, two drivers 30, and two optical lenses 10.

The light filters 40 are installed at the molded photosensitive assembly 20, wherein the optical lenses 10 are installed to the drivers 30 respectively, and the drivers 30 are installed at the molded photosensitive assembly 20.

In addition, the light filters 40 are coupled at the coupling slots 2741 of the light filter mounting portion 274 of the mold sealer 27. The drivers 30 are coupled at the top side of the light filter mounting portion 274 of the mold sealer 27 of the molded photosensitive assembly 20.

The driver connecting terminals 31 of the drivers 30 are electrically connected to the motor connecting ends 2911 of the motor connecting units 29 respectively, wherein the drivers 20 are electrically connected to the circuit board 22 via the motor connecting units 29.

It is appreciated that the structural configurations and types of the array imaging module as mentioned above are examples for illustrative purpose without intention to limit the present invention.

Figure 7A:
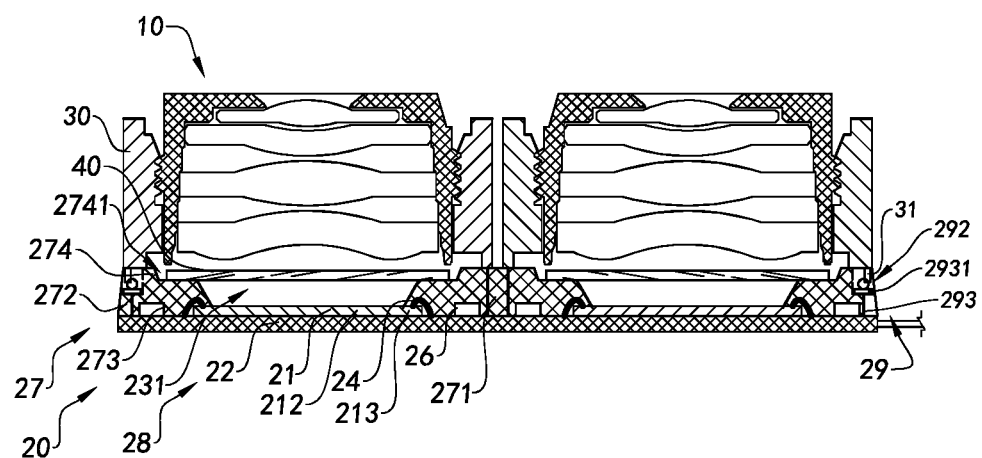
FIGS. 7A, 7B, and 7C illustrates different structural configurations of the motor connecting unit of the array imaging module the according to the first preferred embodiment of the present invention.

FIG. 7A illustrates an alternative mode of the motor connecting unit of the present invention. Accordingly, the motor connecting unit 29 comprises a first terminal slot 292, wherein the driver connecting terminal 31 of the driver 30 is received at the first terminal slot 292. The first terminal slot 292 is extended to the top side of the mold sealer 27. The motor connecting unit 29 further comprises a second connecting wire 293 for electrically connecting to the driver 30 and the circuit board 22. The second connecting wire 293 is embedded in the mold sealer 27 and is upwardly extended to the bottom wall of the first terminal slot 292. The second connecting wire 293 has a second motor connecting end 2931 extended to the bottom wall of the first terminal slot 292 for electrically connecting to the driver connecting terminal 31 of the driver 30. In particular, the second motor connecting end 2931 can be formed as a connecting pad. The second connecting wire 293 can be a conductive wire embedded in the mold sealer 27. Therefore, the driver connecting terminal 31 of the driver 30 can be easily connected to the first terminal slot 292. For example, when the molded photosensitive assembly 20 is in use for the array imaging module, the driver connecting terminal 31 of the driver 30 can be inserted into the first terminal slot 292 and connected to the second motor connecting end 2931 of the second connecting wire 293 by welding. Therefore, the driver 30 is electrically connected to the circuit board 22 without any additional separated wire. The driver 30 can be stably connected to prevent any external force or contact to the driver connecting terminal 31 of the driver 30. In particular, the second motor connecting end 2931 of the second connecting wire 293 can be a welding pad. The second connecting wire 293 can be a conductive wire embedded in the mold sealer 27.

In other words, during the manufacturing process of the molded photosensitive assembly 20, the photosensitive unit 21 is initially formed and electrically connected to the circuit board 22, wherein the mold sealer 27 is then formed on the circuit board 22 via the MOC method. During the molding process, the first terminal slot 292 with a predetermined length is pre-formed in the mold sealer 27. At the same time, the second connecting wire 293 is electrically connected to the circuit board 22, wherein the second motor connecting end 2931 is pre-set to extend to the bottom wall of the first terminal slot 292. Accordingly, the second connecting wire 293 can be a conductive wire embedded in the mold sealer 27.

Figure 7B:
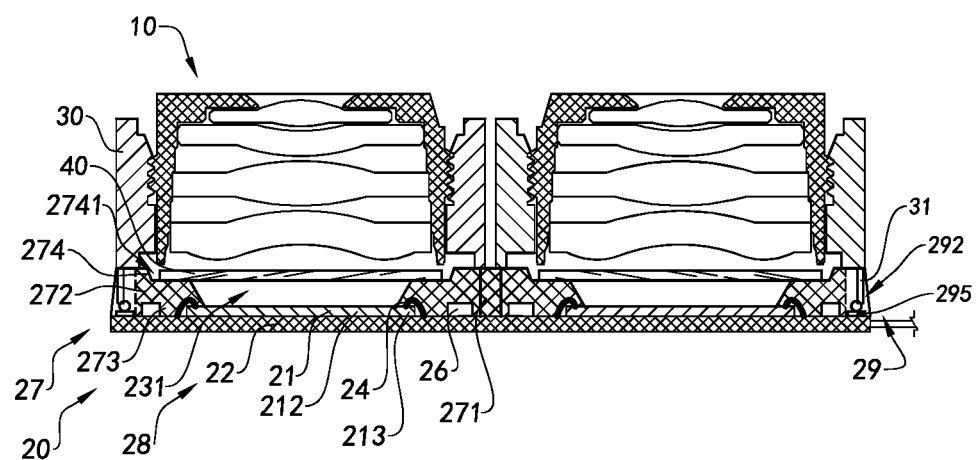

FIG. 7B illustrates another alternative mode of the motor connecting unit of the present invention. The motor connecting unit 29 comprises a second terminal slot 294 for receiving the driver connecting terminal 31 of the driver 30. The second terminal slot 294 is embedded in the mold sealer 27. The motor connecting unit 29 further comprises a circuit terminal 295 which is pre-set on the circuit board 22 and is electrically connected to the connecting circuit of the circuit board 22. In addition, the second terminal slot 294 is extended from the top side of the mold sealer 27 to the circuit board 22 toward the circuit terminal 295. Therefore, in one embodiment, when the driver connecting terminal 31 of the driver 30 is inserted into the second terminal slot 294, the driver connecting terminal 31 of the driver 30 is electrically connected to the circuit terminal 295 by welding.

In other words, during the manufacturing process of the molded photosensitive assembly 20, the photosensitive unit 21 is initially formed and electrically connected to the circuit board 22 and the circuit terminal 295 is pre-formed on the circuit board 22, wherein the mold sealer 27 is then formed on the circuit board 22 via the MOC method. During the molding process, the second terminal slot 293 with a predetermined length is pre-formed in the mold sealer 27 and extended toward the circuit terminal 295. Therefore, the driver connecting terminal 31 of the driver 30 can be easily connected. For example, when the molded photosensitive assembly 20 is in use for the array imaging module, the driver connecting terminal 31 of the driver 30 can be inserted into the second terminal slot 293 and connected to the circuit terminal 295 by welding. Therefore, the driver 30 is electrically connected to the circuit board 22 that the driver 30 can be stably connected to prevent any external force or contact to the driver connecting terminal 31 of the driver 30.

Figure 7C:
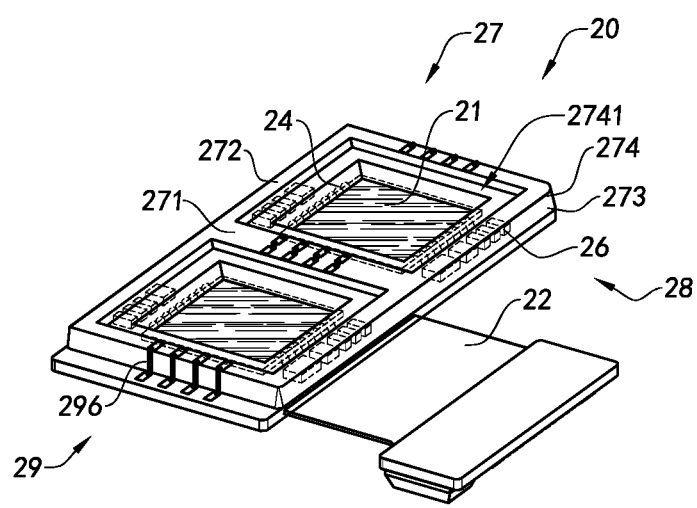

FIG. 7C illustrates another alternative mode of the motor connecting unit of the present invention. The motor connecting unit 29 comprises an engraving circuit 296 electrically connected to the connecting circuit of the circuit board 22, the photosensitive unit 21, and the motor. For example, the engraving circuit 296 can be formed by Laser Direct Structuring (LDS) method to embed at the mold sealer 27 at a predetermined position. According to the conventional connecting method, the motor is electrically connected to the circuit board via an individual wire, such that the manufacturing process thereof is relatively complicated. In view of the present invention, the engraving circuit 296 can replace the conventional welding process for electrical connection, such that the electrical connection of the present invention will be more stable comparing with the conventional one. In particular, the engraving circuit 296 is formed by forming an engraving groove at the mold sealer 2201 and metal-plating the engraving groove.

Figure 6A:
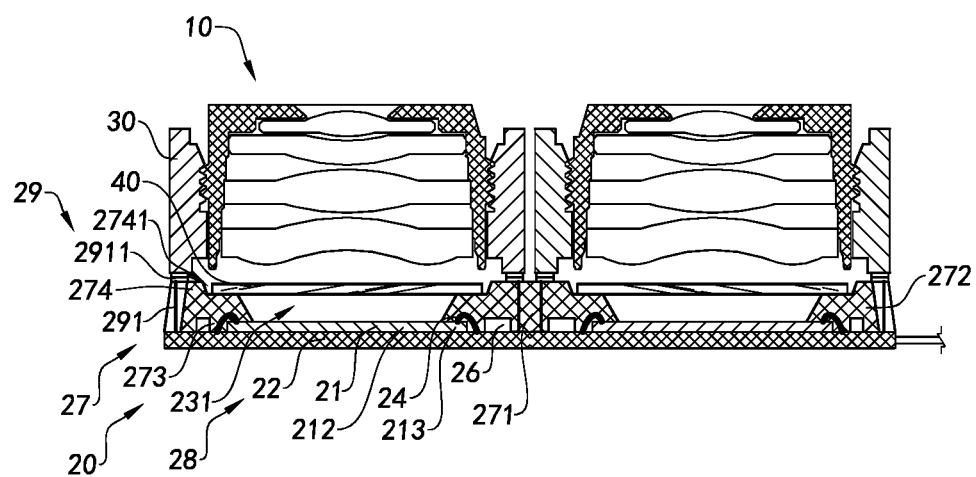
FIGS. 6A and 6B illustrates different structural configurations of the array imaging module according to the first preferred embodiment of the present invention.
Figure 6B:
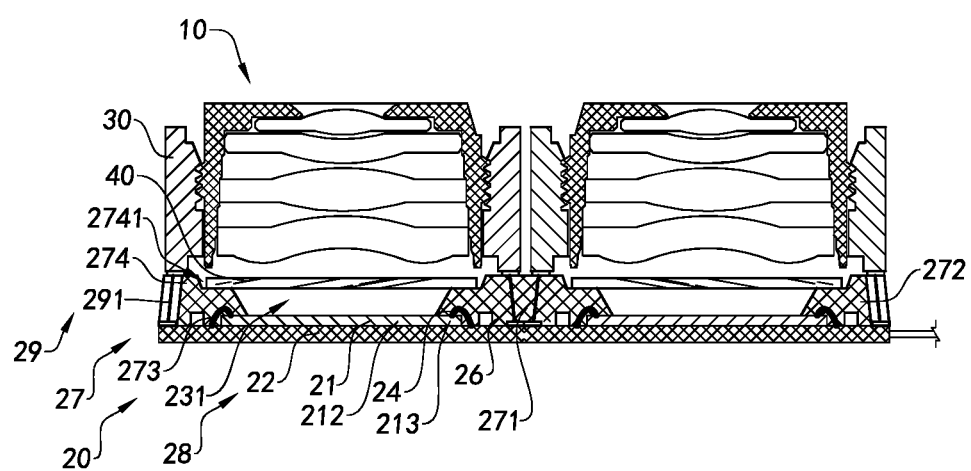

According to the first embodiment, the driver 30 can be electrically connected to the molded photosensitive assembly 20 by the motor connecting unit 29, such as via the first connecting wire 291. The connection of the driver 30 can also be shown in FIGS. 7A, 7B and 7C. For example, the connection of the drive 30 is formed via the first terminal slot 292 and the second connecting wire 293, the second terminal slot 294 and the circuit terminal 295. In another embodiment as shown in FIG. 6B, the driver 30 can be connected to the molded photosensitive assembly 20 via the conventional method such as welding. Person skilled in the art should understand that the way to connect the driver 30 and the molded photosensitive assembly 20 should not be limited in the present invention.

Figure 8:
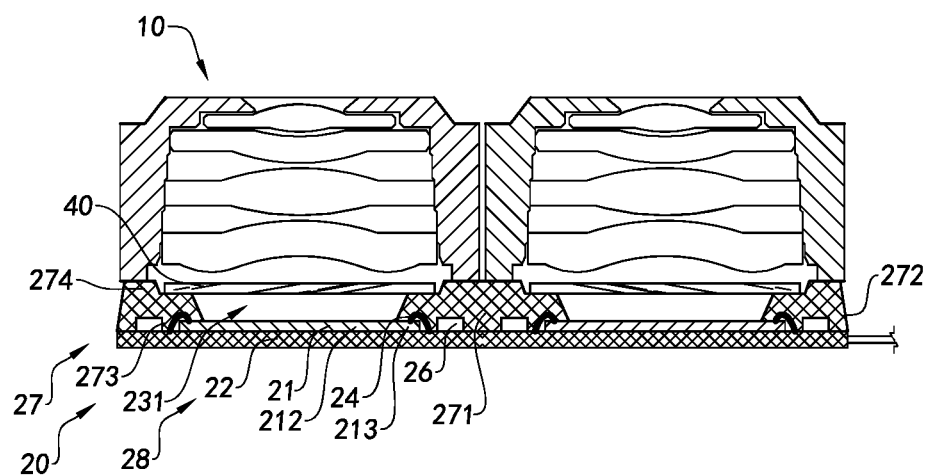
FIG. 8 illustrates a first alternative mode of the array imaging module according to the first preferred embodiment of the present invention.

FIG. 8 illustrates an alternative mode of the array imaging module of present invention. The array imaging module can be a fixed focus camera module which comprises a molded photosensitive assembly 20, two light filters 40, and two optical lenses 10.

The light filters 40 are installed at the molded photosensitive assembly 20, wherein the optical lenses 10 are installed on the molded photosensitive assembly 20.

In particular, the light filters 40 are coupled at the coupling slots 2741 of the light filter mounting portion 274 of the mold sealer 27 respectively. The optical lenses 10 are coupled at the top side of the mold sealer 27.

It is worth mentioning that the optical lenses 10 are coupled at the top side of the mold sealer 27 of the molded photosensitive assembly 20, such that the mold sealer 27 also serves as a supporter to support and retain the optical lenses 10 in position. However, the assembly of the array imaging module is different from the conventional COB process. The conventional COB process is that the supporting frame is adhered on the circuit board. In view of the present invention, the mold sealer 27 is molded and sealed at the circuit board 22, such that no adhering step is involved in the present invention to enhance the stability of the connection and controllability of the process. Since the mold sealer 27 is molded on the circuit board 22 to enclose the one or more electronic elements 26, there is no need to reserve any installing clearance between the mold sealer 27 and the electronic element 26, such that the thickness of the array imaging module will be reduced. In addition, the electronic elements 26 and the lead wires 24 are able to be overlappedly embedded in the mold sealer 27, wherein the electronic elements 26 and the lead wires 24 can be shared with the common area. Unlike the conventional camera module, the electronic elements and the wires must keep a predetermined safety distance with each other. Accordingly, the height of the mold sealer 27 that also provides the supporting function can be reduced. In addition, since the mold sealer 27 can replace the conventional supporting frame, the mold sealer 27 can minimize the tilt error so as to reduce the cumulative tolerance of the array imaging module. Moreover, since the lead wires 24 are enclosed by the mold sealer 27 and the mold sealer 27 is extended to the non-photosensitive area 213 of the photosensitive unit 21, the size of the mold sealer 27 can be reduced to further reduce the length and width size of the array imaging module.

Figure 9:
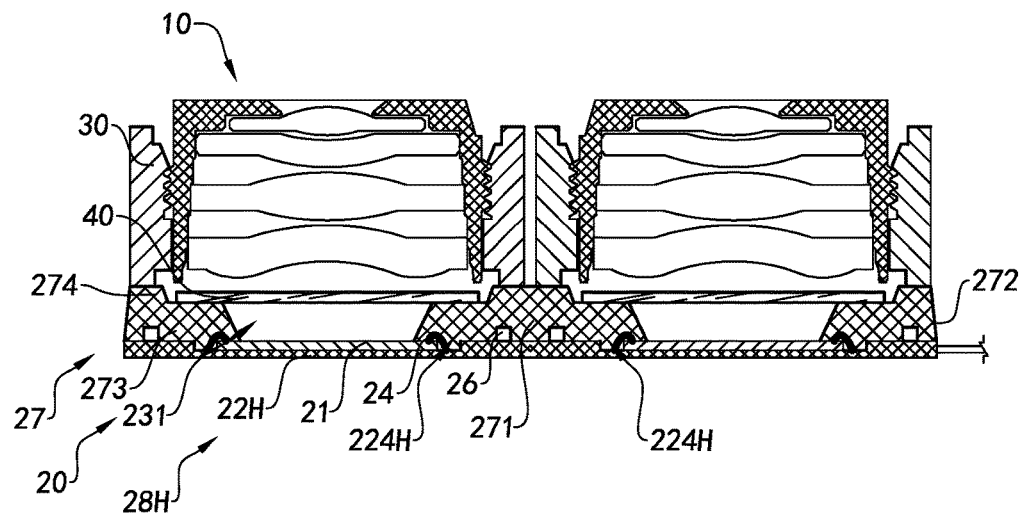
FIG. 9 is a sectional view of the array imaging module according to a second preferred embodiment of the present invention.

FIG. 9 illustrates a second preferred embodiment of the array imaging module and its photosensitive units of the present invention. The difference between this second embodiment and the above embodiment is that, the circuit board 22H has two inner indentation grooves 2222H, wherein the photosensitive units 21 are received in the inner indentation grooves 2222H to enclose the photosensitive units 21 therewithin, so as to reduce the relative height difference between the photosensitive units 21 and the circuit board 22H. Therefore, when the mold sealer 27 is molded to enclose the photosensitive units 21, the height of the mold sealer 27 will be reduced to minimize the height of the array imaging module.

Figure 10A:
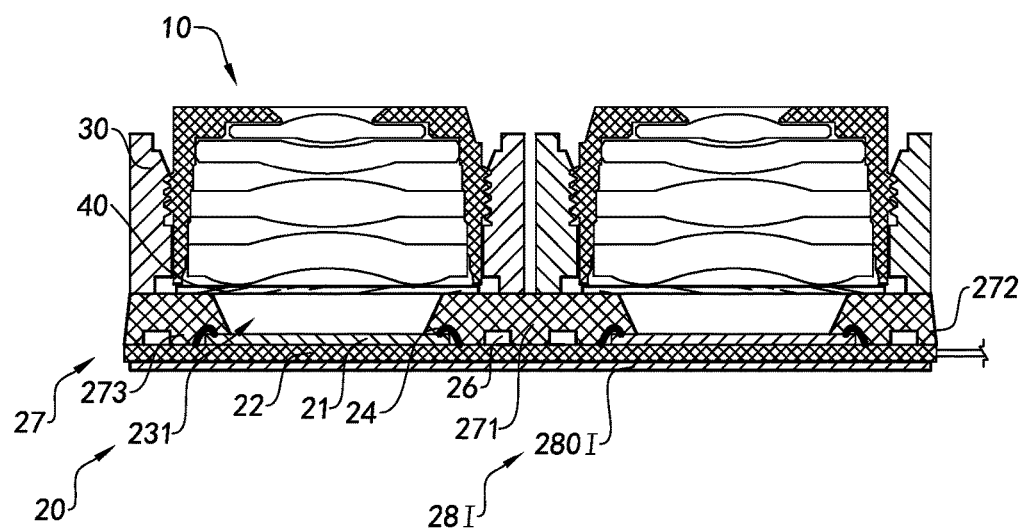
FIGS. 10A to 10C illustrates three different manufacturing processes for the array imaging module according to a third preferred embodiment of the present invention.

FIG. 10 illustrates a third preferred embodiment of the array imaging module and its photosensitive units of the present invention.

The difference between this third preferred embodiment and the above embodiments is that, the molded photosensitive assembly 20 further comprises a reinforcing layer 2801 overlapped and coupled at the bottom side of the circuit board 22 to enhance the strength of the circuit board 22. In other words, the reinforcing layer 2801 is overlapped and coupled at the bottom side of the circuit board 22 at the area where the mold sealer 27 and the photosensitive unit 21 are coupled on the top side of the circuit board 22, so as to ensure the strength of the circuit board 22 to support the mold sealer 27 and the photosensitive unit 21.

In addition, the reinforcing layer 2801 can be a metal panel coupled at the bottom side of the circuit board 22 not only to enhance the strength of the circuit board 22 but also to enhance the heat dissipating power of the molded photosensitive assembly 20 to effectively dissipate heat generated by the photosensitive unit 21.

It is worth mentioning that the circuit board 22 can be a Flex Print Circuit (FPC). Through the rigidities of the reinforcing layer 2204C and the circuit board 22, the flex print circuit, having a bendable ability, can fulfill the supportive ability of the molded photosensitive assembly 20. Accordingly, the circuit board 22 can be the Print Circuit Board (PCB), the FPC, or Rigid Flex (RF). In other words, the reinforcing layer 2801 can substantially increase the strength of the circuit board 22 and effectively enhance the heat dissipation, so as to reduce the thickness of the circuit board 22. Therefore, the height of the circuit board assembly will be substantially reduced to minimize the height of the array imaging module.

Figure 10B:
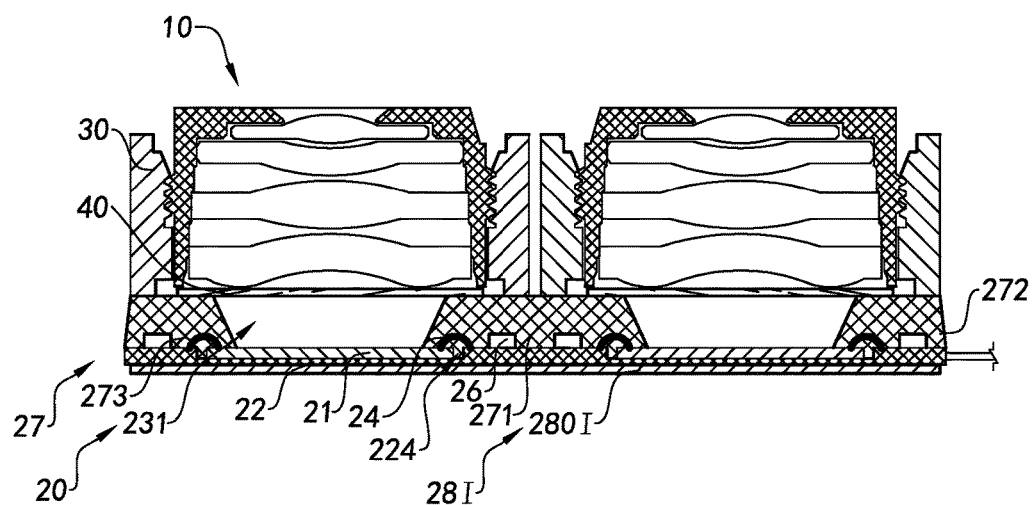
Figure 10C:
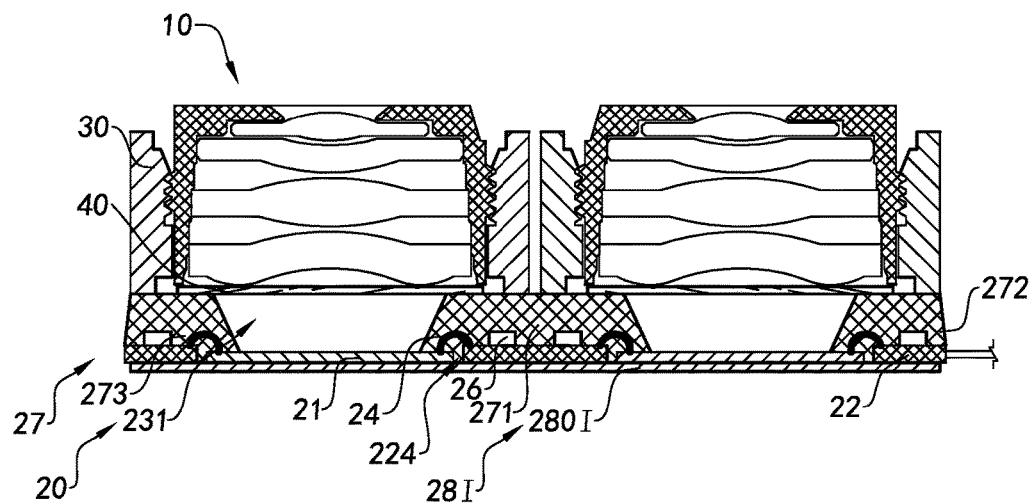

As shown in FIGS. 10B and 10C, the circuit board 22 has at least a receiving chamber 224, wherein the photosensitive unit 21 is received in the receiving chamber 224 of the circuit board 22 to minimize the height difference between the top side of the photosensitive unit 21 and the top side of the circuit board 22. Preferably, the top side of the photosensitive unit 21 and the top side of the circuit board 22 are aligned with the same planar direction. Therefore, the height of the array imaging module can be further reduced. The array imaging module can be incorporated with the thinness of the electronic device. It is worth mentioning that the receiving chamber 224 can be a receiving slot, as shown in FIG. 10B. As shown in FIG. 10C, the receiving chamber 224 can be a receiving through hole, wherein when the photosensitive units 21 are electrically connected to the circuit board 22, the photosensitive units 21 are disposed in the receiving chamber 224 and the reinforcing layer 2081 is coupled at the bottom side of the circuit board 22 to enhance the strength of the circuit board 22.

Figure 11:
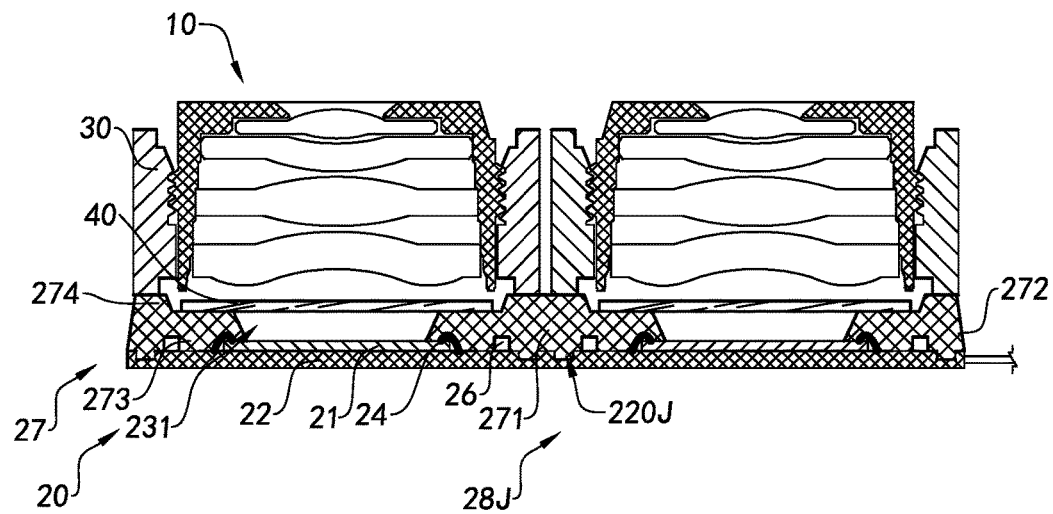
FIG. 11 is a sectional view of the array imaging module according to a fourth preferred embodiment of the present invention.

FIG. 11 illustrates a fourth preferred embodiment of the array imaging module and its photosensitive units of the present invention.

The difference between this fourth embodiment and the above embodiments is that, the circuit board 22 further has at least a reinforcing slot 220J, wherein the mold sealer 27 is extended into the reinforcing slot 220J to enhance the strength of the circuit board 22.

The position of each of the reinforcing slots 220J can be selectively modified according to the rigidity of the circuit board 22. Preferably, the reinforcing slots 221J are symmetrically formed on the circuit board 22. Accordingly, the rigidity of the circuit board 22 can be enhanced by the reinforcing slot 220J to reduce the thickness of the circuit board 22, so as to reduce the thickness of the array imaging module and to enhance the heat dissipation of the molded photosensitive assembly 20.

It is worth mentioning that the reinforcing slot 220J is embodied as an indention cavity, wherein the reinforcing slot 227D is not a through slot, such that when the reinforcing slot 220J is formed on the circuit board 22, the reinforcing slot 220J will not extended through the circuit board 22. Therefore, the mold sealer 27 will not be extended through the circuit board 22 and will not be leaked from the reinforcing slot 220J.

Figure 12:
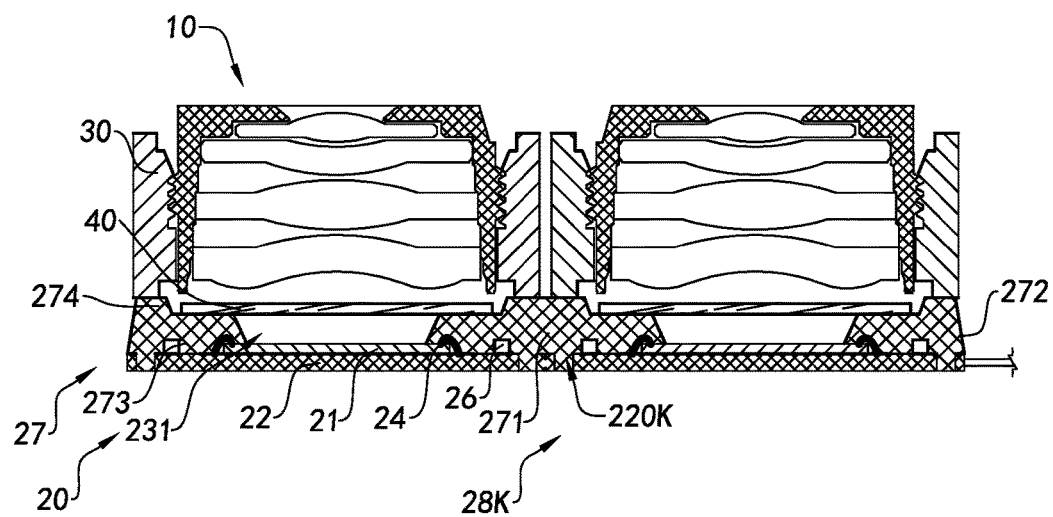
FIG. 12 is a sectional view of the array imaging module according to a fifth preferred embodiment of the present invention.

As shown in FIG. 12, an array imaging module with its molded photosensitive assembly 20 according to a fifth preferred embodiment of the present invention is illustrated.

The difference between this fifth preferred embodiment and the above embodiments is that, the circuit board 22 has a least a reinforcing slot 220K, wherein the mold sealer 27 is extended into the reinforcing slot 220K to enhance the strength of the circuit board 22.

The positions of each of the reinforcing slots 220K can be selectively modified according to the rigidity of the circuit board 22. Preferably, the reinforcing slots 220K are symmetrically formed on the circuit board 22. Accordingly, the rigidity of the circuit board 22 can be enhanced by the reinforcing slot 220K to reduce the thickness of the circuit board 22, so as to reduce the thickness of the array imaging module and to enhance the heat dissipation of the molded photosensitive assembly 20.

It is worth mentioning that the reinforcing slot 220K is a through slot, such that when the reinforcing slot 220K is formed on the circuit board 22, the reinforcing slot 220K will extended through the circuit board 22. The two opposite sides of the circuit board 22 are communicate with each other through the reinforcing slot 220K. Therefore, the mold sealer 27 will be extended through the circuit board 22 to integrally form with the circuit board 22 so as to combine the mold sealer 27 with the circuit board 22 with a composite material structure. In addition, the reinforcing slot 220K as the through slot can be easily formed on the circuit board 22.

Figure 13:
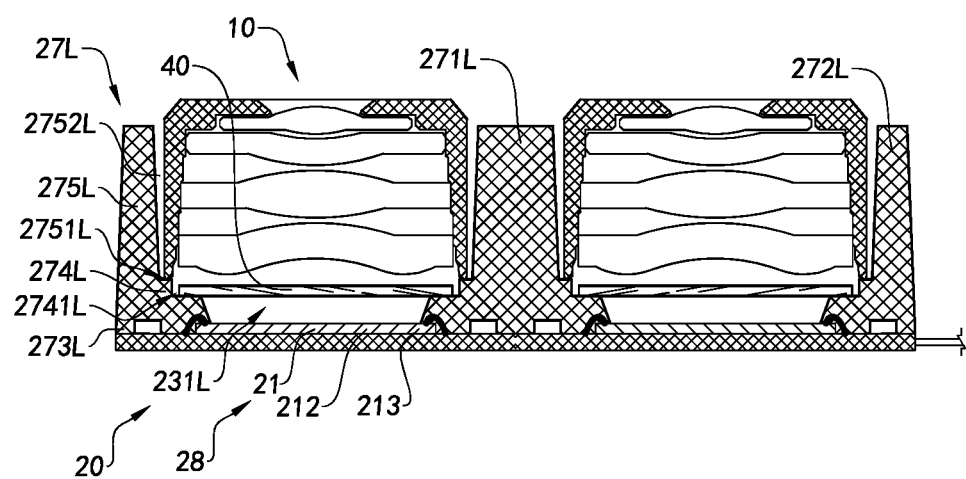
FIG. 13 is a sectional view of the array imaging module according to a sixth preferred embodiment of the present invention.

As shown in FIG. 13, an array imaging module with its molded photosensitive assembly 20 according to a sixth embodiment of the present invention is illustrated.

The difference between this sixth preferred embodiment and the above embodiments is that, the mold sealer 27L has a least an enclosing portion 273L, a light filter mounting portion 274L, and a lens mounting portion 275L. The light filter mounting portion 274L and the lens mounting portion 275L are integrally formed with the enclosing portion 273L in a sequent manner during the molding process, such that the light filter mounting portion 274L is integrally formed between the enclosing portion 273L and the lens mounting portion 275L. The enclosing portion 273L is molded and formed to couple with the circuit board 22 and to enclose the electronic element 26 and the lead wires 24. The light filter mounting portion 274L is molded and formed to couple with the light filter 40. In other words, during the manufacturing process of the molded photosensitive assembly 20 for the array imaging module, the light filter 40 is mounted and supported at the light filter mounting portion 22014L, such that the light filter 40 is automatically retained along the photosensitive path of the photosensitive unit 21 without incorporating any conventional supporting frame. Therefore, the light filter mounting portion 274L has a supportive ability. Due to the molding process, the top side of the light filter mounting portion 274L can be made to have a flat surface to evenly support the light filter 40, which is superior than the conventional camera module. The lens mounting portion 275L is coupled to the optical lens 10. In other words, during the manufacturing process of the molded photosensitive assembly 20 for the array imaging module, the optical lens 10 can be mounted and supported at the inner side of the lens mounting portion 275L, so as to stably retain the optical lens 10 in position.

The mold sealer 27L comprises a connecting body 271L and two outer ring bodies 272L, wherein the connecting body 271L is mold-connected between the two outer ring bodies 272L to spacedly separate the outer ring bodies 272L by the connecting body 271L. Accordingly, each of the outer ring bodies 272L forms the corresponding optical window 231L. The two photosensitive units 21 are positioned at two lateral sides of the connecting body 271L to form the array imaging module. It is worth mentioning that the connecting body 271L serves as a common body or sharing body that when installing the optical lenses 10, the optical lenses 10 will take even portions of the connecting body 271L.

Furthermore, the light filtering portion 274L has two mounting grooves 2741L are spacedly formed at the light filtering portion 274L, wherein the two mounting grooves 2741L are located corresponding to the optical window 231L. The mounting grooves 2741L provide a mounting space, wherein a peripheral edge of the light filter 40 is engaged with the mounting grooves 2741L, such that the light filter 40 can be stably mounted at the mold sealer 27L.

In other words, the light filter mounting portion 274L and the lens mounting portion 275L are extended integrally and upwardly to form a step-like platform at the inner sides thereof to stably support the light filter 40 and the optical lens 10 without any addition supporting frame to support thereof.

The lens mounting portion 275L further has two lens inner walls 2752L, wherein each of the lens inner walls 2752L has a closed annular shape, such that a lens edge gap is formed between the lens inner walls 2752L. It is worth mentioning that each of the lens inner walls 2752L is a flat surface to couple with the optical lens 10 without any threaded structure, so as to form the fixed focus lens module. It is worth mentioning that the optical lens 10 can be coupled at the lens mounting portion 275L by adhesive.

Figure 14:
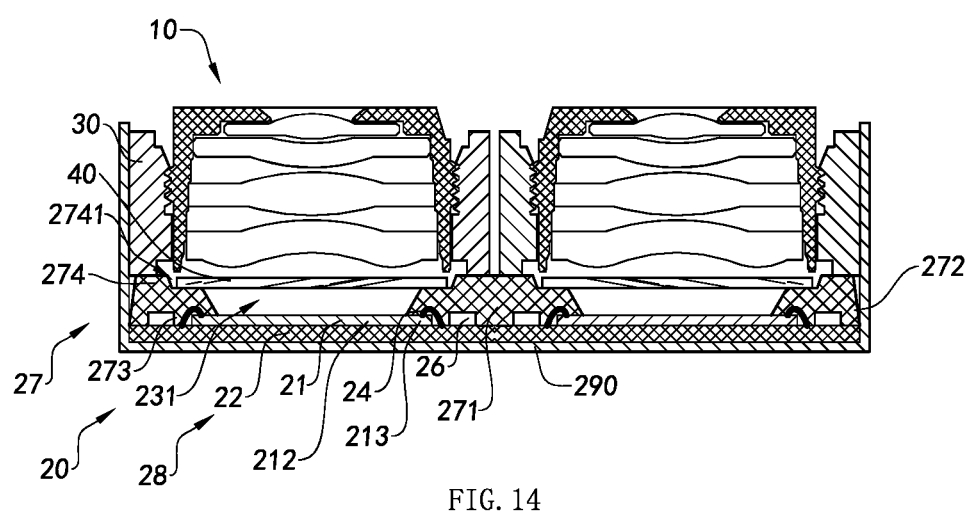
FIG. 14 is a sectional view of the array imaging module according to a seventh preferred embodiment of the present invention.

As shown in FIG. 14, an array imaging module with its molded photosensitive assembly 20 according to a seventh embodiment of the present invention is illustrated. Unlike the above embodiments, the molded photosensitive assembly 20 further comprises a shielding layer 290 that encloses the circuit board 22 and the mold sealer 27 to enhance the strength of the circuit board 22 and to prevent any electromagnetic interference of the molded photosensitive assembly 20.

As shown in FIG. 14, an array imaging module and photosensitive units according to a seventh embodiment of the present invention is illustrated. The difference between this seventh preferred embodiment and the above embodiments is that, the molded photosensitive assembly 20 comprises a shelter layer 290 for enclosing the circuit board 22 and the mold sealer 27, so as to not only reinforce the strength of the circuit board 20, but also enhance the anti-electromagnetic interference ability of the molded photosensitive assembly 20.

Figure 15:
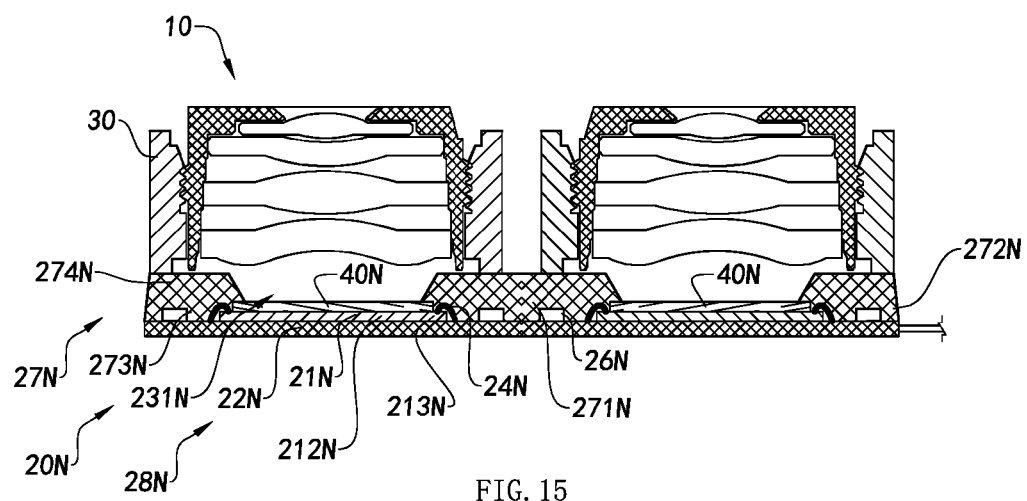
FIG. 15 is a sectional view of the array imaging module according to an eighth preferred embodiment of the present invention.
Figure 16:
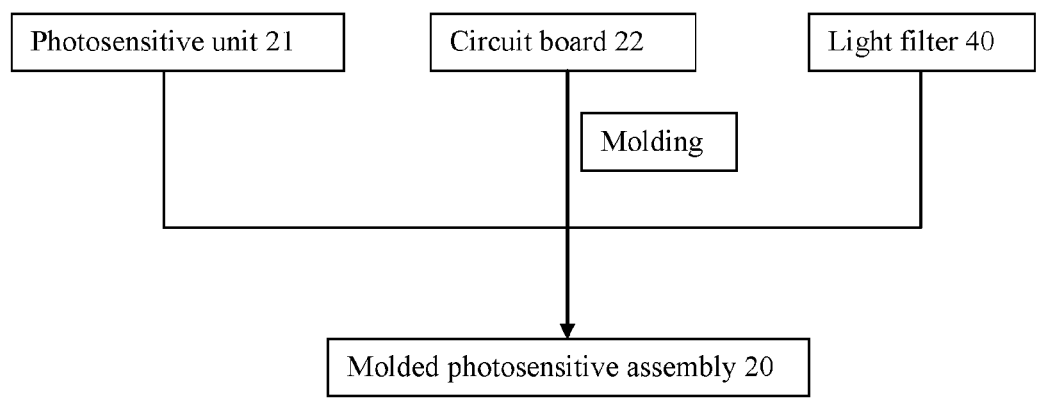
FIG. 16 illustrates the manufacturing process of the array imaging module according to the above embodiments of the present invention.

As shown in FIGS. 15 and 16, an array imaging module and photosensitive units according to an eighth embodiment of the present invention is illustrated, wherein the array imaging module comprises a molded photosensitive assembly 20N, wherein the optical lens 10 is installed on top of the molded photosensitive assembly 20 to form the array imaging module.

In particular, the optical lens 10 is adhered to affix on the top side of the mold sealer 27N of the molded photosensitive assembly 20. Taking advantage of the molding technology, the top side of the molded sealer 27N provides a flat surface for stably supporting the optical lens 10 thereon for enhancing the imaging quality of the array imaging module. The molded photosensitive assembly 20N is used to assemble to manufacture the array imaging module for making the molded camera module.

The molded photosensitive assembly 20N comprises the mold sealer 27N and the photosensitive device 28N, wherein the mold sealer 27N is molded and integrally formed with the photosensitive device 28N.

The photosensitive device 28N comprises a circuit board 27N. The mold sealer 27N has two optical windows 231N, wherein the mold sealer 27N is formed at an outer periphery of the photosensitive unit 21N. Two optical lenses 10 are located along optical paths of the photosensitive units 21N respectively. In particular, the optical lenses 10 are supported at the optical windows 231N of the mold sealer 27N corresponding to the locations of the circuit board 22N.

The mold sealer 27N comprises a connecting body 271N and two outer annular bodies 272N, wherein the connecting body 271N is integrally extended between the outer annular bodies 272N to separate outer annular bodies 272N into two adjacent portions, such that the optical windows 231N are defined at the outer annular bodies 272N respectively, wherein the two photosensitive units 21N are positioned at two sides of the connecting body 271N respectively so as to enable the assembling of the array imaging module. It is worth mentioning that the connecting body 271N serves as a common sharing portion for the drivers 30, such that when the drivers 30 are coupled at the connecting body 271N of the mold sealer 27N, at least a portion of each of the drivers 30 will be assembled at different position of the connecting body 271N.

The photosensitive device 28N comprises a circuit board 22N and at least two photosensitive units 21N which are electrically coupled at the circuit board 22N. According to the preferred embodiment, the photosensitive units 21N are molded to connect with the circuit board 22N.

According to the preferred embodiment, the photosensitive device 28N comprises a connecting circuit (not shown in the drawings) and at least an electronic element 26N. The connecting circuit is pre-formed on the circuit board 22N. The electronic element 26N is electrically connected to the connecting circuit to couple at the circuit board 22N, wherein the electronic element 26N is electrically connected to the photosensitive units 21N for operating the photosensitive process of the photosensitive units 21N. The electronic element 26N is outwardly protruded from the circuit board 22N. The electronic element 26N can be, but not limit to, a resistor, a capacitor, a diode, a triode, a potentiometer, a relay, a processor, or a driver.

It is worth mentioning that the electronic element 26N is enclosed by the mold sealer 27N to prevent the exposure of the electronic element 26 to outside. In other words, the electronic element 26N is hidden within the mold sealer 27N to prevent any contamination, such as dust, from the surroundings during the operation of the array imaging module. Unlike the conventional camera module, the electronic element 26N, such as the capacitor, are exposed to the surroundings. Therefore, the mold sealer 27N of the present invention can prevent any dust or residue remaining at the surface of the electronic element 26N to contaminate the photosensitive unit 21N which may cause adverse effect such as black spot and the like on the image.

According to the preferred embodiment, the photosensitive device 28N further comprises a plurality of lead wires 24N for electrically connecting to the photosensitive units 21N and the circuit board 22N. In particular, the lead wire 24N can be, but not limit to, gold wire, aluminum wire, copper wire, or silver wire.

It is worth mentioning that each of the lead wires 24N is embedded in the mold sealer 27N, wherein the lead wires 24N are enclosed by the mold sealer 27N, so as to prevent the exposure of the lead wires 24N to outside. When assembling the array imaging module, the lead wires 24N will not be damaged by any external contact or any external factor, such as temperature. Therefore, the lead wires 24N can effectively and stably transmit signals between the photosensitive units 21N and the circuit board 22N. The embedded lead wires 24N of the present invention are superior than the exposed wires of the conventional camera module.

It is worth mentioning that the electronic element 26N and the lead wires 24N are enclosed by the mold sealer 27N, such that the electronic element 26N and the lead wires 24N are protected by the mold sealer 27N for enabling the camera module to achieve better performance. Person skilled in the art should understand that the mold sealer 27N is not limited to enclose the electronic element 26N and the lead wires 24N. In other words, according to other embodiments, the mold sealer 27N can be directly molded and formed at the circuit board 22N while the electronic element 26N is embedded in the circuit board 22N without protruding on the circuit board 22N. In addition, the mold sealer 27N can also formed at different locations of the electronic element 26N, such as at an outer periphery of the electronic element 26N or surrounding the electronic element 26N.

Furthermore, the photosensitive unit 21N has a photosensitive area 212N and a non-photosensitive area 213N, wherein the photosensitive area 212N is encircled within the non-photosensitive area 212N and is arranged for providing photosensitive effect. The lead wire 24N is operatively linked to the non-photosensitive area 213N.

According to the preferred embodiment, the mold sealer 27N is extended to the non-photosensitive area 213N of the photosensitive unit 21N and is overlappedly coupled at the circuit board 22N via the molding process. Through the molding process, such as Molding on Chip (MOC) method, the covering area of the mold sealer 27N can be enlarged at its inward direction, so as to reduce the outward extension of the mold sealer 27N. As a result, the length and width of the mold sealer 27N can be reduced to minimize the size of the array imaging module.

The molded photosensitive assembly 20N further comprises two light filters 40N overlappedly coupled above the photosensitive units 21N. A periphery of each of the light filters 40N is coupled at the mold sealer 27N to retain the light filter 40N in position. It is worth mentioning the light filters 40N cover on top of the photosensitive units 21N respectively to protect and separate the photosensitive units 21N from outside so as to prevent any damage of the photosensitive units 21N.

During the manufacturing process of the molded photosensitive assembly 20N, the photosensitive units 21N are initially formed at the circuit board 22N by, for example, attaching on the circuit board 22N, such that the photosensitive units 21N are electrically connected to the circuit board 22N via the lead wires 24N. Then, the light filters 40N are positioned on top of the photosensitive units 21N. Furthermore, the circuit board 22N, the photosensitive units 21N, and the light filters 40N are treated by molding process to form the integral mold sealer 27N. During the mold processing, the light filters 40N cover on top of the photosensitive units 21N to prevent damage of the photosensitive units 21N. Since the distance between the light filters 40N and the photosensitive units 21N is reduced, a focal length of the array imaging module is reduced, resulting in minimizing the height of the array imaging module. In addition, the light filters 40N do not require any additional support that further reduces the thickness of the array imaging module.

According to the preferred embodiment, the mold sealer 27N is protrudedly encircled around an outer periphery of the photosensitive area 212N of the photosensitive unit 21N. In particular, the mold sealer 27N is integrally connected to the photosensitive unit 21N to provide a sealing effect therefor. In other words, when the molded photosensitive assembly 20N is assembled, the photosensitive device is sealed and enclosed therewithin to form a closed environment.

In particular, during the manufacturing process of the molded photosensitive assembly 20N, the circuit board 22N, which can be a conventional circuit board, can be used for supporting the two photosensitive units 21N, such as coupling the two photosensitive units 21N on the circuit board 22N. Then, the two photosensitive units 21N can be electrically connected to the circuit board 22N via the lead wires 24N. Then, the light filters 40N are overlappedly coupled on top of the photosensitive units 21N. Then, the photosensitive units 21N and the circuit board 22N can be initially packed and sealed for molding process. For example, by using a mold injection machine for introducing or injecting mold material via Insert Molding technology and Surface Mount Technology to mold and form the mold sealer 27N or via a semiconductor packaging technology and press mold technology to mold and form the mold sealer 27N. The circuit board 22N can be, but not limited to, a soft-hard combination board, ceramic substrate (non-flexible board), or a hard PCB board (non-flexible board). The molding process can be, but not limit to, the injection molding process or press-molding process. The injection mold material can be nylon, LCP (Liquid Crystal Polymer), PP (Polypropylene), or the like. It is appreciated that different materials can be selectively used in different molding processes and should not be restricted in the present invention. The process of forming the mold sealer 27N should not be restricted in the present invention.

Figure 17:
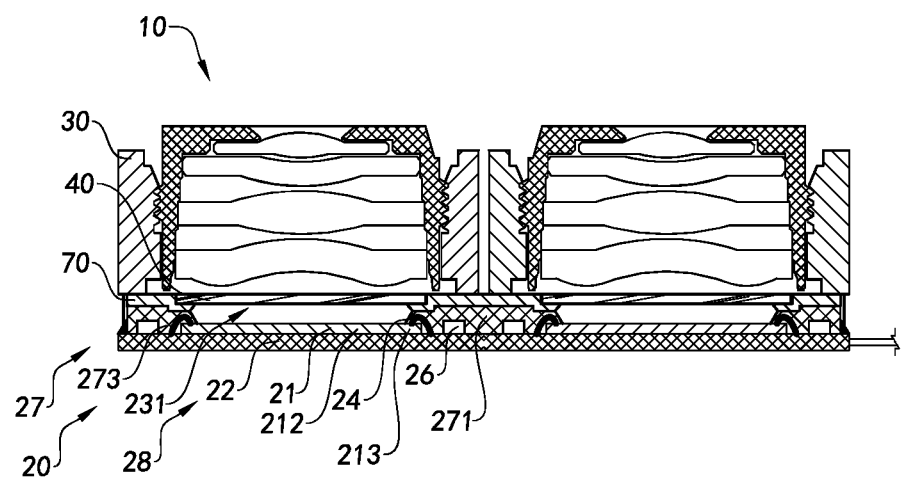
FIG. 17 is a sectional view of the array imaging module according to a ninth preferred embodiment of the present invention.

As shown in FIG. 17, an array imaging module according to a ninth preferred embodiment of the present invention is illustrated. The difference between this ninth preferred embodiment and the above embodiments is that, the array imaging module further comprises at least a supporter 70 for installing the light filter 40s, the optical lenses 10, and drivers 30. Accordingly, the supporter 70 is coupled at the mold sealer 27, wherein the light filters 40 are supported by the supporter 70, the optical lenses 10 are supported by the supporter 70, and the drivers 30 are supported by the supporter 70. The shape of the supporter 70 can be selectively modified. For example, the supporter 70 forms a protruding platform for supporting the light filter 40. The supporter 70 can be a multiple supporter to support two or more light filters 40 at the same time. Likewise, the supporter 70 can be a single supporter to support one single light filter 40. According to the preferred embodiment, the supporter 70 is the multiple supporter. It is appreciated that the shape of the supporter 70 should not be limited in the present invention.

FIGS. 18 to 26 illustrates another preferred embodiment of the array imaging module of the present invention, which comprises at least two optical lenses 10' and a molded photosensitive assembly 20'. The molded photosensitive unit 20' comprises at least two photosensitive units 21', a circuit board 22', a molded base 23', and at least two sets of lead wires 24'.

Each of the photosensitive units 21' comprises a chip connector 211' and having a photosensitive area 212' and a non-photosensitive area 213', wherein the photosensitive area 212' and the non-photosensitive area 213' are defined at the same face of the photosensitive units 21'. In particular, the photosensitive area 212' are defined within or surrounded by the non-photosensitive area 213'. In other words, the photosensitive area 212' is defined at a center of the non-photosensitive area 213', wherein the non-photosensitive area 213' encircles around the photosensitive area 212'. The chip connector 211' is located at the non-photosensitive area 213'.

Correspondingly, the circuit board 22' comprises at least two sets of circuit connectors 221' and has at least two chip coupling areas 222' and a peripheral area 223', wherein the chip coupling areas 222' and the peripheral area 223' are integrally formed at a position that peripheral area 223' is defined at a periphery of each of the chip coupling areas 222'. The circuit connectors 221' are located at the peripheral area 223'.

Each of the lead wires 24' has a chip connecting terminal 241' and a circuit board connecting terminal 242', wherein each of the lead wire 24' has a curved configuration between the chip connecting terminal 241' and the circuit board connecting terminal 242'.

The photosensitive units 21' are coupled at the chip coupling areas 222' of the circuit board 22' respectively, wherein the chip connecting terminal 241' of the lead wire 24 is electrically connected to the chip connector 211' of the photosensitive units 21'. The circuit board connecting terminal 242' of the each of the lead wires 24' is electrically connected to the circuit connector 221' of the circuit board 22'. The molded base 23' is integrally coupled at the peripheral area 223' of the circuit board 22' to form the molded photosensitive assembly 20'. The optical lenses 10' are coupled at the molded photosensitive assembly 20' along the photosensitive paths of the photosensitive units 21' respectively. When the light is reflected from an object and passes through the optical lenses 10', the light will enter into the interior of the array imaging module to the photosensitive areas 212' of the photosensitive units 21'. Then, the photosensitive units 21' will convert the light signal into the electric signal for obtaining the image of the object through the photoelectric conversion process.

In one embodiment, each of the chip connector 221' of the photosensitive units 21' and the circuit connector 221' of the circuit board 22' can be a connecting tray. In other words, each of the chip connector 221' of the photosensitive units 21' and the circuit connector 221' of the circuit board 22' has a tray configuration. Therefore, the chip connecting terminal 241' of the lead wires 24 can be easily connected to the chip connector 211' of the photosensitive units 21'. The circuit board connecting terminal 242' of each of the lead wires 24' can be easily connected to the circuit connector 221' of the circuit board 22'. In another embodiment, each of the chip connector 221' of the photosensitive units 21' and the circuit connector 221' of the circuit board 22' has a spherical shape, such as applying a paste or other welding materials as a connection point at each of the non-photosensitive area 213' of the photosensitive units 21' and the peripheral area 223' of the circuit board 22' in order to form each of the chip connector 221' of the photosensitive units 21' and the circuit connector 221' of the circuit board 22'. It is appreciated that the above examples are illustrative only that each of the chip connector 221' of the photosensitive units 21' and the circuit connector 221' of the circuit board 22' can be formed by different ways.

The non-photosensitive area 213' of the photosensitive units 21' has a chip inner lateral side 2131', a chip connecting portion 2132', and a chip outer lateral side 2133'. The chip connector 211' is located at the chip connecting portion 2132'. The chip inner lateral side 2131' is extended and encircled around the photosensitive area 212'. Two lateral sides of the chip connecting portion 2132' is extended to the chip inner lateral side 2131' and the chip outer lateral side 2133' respectively. In other words, the chip inner lateral side 2131' is defined between the non-photosensitive area 213' where of the chip connector 211' is located and the edge of the photosensitive area 212'. The chip connecting portion 2132' is defined at the non-photosensitive area 213' where of the chip connector 211' is located. The chip outer lateral side 2133' is defined between the non-photosensitive area 213' where of the chip connector 211' is located and an outer edge of the photosensitive units 21'. In other words, at the top view of the photosensitive units 21', the photosensitive area 212', the chip inner lateral side 2131', a chip connecting portion 2132', and a chip outer lateral side 2133' are formed in sequence from an inner side of the photosensitive units 21' to an outer side thereof.

Correspondingly, the peripheral portion 223' of the circuit board 22' has a circuit board inner lateral side 2231', a circuit board connecting portion 2232', and a circuit board outer lateral side 2233'. The circuit connector 221' is coupled at the circuit board connecting portion 2232'. The circuit board inner lateral side 2231' is extended and encircled around the chip coupling area 222'. Two lateral sides of the circuit board connecting portion 2232' are extended to the circuit board inner lateral side 2231' and the circuit board outer lateral side 2233' respectively. In other words, the circuit board inner lateral side 2231' is defined between the peripheral area 223' where of the circuit connector 221' is located and the edge of the chip coupling area 222'. The circuit board connecting portion 2232' is defined at peripheral area 223' where of the circuit connector 221' is located. The circuit board outer lateral side 2233' is defined between the peripheral area 223' where of the circuit connector 221' is located and an outer edge of the circuit board 22'. It is worth mentioning that the circuit board 22' is a one-piece integrated body. Preferably, the chip coupling areas 222' are symmetrically formed at two side ends of the circuit board 22', such that the circuit board 22' has a symmetrical configuration and structure.

In addition, the material and type of the lead wire 24' of the array imaging module should not be limited in the present invention. For example, the lead wire 24' can be a gold wire, such that the photosensitive units 21' can be electrically connected to the circuit board 22' via the gold wire. In addition, the photosensitive area 212' of the photosensitive units 21' is able to convert light signal into electric signal, wherein the electric signal can transmit to the circuit board 22' via the lead wire 24'. Accordingly, the lead wire 24' can be a sliver wire, copper wire, or the like in order to transmit the electric signal from the photosensitive units 21' to the circuit board 22'.

Figure 24:
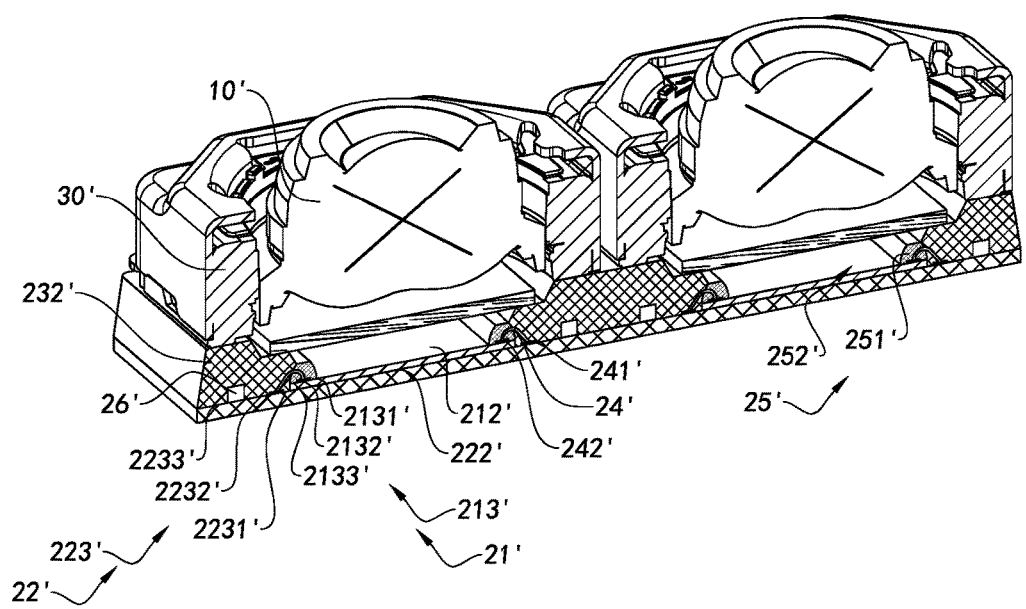
FIG. 24 illustrates the manufacturing process of the array imaging module according to the above preferred embodiments of the present invention, wherein the step 7 of coupling the driver to the optical lens, wherein the driver is coupled at the top side of the mold sealer.

The array imaging module of the present invention can be a fixed-focus camera module, an auto-focus camera module, or zoom camera module. For example, the array camera module can have the autofocus and optical zoom ability under the controlled height restriction, so as to improve the imaging quality of the array imaging module. As shown in FIG. 24, the array imaging module further comprises at least two drivers 30', wherein the drivers 30' are operatively coupled to the optical lenses 10' respectively. Each of the drivers 30' is supported and coupled at the molded base 23' at the top side thereof to retain the optical lenses 10' at the optical paths of the photosensitive units 21' of the molded photosensitive assembly 20' respectively. Each of the drivers 30' is electrically coupled to the circuit board 22', wherein after the circuit board 22' transmits the electric signal to each of the drivers 30', each of the drivers 30' will drive the corresponding optical lens 10' to move along the photosensitive path of the corresponding photosensitive unit 21' for adjusting the focal point of the array imaging module. In other words, the optical lenses 10' are driven to move by the drivers 30' respectively.

It is worth mentioning that the driver 30' can be modified or selected in different types without any limitation of the array imaging module of the present invention. For example, the driver 30' can be a voice coil motor for driving the optical lens 10' along the optical path of the photosensitive unit 21', wherein the driver 30' is able to receive the electric signal and control signal for operation.

As shown in FIG. 24, the array imaging module further comprises at least a light filter 40'. In one embodiment, the present invention comprises at least a lighter filter 40', wherein the light filter 40' is coupled at the top side of the molded base 23', such that the light filter 40' can be located at different positions corresponding to the optical path of the photosensitive unit 21'. In another embodiment, the array imaging module further comprises two or more light filters 40', wherein the light filters 40' are coupled at the top side of the molded base 23', such that the light filters 40' can be located corresponding to the optical paths of the photosensitive units 21'. In other words, the photosensitive units 21', the light filters 40', and the optical lenses 10' are coupled respectively.

During the operation of the array imaging module, the light reflected by the object is guided to pass through the optical lens 10' into the interior of the array imaging module. Then, the light will pass through the light filter 40' to the photosensitive unit 21', such that the photosensitive unit 21' will receive the reflected light along the optical path for photoelectric conversion. Accordingly, the light filter 40' is arranged for filtering stray light, such as the infrared light portion, in the light from the optical lens 10' for improving the imaging quality of the array imaging module.

In addition, the light filter 40' is directly coupled at the top side of the molded base 23'. Alternatively, the light filter 40' can be coupled at a supporter which is coupled at the top side of the molded base 23', such that the light filter 40' is coupled at the top side of the molded base 23' via the supporter. Therefore, the size of the light filter 40' can be reduced to minimize the manufacturing cost of the array imaging module.

According to the present invention, the light filter 40' can be formed in different types for different implements of the array imaging module. For example, the light filter 40' can be an infrared cut-off filter, a full transmissible spectral filter, other filters, or two or more different light filters 40'. For example, the infrared cut filter and the full transmissible spectral filter can form a combination of light filtering unit, such that the infrared cut filter and the full transmissible spectral filter can be selectively switched to locate along the optical path of the photosensitive unit 21'. For example, the infrared cut filter is selectively switched to locate along the optical path of the photosensitive unit 21' when the array imaging module is operated under the day light environment in which the environmental light is sufficient. Therefore, the infrared light portion of the light will be filtered by the infrared cut filter when entering into the interior of the array imaging module. Likewise, the full transmissible spectral filter is selectively switched to locate along the optical path of the photosensitive unit 21' when the array imaging module is operated under the dark environment in which the environmental light is insufficient. Therefore, the infrared light portion of the light will not be filtered by the infrared cut filter when entering into the interior of the array imaging module.

The molded photosensitive assembly 20' further comprises at least a supporting member 25', wherein the supporting member 25' protects the lead wires 24' and the photosensitive units 21' during the molding process. According to the preferred embodiment, at least two supporting members 25' are provided. Preferably, the number of the supporting member 25' matches with the number of the photosensitive unit 21'. Before the molded base 23' is formed, the non-photosensitive areas 213' of the photosensitive units 21' are covered by the supporting members 25' respectively. After the molded base 23' is formed, the molded base 23' will cover and enclose the peripheral areas 223' of the circuit board 22', portions of the non-photosensitive areas 213' of the photosensitive units 21', and portions of the supporting members 25', so as to form the molded photosensitive assembly 20'. The supporting members 25' can enhance the quality of the array imaging module and the imaging quality thereof. In another embodiment, there is only one supporting member 25' being used as disclosed later.

Each of the supporting members 25' comprises an encircling frame shaped supporting body 251' and a through hole 252', wherein the supporting body 251' of the supporting member 25' is coupled on at least a portion of the non-photosensitive area 213' of the photosensitive unit 21'. The photosensitive area 212' of the photosensitive unit 21' is aligned with the through hole 252' of the supporting member 25'. Preferably, the supporting body 251' of the supporting member 25' is coupled on at least a portion of each of the chip inner lateral side 2131', the chip connecting portion 2132', and the chip outer lateral side 2133' of the non-photosensitive area 213' of the photosensitive unit 21'. In addition, the supporting body 251' of the supporting member 25' has a top side 2501', an inner lateral side 2502', and an outer lateral side 2503'. According to the preferred embodiment, the side of the supporting body 251' facing toward the photosensitive area 212' is defined as the inner lateral side 2502' of the supporting body 251'. The side of the supporting body 251' facing toward the peripheral area 223' of the circuit board 22' is defined as the outer lateral side 2503' of the supporting body 251'. In one embodiment, the molded base 23' is formed to enclose at least a portion of each of the outer lateral side 2503' and the top side 2501' of the supporting body 251'.

In addition, the molded photosensitive assembly 20' further comprises one or more electronic elements 26' which are treated by Surface Mount Technology (SMT) to electrically couple at the peripheral portion 223' of the circuit board 22'. Preferably, each of the electronic elements 26' is electrically coupled at the peripheral portion 223' of the circuit board 22' at the circuit board outer lateral side 2233' thereof. Accordingly, the photosensitive unit 21' and the electronic elements 26' can be coupled at the same side of the circuit board 22' or two opposed sides of the circuit board 22'. For example, the photosensitive unit 21' and the electronic elements 26' can be coupled at the same side of the circuit board 22' in one embodiment, wherein the photosensitive unit 21' is coupled at the chip coupling areas 222' of the circuit board 22' and the electronic elements 26' are coupled at the peripheral area 223' of the circuit board 22'. When the molded base 23' is formed to enclose the peripheral area 223' of the circuit board 22', the molded base 23' will enclose the electronic elements 26'. Therefore, the electronic elements 26' are individually isolated and are separated from the photosensitive unit 21'. Accordingly, even though the distance between two adjacent electronic elements 26' is reduced, the molded base 23' can prevent the mutual interference by the adjacent electronic elements 26'. Since the molded base 23' encloses all the electronic elements 26' to prevent the electronic elements 26' from exposing and contacting with outside so as to prevent any contaminate the photosensitive area 212' of the photosensitive unit 21'. In other words, the size of the array imaging module can be further reduced and the imaging quality of the array imaging module can be enhanced. Therefore, through the enclosing of the electronic elements 26' within the molded base 23', the area of the circuit board 22' can be further reduced and more electronic elements 26' can be electrically coupled at the circuit board 22' with a limited installing area. The electronic element 26' can be, but not limit to, a resistor, a capacitor, a diode, a triode, a potentiometer, a relay, a processor, or a driver.

It is worth mentioning that the molded base 23', the photosensitive unit 21', and the circuit board 22' are combined to form an integrated structure, the molded base 23' will serves as a reinforcing portion to reinforce the structure of the circuit board 22'. In other words, the molded base 23' will enhance the strength of the circuit board 22' after the circuit board 22' is coupled with the molded base 23'. Even though a thinner circuit board 22' is used, the circuit board 22' will not be easily deformed when the strength of the circuit board 22' is enhanced by the molded base 23'. Therefore, the imaging quality of the array imaging module can be enhanced.

When the photosensitive unit 21' is coupled at and is electrically connected with the circuit board 22', the molded base 23' is molded and formed thereon, such that the molded base 23' forms a reinforcing portion of the circuit board 22'. Therefore, during the manufacturing process, the molded base 23' will reinforce the circuit board 22' to prevent the deformation of the circuit board 22', so as to enhance the imaging quality of the array imaging module.

According to the preferred embodiment of the array imaging module, the molded base 23' forms the reinforcing portion of the circuit board 22' when the molded base 23' is integrally formed with the circuit board 22', so as to reduce the cumulative tolerance of the array imaging module and to enhance the imaging quality of the array imaging module.

In addition, the photosensitive unit 21', the circuit board 22', and the molded base 23' are combined to form an integrated structure, the flatness of the photosensitive unit 21' will not be restricted by the flatness of the circuit board 22', such that a thinner circuit board 22', such as the flexible circuit board, can be used for reducing the thickness of the array imaging module.

Figure 18:
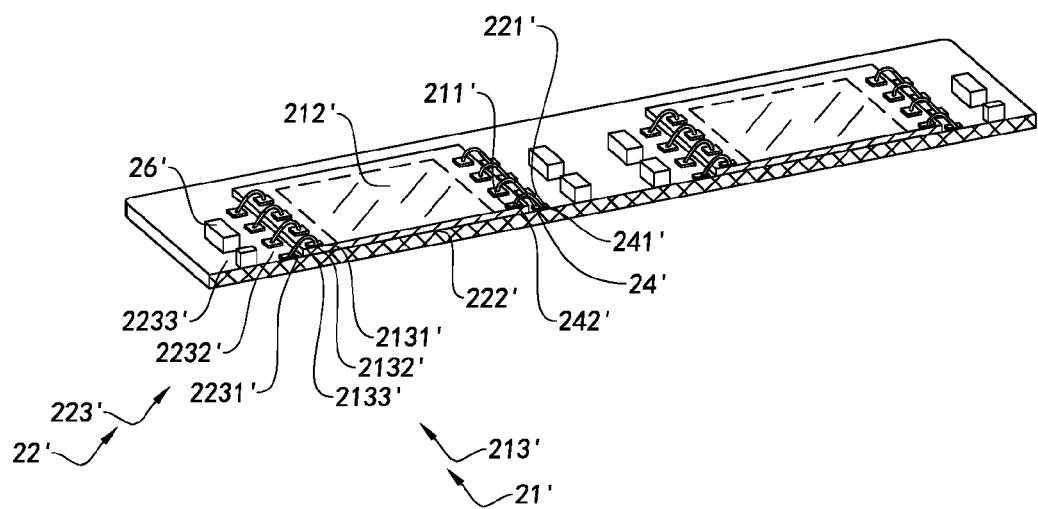
FIG. 18 illustrates the manufacturing process of the array imaging module according to the above preferred embodiments of the present invention, wherein the step 1 of coupling the photosensitive unit at the chip coupling area of the circuit board and electrically connecting the chip connector of the photosensitive unit at the connecting circuit of the circuit board via a lead wire, wherein the circuit board is an integrated one piece circuit board.

FIGS. 18 to 24 illustrates the array imaging module as a dual lens camera module. As shown in FIG. 18, the array imaging module can be formed as a multiple lens camera module having multiple optical lenses 10'.

Figure 25:
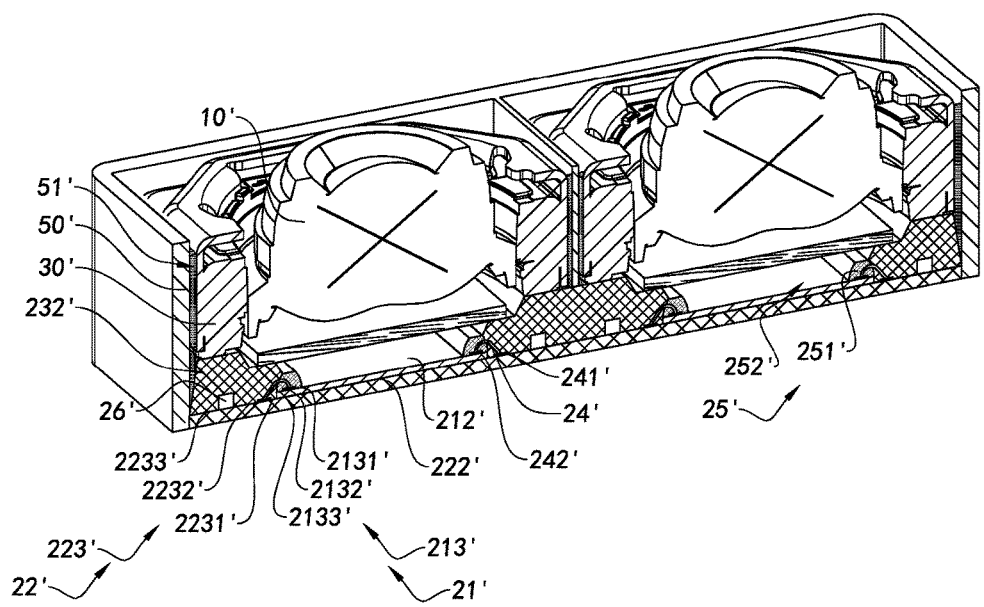
FIG. 25 illustrates an alternative mode of the array imaging module according to the above preferred embodiments of the present invention, wherein the drivers are coupled at the supporting cavities of the supporter respectively.

FIGS. 18 to 22 illustrate the manufacturing process of the molded photosensitive assembly 20' of the array imaging module. FIGS. 23 to 25 illustrate the manufacturing process of the array imaging module with the molded photosensitive assembly 20'.

Referring to FIG. 18, the two photosensitive units 21' are coupled at the two chip coupling areas 222' of the circuit board 22' respectively, wherein the chip connectors 211' of the photosensitive units 21' are electrically connected to the chip coupling areas 222' of the circuit board 22' via the lead wires 24' respectively. The electronic elements 26' are electrically connected at the peripheral area 223' of the circuit board 22'. The electronic elements 26' are spaced apart from each other. Once the array imaging module is formed, the electronic elements 26' will not be mutual interfered with each other.

Through the connection of the lead wire 24' and its physical properties, the chip connecting terminal 241' of the lead wire 24' is electrically connected to the chip connector 211' of the photosensitive unit 21' and the circuit board connecting terminal 242' of the lead wire 24' is electrically connected to the circuit connector 221' of the circuit board 22'. Then, each of the lead wires 24' is bent to protrude upwardly above the top side of the photosensitive unit 21'. It is appreciated that during the manufacturing process of the array imaging module, each of the lead wires 24' is retained at its original state to keep the best electrical conductivity of the lead wire 24' so as to enhance the imaging quality of the array imaging module.

Figure 19:
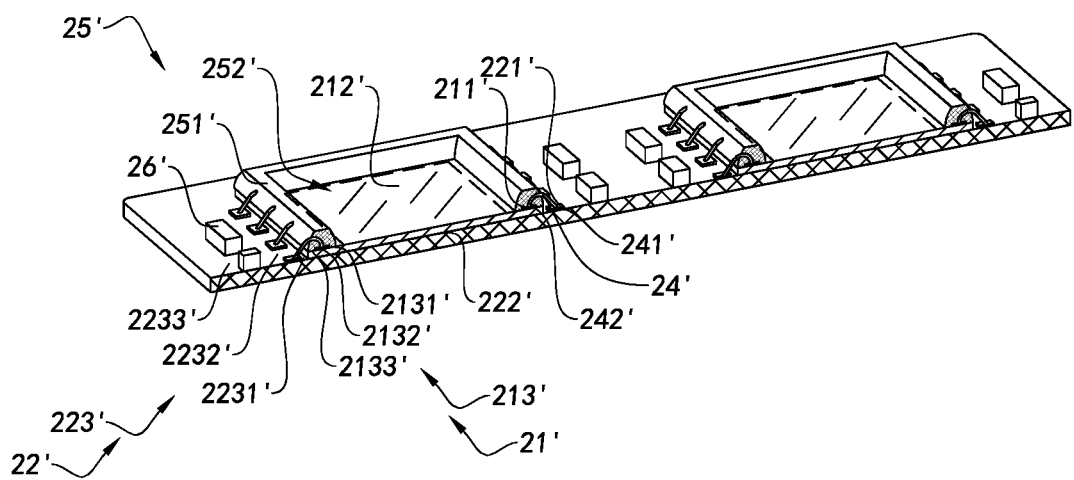
FIG. 19 illustrates the manufacturing process of the array imaging module according to the above preferred embodiments of the present invention, wherein the step 2 of forming the supporter to enclose at least a portion of the non-photosensitive area of the photosensitive unit to form a semi-product of the array imaging module.

As shown in FIG. 19, at least a portion of the non-photosensitive area 213' of the photosensitive unit 21' is enclosed by the respective supporting body 251', wherein the photosensitive area 212' of the photosensitive unit 21' is aligned with the through hole 252' of the respective supporting member 25'. Therefore, the supporting members 25', the photosensitive units 21', the circuit board 22', and the lead wires 24' form a semi-product of the array imaging module. According to the preferred embodiment, at least a portion of each of the chip inner lateral side 2131', the chip connecting portion 2132', and the chip outer lateral side 2133' of the photosensitive unit 21' is enclosed by the respective supporting body 251'. In other words, the supporting bodies 251' will cover the connections of the chip connecting terminals 241' of the lead wires 24' and the chip connectors 211' of the photosensitive units 21'. During the molding process, the supporting bodies 251' will prevent the molded base 23' contacting to the connections of the chip connecting terminals 241' of the lead wires 24' and the chip connectors 211' of the photosensitive units 21', so as to prevent any disconnect at the chip connecting terminals 241' of the lead wires 24' and the chip connectors 211' of the photosensitive units 21'.

Since the supporting bodies 251' cover the connections of the chip connecting terminals 241' of the lead wires 24' and the chip connectors 211' of the photosensitive units 21', the chip connecting terminals 241' of the lead wires 24' and the chip connectors 211' of the photosensitive units 21' can be separated by the supporting bodies 251'. During the molding process, the supporting bodies 251' will prevent the deformation of the chip connecting terminals 241' of the lead wires 24' and the chip connectors 211' of the photosensitive units 21', and will prevent any disconnect at the chip connecting terminals 241' of the lead wires 24' and the chip connectors 211' of the photosensitive units 21'.

In addition, a portion of each of the lead wires 24' is enclosed by the respective supporting body 251', such that the lead wires 24' are retained in position by the supporting bodies 251'. In other words, the lead wires 24' will not be deformed during the molding process. Therefore, the supporting bodies 251' can prevent each of the lead wires 24' from being deformed to contact with the neighboring lead wires 24' which may cause the short circuit, so as to ensure the quality of the array imaging module.

In one embodiment, the supporting body 251' is formed by adhesive to couple at the non-photosensitive area 213' of the respective photosensitive unit 21', such that when the adhesive is solidified, the supporting body 251' provides a predetermined elasticity. Once the supporting body 251' is formed, the inner lateral side 252' of the supporting body 251' forms the through hole 252' of the supporting member 25', such that the photosensitive area 212' of the photosensitive unit 21' is aligned with the through hole 252' of the supporting member 25'. In addition, since the supporting body 251' can be formed by adhesive to have a predetermined adhering ability, contaminants, such as dust or residue, can be adhered onto the supporting body 251' so as to prevent the contamination of the photosensitive area 212' of the photosensitive unit 21' for enhancing the imaging quality of the array imaging module. For example, the supporting body 251' is formed between the electronic element 26' and the photosensitive area 212' of the photosensitive units 21', such that the contaminants, such as welding powders, from the welding process of the electronic element 26' on the circuit board 22' will be adhered by the supporting body 251', so as to prevent contamination of the photosensitive area 212' of the photosensitive unit 21'.

Preferably, the supporting body 251' is formed by applying the adhesive on the non-photosensitive area 213' of the photosensitive units 21', such that when the adhesive is solidified, the shape of the supporting body 251' is retained at the non-photosensitive area 213' of the photosensitive units 21' to prevent the supporting body 251' from flowing to the photosensitive area 212' of the photosensitive unit 21' so as to prevent contamination of the photosensitive area 212' of the photosensitive unit 21'. In other words, the shape of the supporting body 251' can be adjustably modified via the solidification of the adhesive to prevent the deformation of the supporting body 251' during the solidification process, so as to ensure the supporting body 251' being retained at the non-photosensitive area 213' of the photosensitive units 21'. It is appreciated that after the connection between the chip connecting terminals 241' of the lead wires 24' and the chip connectors 211' of the photosensitive units 21' and the connection between the circuit board connecting terminals 242' of the lead wires 24' and the circuit connectors 221' of the circuit board 22', the chip connecting terminals 241' of the lead wires 24' are enclosed by the supporting bodies 251' after the solidification of the adhesive, so as to prevent the chip connecting terminals 241' of the lead wires 24' during the solidification process of the adhesive.

Figure 20A:
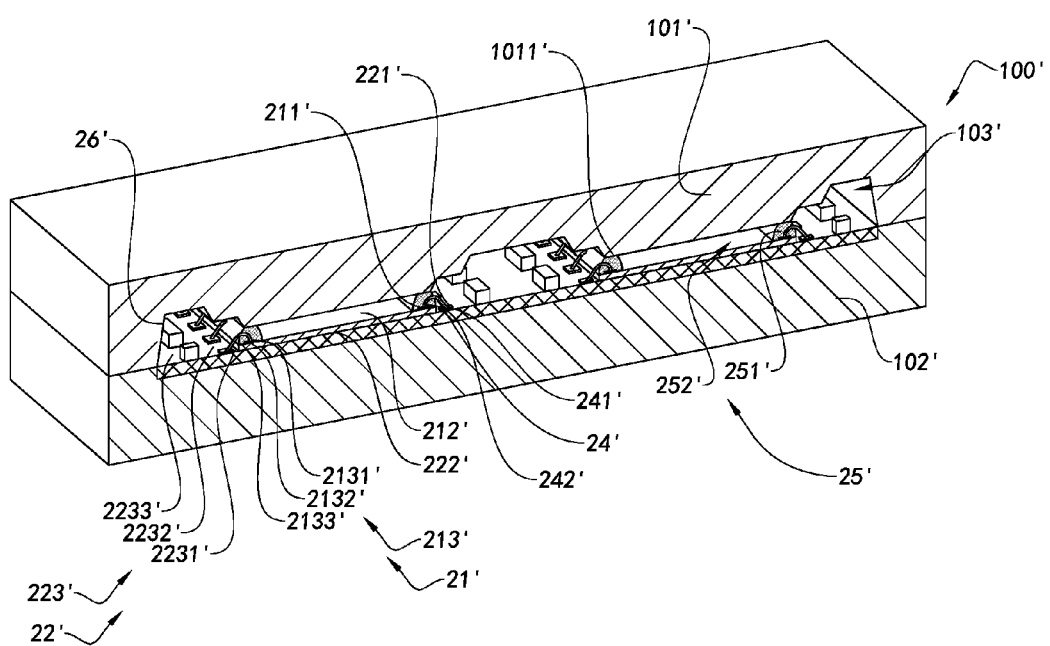
FIG. 20A illustrates the manufacturing process of the array imaging module according to the above preferred embodiments of the present invention, wherein the step 3 of disposing the semi-product between the upper mold body and the lower mold body of the mold at a position that the mold engaging surface of the upper mold body is pressed on the top side of the supporting body.

As shown in FIG. 20A, the molding process is operated by a mold 100' to form the molded base 23' after the mold material is solidified. Through the molding process, the size of the array imaging module is reduced and the assembling error of the array imaging module can be minimized so as to configure the array imaging module to have a compact size and to improve the imaging quality of the array imaging module.

In particular, the mold 100' comprises an upper mold body 101' and a lower mold body 102', wherein at least one of the upper mold body 101' and the lower mold body 102' is movable and operable in a controlling manner. When the upper mold body 101' and the lower mold body 102' are closed and coupled with each other, at least two mold cavities 103' are formed therewithin. Accordingly, the molded base 23' is formed by solidifying the mold material which is placed in or injected into the mold cavities 103'.

In one embodiment, for example, the lower mold body 102' is stationary and the upper mold body 101' is movable to couple towards the lower mold body 102' to close mold 100', wherein the mold 100' is opened by moving the upper mold body 101' away from the lower mold body 102'. When the upper mold body 101' is moved downwardly to couple with the lower mold body 102' to close the mold 100', the mold cavities 103' are formed therein. In another embodiment, the upper mold body 101' is stationary and the lower mold body 102' is movable with respect to the upper mold body 101' along guiding posts, such that when the lower mold body 102' is moved upwardly to couple with the upper mold body 101', the mold 100' is closed and the mold cavities 103' are formed therein, and that when the lower mold body 102' is moved downwardly away from the upper mold body 101', the mold 100' is opened for drafting.

When the semi-product of the array imaging module is placed in the upper mold body 101' and/or the lower mold body 102', the mold 100' is closed by coupling upper mold body 101' with the lower mold body 102' to form the mold cavities 103' therein. The mold engaging surface 1011' of the upper mold body 101' is pressed on the top side 2501' of the supporting body 251', wherein the upper mold body 101' is supported by the supporting body 251' to prevent the upper mold body 101' being directly pressed against the lead wires 24', so as to protect the lead wires 24' from being damaged during the molding process. It is worth mentioning that the peripheral area 223' of the circuit board 22' of the semi-product is set corresponding to the mold cavity 103'.

It is worth mentioning that each of the mold cavities 103' forms an annular shape and the two mold cavities 103' are communicated with each other, such that the mold material filled in the mold cavities 103' forms the molded base 23' after it is solidified.

Preferably, due to the elasticity of the supporting body 251', the supporting bodies 251' will absorb the impact from the upper mold body 101' when the mold engaging surface 1011' of the upper mold body 101' is pressed on the top sides 2501' of the supporting bodies 251', so as to prevent the impact force transmitting to the photosensitive units 21'. In other words, the supporting bodies 251' prevents the photosensitive units 21' from being damaged and to prevent the dislocation of the circuit board 22' due to the impact force. It is appreciated that the supporting bodies 251' not only absorb the impact force to prevent the impact force transmitting to the photosensitive unit 21' but also ensure the photosensitive units 21' coupled at the circuit board 22' with its flatness, so as to enhance the imaging quality of the array imaging module.

Preferably, in one embodiment, the height of each of the supporting bodies 251' is higher than the height of the apex of the lead wires 24' as the lead wires 24' being bent to protrude upwardly above the top side of the photosensitive unit 21'. During the operation of the mold 100', the mold engaging surface 1011' of the upper mold body 101' is pressed on the top sides 2501' of the supporting bodies 251'. The top sides 2501' of the supporting bodies 251' will bias against the upper mold body 101' to prevent the further downward movement of the upper mold body 101', so as to prevent the mold engaging surface 1011' of the upper mold body 101' from being pressed against the lead wires 24'. In other words, each of the supporting bodies 251' creates a predetermined safety distance between the mold engaging surface 1011' of the upper mold body 101' and the lead wires 24'. In another embodiment, the height of each of the supporting bodies 251' is the same as the height of the lead wires 24', wherein during the operation of the mold 100', the mold engaging surface 1011' of the upper mold body 101' is merely contacted with the lead wires 24'. However, the mold engaging surface 1011' of the upper mold body 101' cannot apply a substantial pressing force against the lead wires 24'.

In addition, due to the elasticity of the supporting body 251', the mold engaging surface 1011' of the upper mold body 101' is pressed on the top sides 2501' of the supporting bodies 251' to slightly deform the top sides 2501' of the supporting bodies 251', so as to prevent any gap formed between the mold engaging surface 1011' of the upper mold body 101' and the top sides 2501' of the supporting bodies 251'. In other words, the mold engaging surface 1011' of the upper mold body 101' and the top sides 2501' of the supporting bodies 251' are tightly engaged with each other in a surface-to-surface engaging manner. As a result, the photosensitive areas 212' of the photosensitive units 21' through the through holes 252' of the supporting members 25' respectively will be enclosed in a closed environment during the molding process. Therefore, when the mold material is introduced into the mold cavities 103', the mold material will not be entered into the closed environment and contaminate the photosensitive area 212' of the photosensitive unit 21'. It is worth mentioning that the Shore A hardness of the supporting body 251' has a range between A50 and A80, and the elasticity of the supporting body 251' has a range between 0.1 Gpa and 1 Gpa.

In addition, during the molding process, the mold engaging surface 1011' of the upper mold body 101' and the top sides 2501' of the supporting bodies 251' are tightly engaged with each other, to prevent the edge trimming of the molded base 23', so as to enhance the imaging quality of the array imaging module.

Figure 20B:
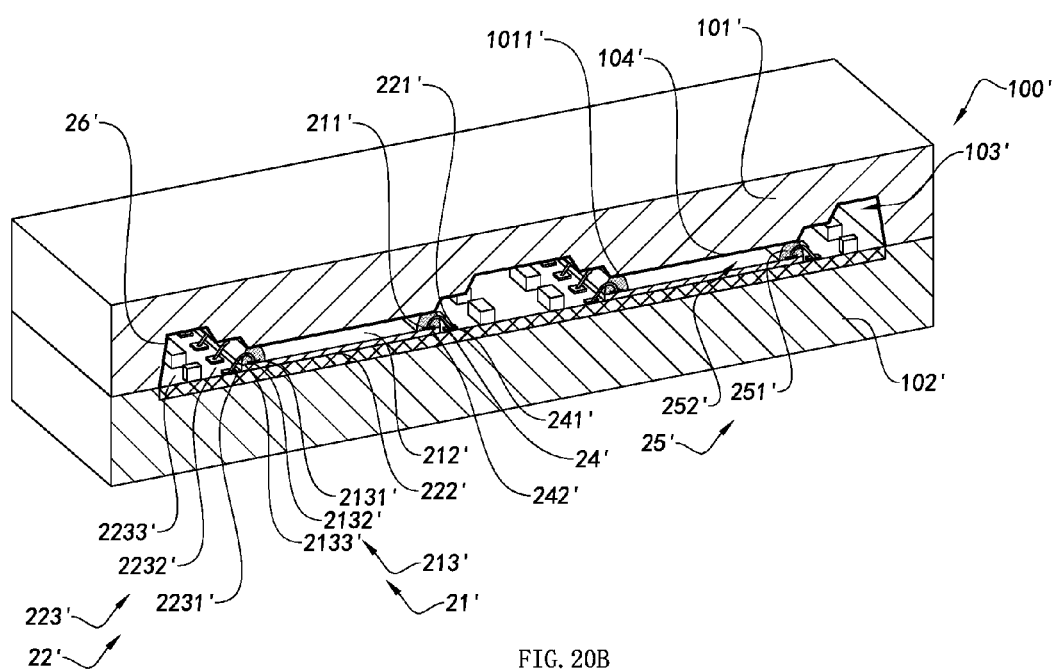
FIG. 20B illustrates an alternative mode of the manufacturing process of the array imaging module according to the above preferred embodiments of the present invention, wherein the step 3 of providing the enclosing film at the mold engaging surface of the upper mold body, wherein the enclosing film is sandwiched between the mold engaging surface of the upper mold body and the top side of the supporting body.

FIG. 20B illustrates an alternative mode of the manufacturing process of the molded photosensitive assembly 20' according to the present invention, wherein the supporting body 251' can be made of rigid material. In other words, when the mold engaging surface 1011' of the upper mold body 101' is pressed on the top sides 2501' of the supporting bodies 251', the top sides 2501' of the supporting bodies 251' will not be deformed, so as to enhance the electrical conductivity of the lead wires 24' and to ensure the quality of the array imaging module and the imaging quality of the array imaging module. It is worth mentioning that the Shore A hardness of the supporting body 251' is larger than A70, and the elasticity of the supporting body 251' is larger than 1 Fpa.

The mold 100' further comprises an enclosing film 104' provided at the mold engaging surface 1011' of the upper mold body 101', wherein when the upper mold body 101' and the lower mold body 102' are coupled with each other to close the mold 100', the enclosing film 104' is sandwiched between the mold engaging surface 1011' of the upper mold body 101' and the top sides 2501' of the supporting bodies 251', so as to ensure the photosensitive area 212' of the photosensitive unit 21' in a closed environment.

It is worth mentioning that when the enclosing film 104' is sandwiched between the mold engaging surface 1011' of the upper mold body 101' and the top sides 2501' of the supporting bodies 251', a gap is formed between the mold engaging surface 1011' of the upper mold body 101' and the top sides 2501' of the supporting bodies 251'. In addition, the enclosing film 104' will provide a buffering effect at the mold engaging surface 1011' of the upper mold body 101' to prevent the impact force directly applying to the top sides 2501' of the supporting bodies 251', so as to prevent the impact force transmitting to the photosensitive units 21', the circuit board 22', and the lead wires 24'.

In addition, the enclosing film 104' is removed from the mold 100' after the molded base 23' is formed during the molding process.

Figure 21:
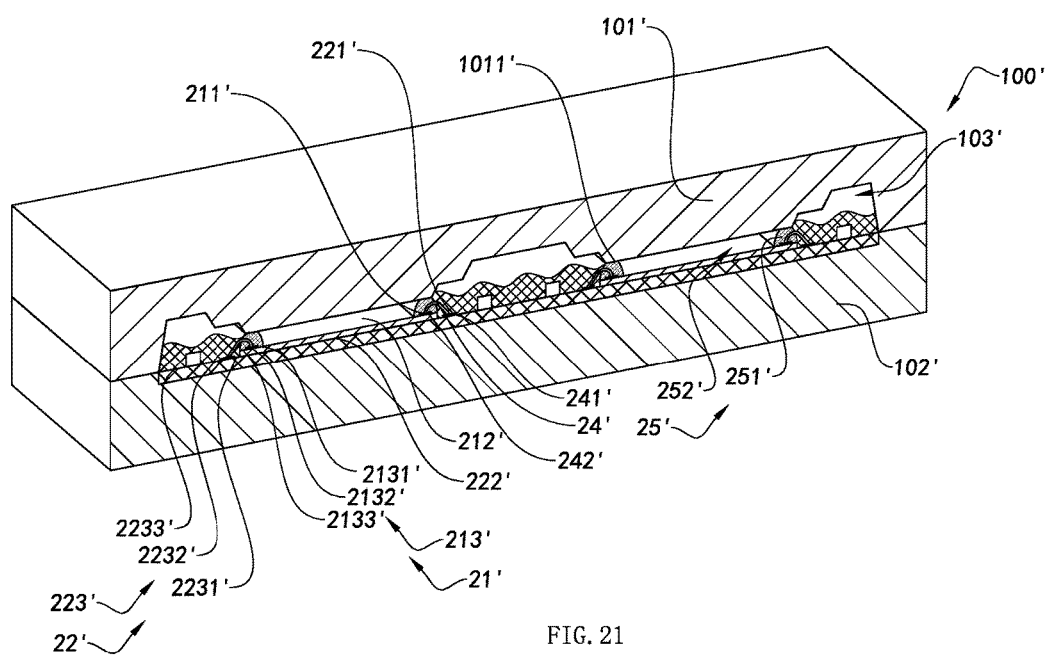
FIG. 21 illustrates the manufacturing process of the array imaging module according to the above preferred embodiments of the present invention, wherein the step 4 of introducing the mold material into the mold cavity between the upper mold body and the lower mold body of the mold.

Referring to FIG. 21, the mold material, in liquid state, is introduced or injected into the mold 100' to fill the mold cavities 103' until the mold cavities 103' are fully filled with the mold material at the non-photosensitive areas 213' of the photosensitive units 21' and part of the supporting bodies 251', so as to prevent the mold material filling into the closed environment. In other words, the supporting bodies 251' can block the mold material passing from the non-photosensitive areas 213' of the photosensitive units 21' to the closed environment and can block the mold material passing from the gap between the top sides 2501' of the supporting bodies 251' and the mold engaging surface 1011' of the upper mold body 101' to the closed environment.

It is worth mentioning that the mold material can be formed by fluid material or solid particulate material, or a mixture of fluid material and solid particulate material. It should not be limited to either one of the liquid material or solid particulate material, and a mixture of fluid material and solid particulate material in the present invention. When the mold material is filled into the mold cavities 103', the mold material is solidified to form the molded base 23'. In one embodiment, the mold material in liquid form is implemented as a thermoplastic material, such as in a liquid state, wherein the mold material filled into the mold cavities 103' of the mold 100' to form the molded base 23'. It is worth mentioning that after the mold material is filled into the mold cavities 103' of the mold 100', the solidification process, such as heating or cooling process, for solidifying the mold material to form the molded base 23' should not be restricted in the present invention.

Figure 22:
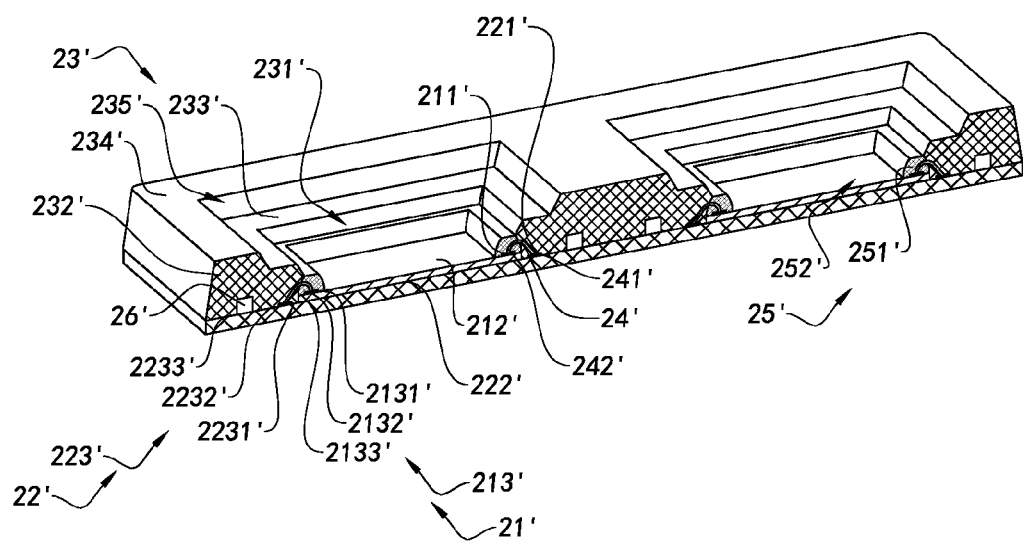
FIG. 22 illustrates the manufacturing process of the array imaging module according to the above preferred embodiments of the present invention, wherein the step 5 of solidifying the mold material to form the mold sealer, so as to form the molded photosensitive assembly.
Figure 23:
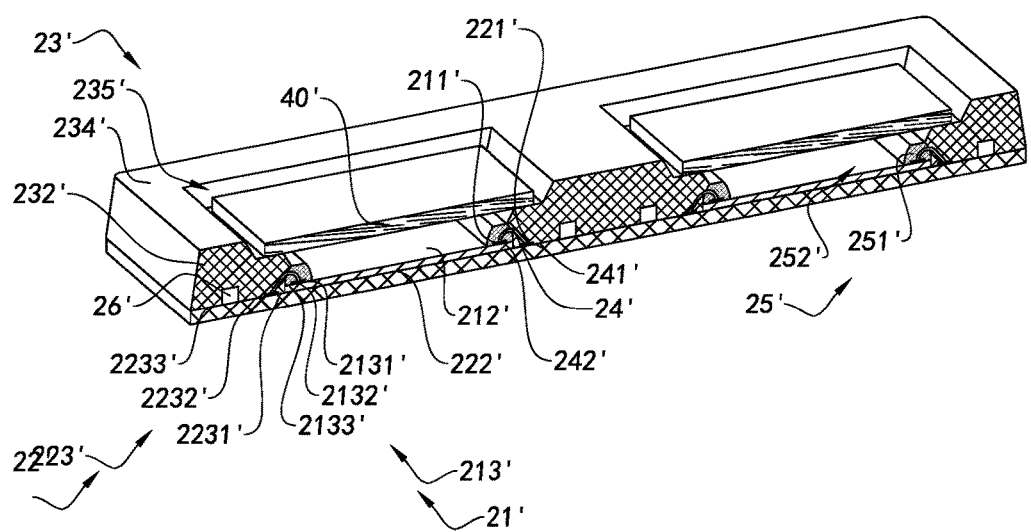
FIG. 23 illustrates the manufacturing process of the array imaging module according to the above preferred embodiments of the present invention, wherein the step 6 of coupling the light filter at the top side of the mold sealer.

As shown in FIG. 22, when the mold material is filled into the mold cavities 103', the supporting bodies 251' will block the mold material entering into the photosensitive areas 212' of the photosensitive units 21', so as to form the molded base 23' after the solidification of the mold material. Once the molded base 23' is formed, at least two optical windows 231' are correspondingly formed, wherein the optical windows 231' are aligned with the photosensitive areas 212' of the photosensitive units 21' and the optical lenses 10' respectively. Therefore, a light channel is formed corresponding to the photosensitive area 212' of each of the photosensitive units 21' and the respective optical lens 10' through the optical window 231'. Accordingly, the molded base 23' is formed to have a main mold body 232' covered at the peripheral portion 223' of the circuit board 22', and at least a portion of the outer lateral side 2503' of each of the supporting bodies 251', and the top side of each of the supporting bodies 251'. In other words, the molded base 23' is constructed to have the main mold body 232' and at least two optical windows 231', wherein the light filters 40' and the drivers 30' are then coupled to the top side of the molded base 23' so as to retain the drivers 30' corresponding to the optical lenses 10' along the photosensitive paths of the photosensitive units 21' respectively.

It is worth mentioning that the peripheral portion 223' of the circuit board 22' is integrally bonded with the main mold body 232' to enclose the one or more electronic elements 26, such that the electronic elements 26 are individually enclosed by the main mold body 232' so as to separate the electronic elements 26 from the photosensitive units 21'. Through this configuration, the distance between two adjacent electronic elements 26' is reduced, and the mutual interference by the adjacent electronic elements 26' can be avoided. The main mold body 232 can further prevent the contamination generated from the electronic elements 26 to the photosensitive areas 212' of the photosensitive units 21', so as to enhance the imaging quality of the array imaging module.

In addition, the electronic elements 26 are individually enclosed by the main mold body 232' to prevent the mutual interference by the adjacent electronic elements 26', such that the distance between two adjacent electronic elements 26' is reduced. Even though the area of the circuit board is reduced, more electronic elements 26' can be electrically coupled at the circuit board 22' with a limited installing area to enhance the imaging quality of the array imaging module. In addition, the electronic elements 26 are individually enclosed by the main mold body 232'. Even though the distance between the photosensitive unit 21' and the electronic elements 26' is reduced, the main mold body 232' can prevent the mutual interference between the photosensitive units 21' and the electronic elements 26'. Therefore, the photosensitive areas 212' of the photosensitive units 21' can be enlarged within the limited area of the circuit board 22' to enhance the imaging quality of the array imaging module.

Preferably, the main mold body 232' has a good heat insulation to prevent the heat generated from the photosensitive units 21' during the photoelectric conversion being transmitted to the electronic elements 26', so as enhance the reliability of the array imaging module during the operation thereof.

As shown in FIGS. 22 and 23, the light filters 40' are coupled at the top side of the mold sealer 23, such that the optical windows 231' of the molded base 23' are enclosed by the light filters 40' respectively. Then, the light can pass through the optical lenses 10' and can enter into the interior of the array imaging module for being filtered by the light filters 40'. The light filters 40' can improve the imaging quality of the array imaging module. As shown in FIG. 22, there are two light filters 40' installed in the array imaging module. It is appreciated that the array imaging module can be constructed to have one light filter 40' coupled at the top side of the molded base 23' to enclose two optical windows 231' thereof. Therefore, two photosensitive areas 212' of the photosensitive units 21' will be corresponded to the light filter 40' at different locations.

In addition, the top side of the molded base 23' has at least two inner lateral top surfaces 233' and an outer lateral top surface 234' located at the same level of each of the inner lateral top surfaces 233', such that the top side of the molded base 23' has a flat surface. The light filters 40' are coupled at the inner lateral top surfaces 233' of the molded base 23' respectively to enclose the optical windows 231' respectively. The drivers 30 are coupled at the outer lateral top surface 234' of the molded base 23' at different locations, so as to retain the light filters 40' at a position between the drivers 30 and the photosensitive areas 212' of the photosensitive units 21' respectively. In another embodiment, the inner lateral top surface 233' of the molded base 23' is located below the outer lateral top surface 234' thereof, such that due to the height difference, the inner lateral top surface 233' and the outer lateral top surface 233' form a step-ladder configuration to form at least two indention slots 235', wherein the light filters 40' are coupled at the inner lateral top surface 233' within the indention slots 235' respectively.

Figure 26:
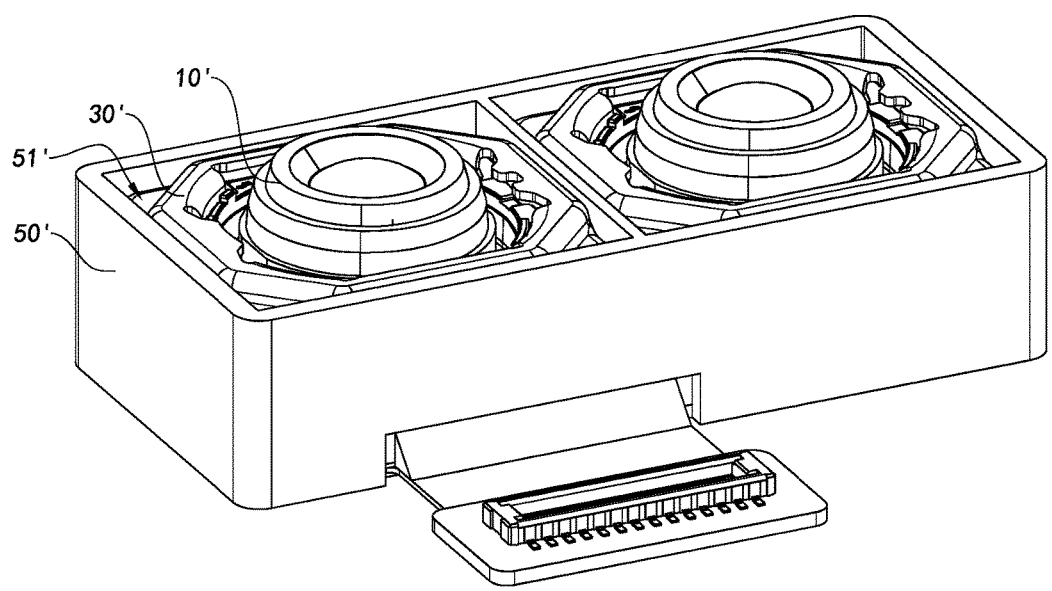
FIG. 26 is a perspective view of the array imaging module according to the above preferred embodiments of the present invention.
Figure 27:
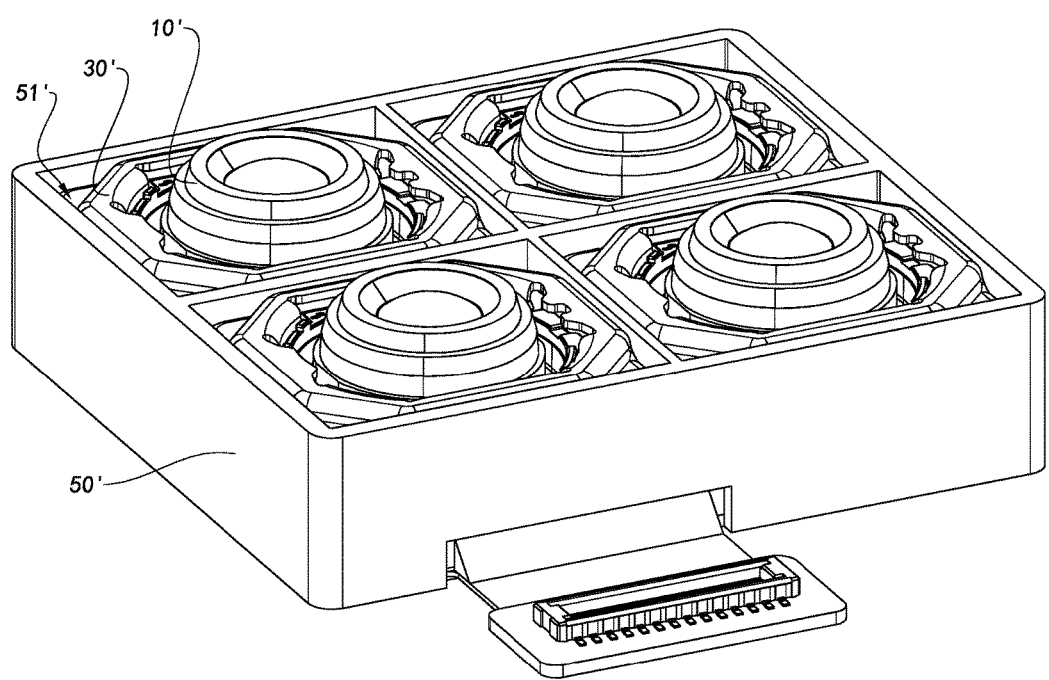
FIG. 27 illustrates a first alternative mode of the array imaging module according to the above preferred embodiments of the present invention.

FIGS. 25 and 26 illustrate an alternative mode of the present invention, wherein the array imaging module further comprises a supporter 50' which has at least two supporting cavities 51'. The two supporting cavities 51' are located at two lateral sides of the supporter 50', such that each of the supporting cavities 51' forms a channel. The drivers 30' are coupled at the supporting cavities 51' of the supporter 50' respectively, such that each of the drivers 30' is stably retained in position for ensuring the optical lens 10' to be coaxially aligned with the respective driver 30 and for increasing the strength of the array imaging module, so as to enhance the imaging quality of the array imaging module.

Preferably, after the drivers 30' are coupled at the supporting cavities 51' of the supporter 50' respectively, a filler is filled between an outer casing of each of the driver 30' and an inner wall of the supporter 50' to ensure the drivers 30' to be stably coupled at the supporter 50' so as to prevent any unwanted wobbling movement of the drivers 30. Preferably, the filler can be adhesive filled between the an outer casing of each of the drivers 30' and an inner wall of the supporter 50'.

As shown in FIG. 25, after the drivers 30' are coupled at the supporting cavities 51' of the supporter 50' respectively, the filler is filled between the outer casing of the driver 30' and an inner wall of the supporter 50' to ensure the drivers 30' to be stably coupled at the supporter 50' so as to prevent any unwanted wobbling movement of the driver 30. The supporter 50' will ensure the coaxial alignment between the driver 30' and the optical lens 10' and will enhance the strength of the structure of the array imaging module so as to improve the stabilization of the array imaging module. It is worth mentioning that the drivers 30' can be coupled at the supporting cavities 51' of the supporter 50' respectively, such that at least a portion of the driver 30' will be enclosed by the supporter 50'. In another embodiment, at least a portion of the molded base 23' is enclosed by the supporter 50', which should not be restricted in the present invention.

Figure 28:
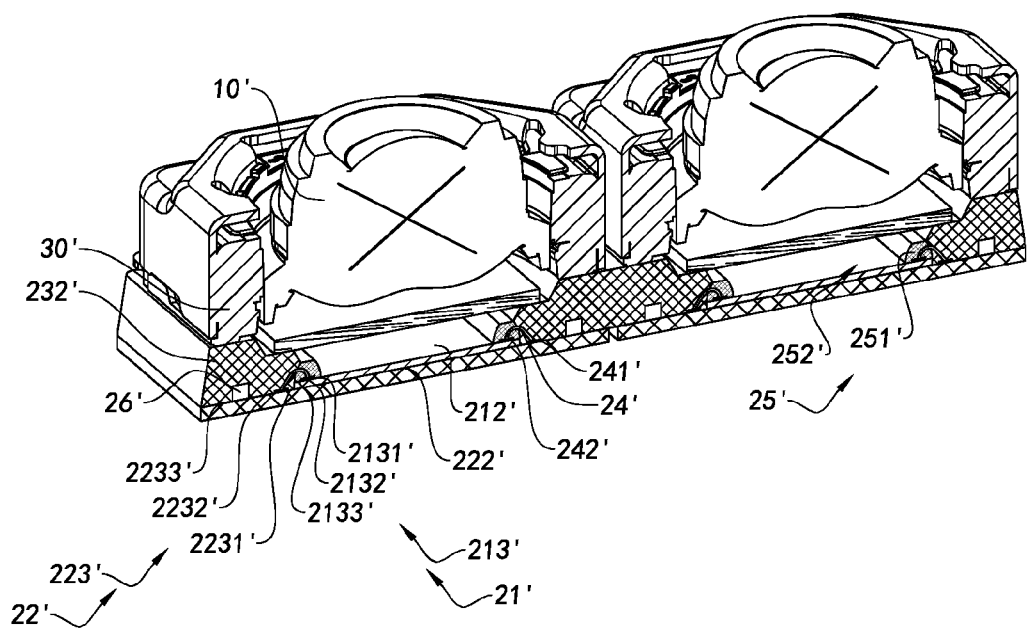
FIG. 28 illustrates a second alternative mode of the array imaging module according to the above preferred embodiments of the present invention.

FIG. 28 illustrates another alternative mode of the array imaging module according to the present invention, wherein the array imaging module comprises two circuit boards 22', wherein each of the circuit boards 22' has a chip coupling portion 222' and a peripheral portion 223'. The photosensitive units 21' are electrically coupled at the chip coupling portions 222' of the circuit boards 22' respectively. During the mold process to form the molded base 23', the molded base 23' comprises a main mold body 232' coupled at the peripheral portion 223' of each of the circuit boards 22'. In other words, the circuit boards 22' can be a split type circuit board.

Figure 29:
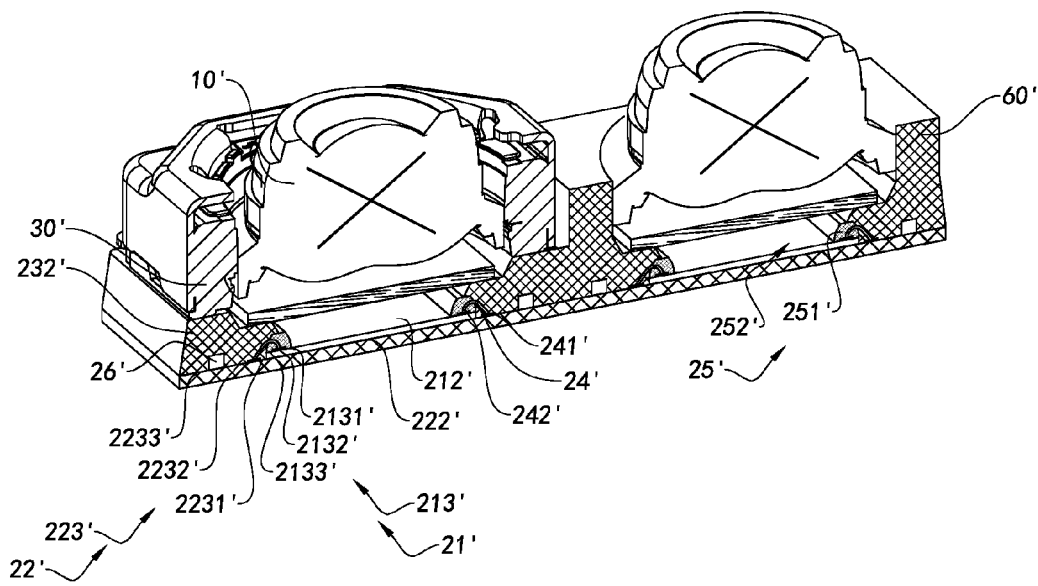
FIG. 29 illustrates a third alternative mode of the array imaging module according to the above preferred embodiments of the present invention.

FIG. 29 illustrates a third alternative mode of the array imaging module according to the present invention, wherein the array imaging module comprises a lens barrel 60' and at least a driver 30'. The lens barrel 60' is integrally extended from the top side of the molded base 23', wherein the driver 30 is coupled at the top side of the molded base 23', such that the lens barrel 60' and the molded base 23' are respectively assembled with the optical lens 10'. Preferably, the lens barrel 60' and the molded base 23' are formed integrally during the mold process. For example, the array imaging module is a dual lens camera module which incorporates with one driver 30' and one lens barrel 60'.

Figure 30:
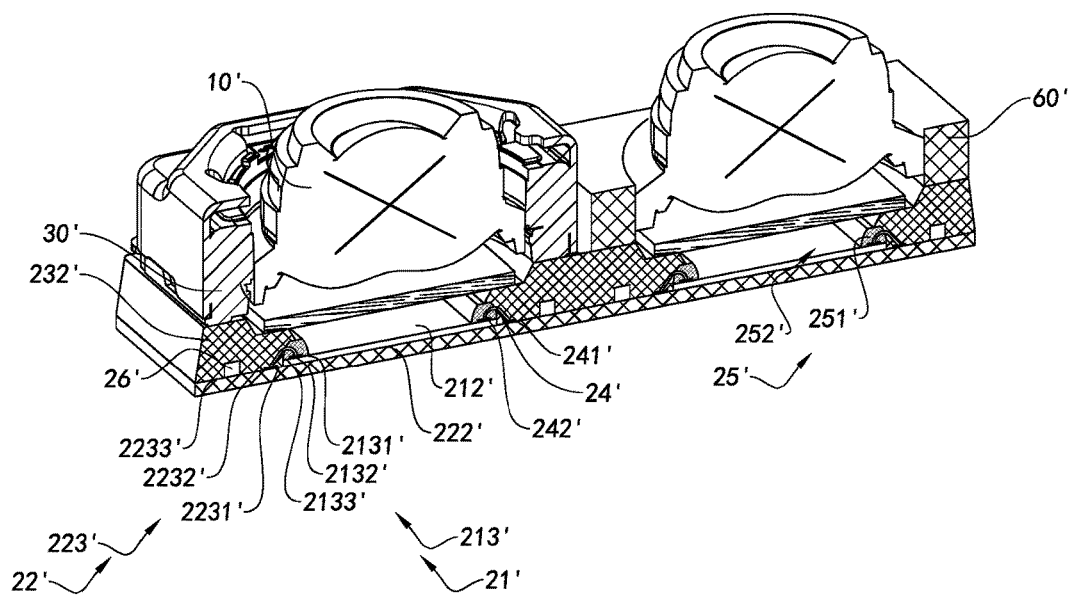
FIG. 30 illustrates a fourth alternative mode of the array imaging module according to the above preferred embodiments of the present invention.

FIG. 30 illustrates a fourth alternative mode of the array imaging module according to the present invention, wherein the array imaging module comprises a lens barrel 60' and at least a driver 30'. The lens barrel 60' and the driver 30' are coupled at the top side of the molded base 23'. In other words, the lens barrel 60' and the driver 30' are coupled at the top side of the molded base 23' at different locations, wherein the optical lenses 10' are coupled at the driver 30' and the lens barrel 60' respectively.

Figure 31:
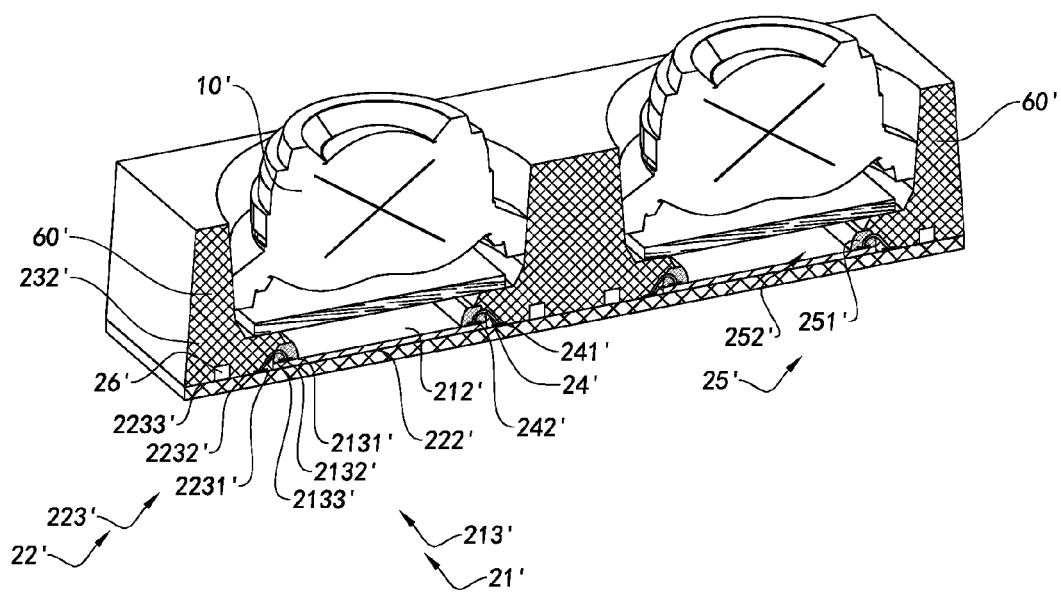
FIG. 31 illustrates a fifth alternative mode of the array imaging module according to the above preferred embodiments of the present invention.

FIG. 31 illustrates a fifth alternative mode of the array imaging module according to the present invention, wherein the array imaging module comprises two lens barrels 60' mounted to the top side of the molded base 23'. The optical lenses 10' are coupled at the lens barrels 60' respectively. Preferably, the lens barrels 60' are respectively coupled to the molded base 23' in an integrated manner during the mold process.

Figure 32:
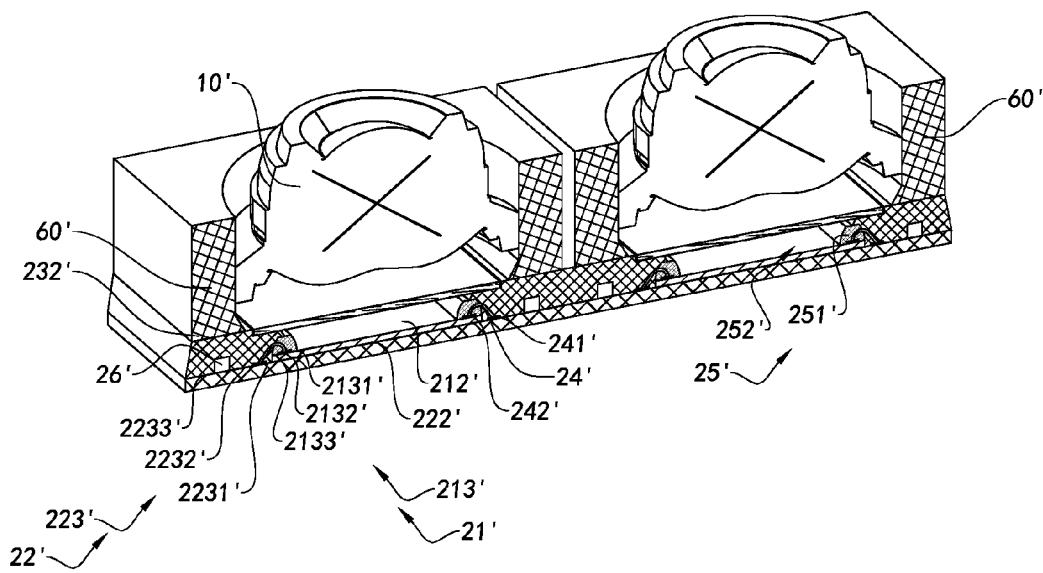
FIG. 32 illustrates a sixth alternative mode of the array imaging module according to the above preferred embodiments of the present invention.

FIG. 32 illustrates a sixth alternative mode of the array imaging module according to the present invention, wherein the array imaging module comprises two lens barrels 60'. After the molded photosensitive assembly 20' is formed, the lens barrels 60' are coupled at the top side of the molded base 23' at different positions. In other words, the optical lenses 10' are coupled at the lens barrels 60' respectively, such that the optical lenses 10' are located along the optical paths of the photosensitive units 21' respectively. It is worth mentioning that the lens barrel 60' can have the threaded structure or the thread-less structure, wherein the mounting structure of the lens barrel 60' should not be restricted.

Figure 33:
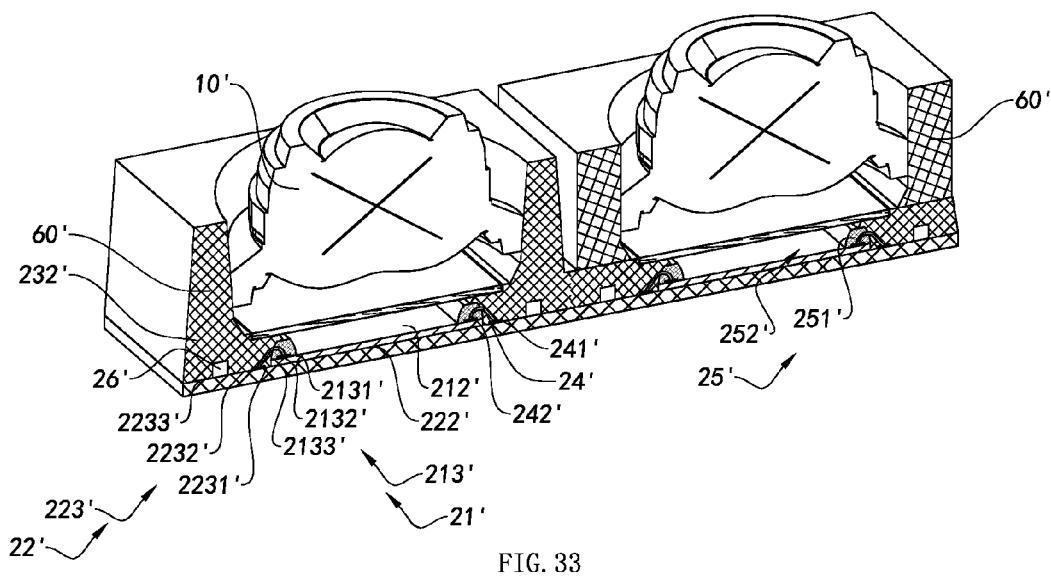
FIG. 33 illustrates a seventh alternative mode of the array imaging module according to the above preferred embodiments of the present invention.

FIGS. 31 and 32 illustrate two different alternative modes of the array imaging module according to the present invention. As shown in FIG. 33, the array imaging module comprises at least a lens barrel 60' integrally extended from the top side of the molded base 23' during the mold process. Another lens barrel 60' is coupled at the top side of the molded base 23'. For example, when the array imaging module is embodied as the dual lens camera module, one of the lens barrel 60' is integrally extended from the top side of the molded base 23' during the mold process and another lens barrel 60' is coupled at the top side of the molded base 23' for auto-focusing.

Figure 34:
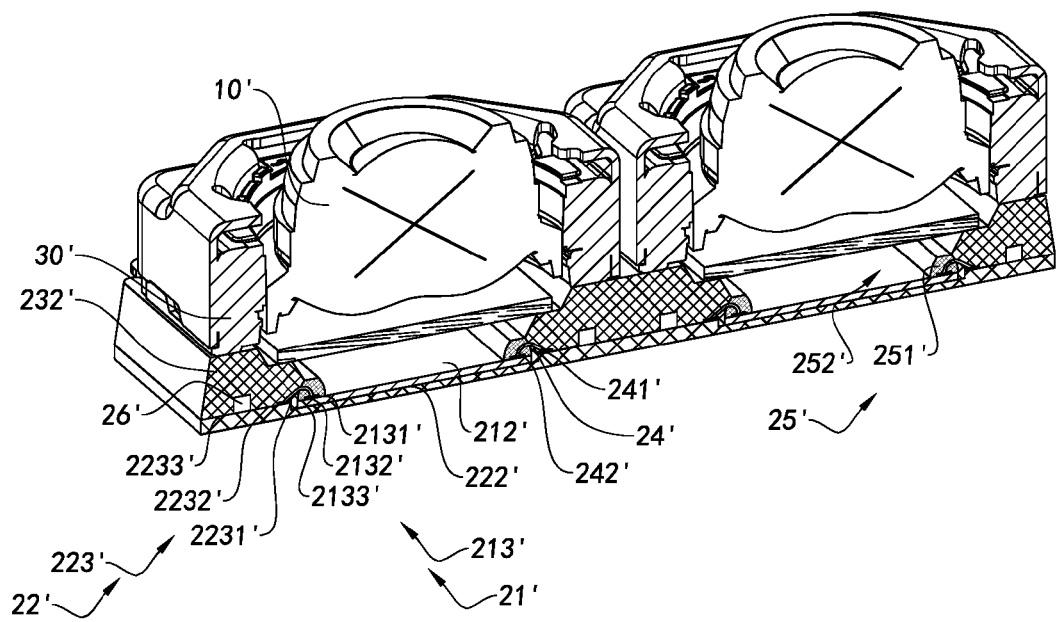
FIG. 34 illustrates an eighth alternative mode of the array imaging module according to the above preferred embodiments of the present invention.
Figure 35A:
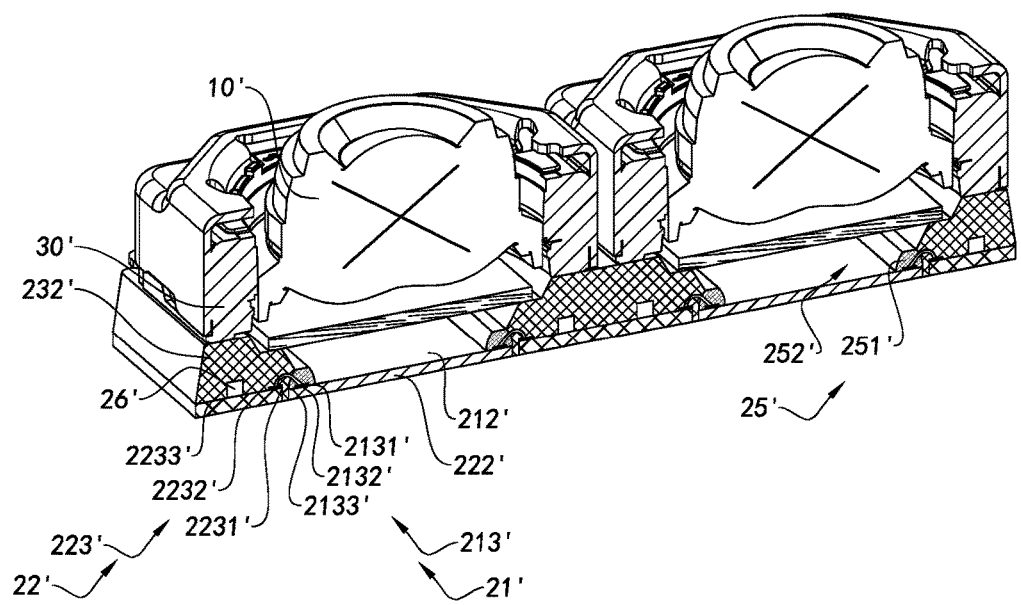
FIG. 35A illustrates a ninth alternative mode of the array imaging module according to the above preferred embodiments of the present invention.

FIGS. 34 and 35A illustrate an eighth and a ninth alternative mode of the array imaging module according to the present invention, wherein the array imaging module comprises a circuit board 22' having at least a receiving chamber 224', wherein the photosensitive unit 21' is received in the receiving chamber 224' of the circuit board 22' to minimize the height difference between the top side of the photosensitive unit 21' and the top side of the circuit board 22'. Preferably, the top side of the photosensitive unit 21' and the top side of the circuit board 22' are aligned with the same planar direction. Therefore, the height of the array imaging module can be further reduced. The array imaging module can be incorporated with the thinness of the electronic device. It is worth mentioning that the receiving chamber 224' can be a receiving slot, as shown in FIG. 24. FIG. 35A illustrates a ninth alternative mode of the array imaging module according to the present invention, wherein the receiving chamber 224' can be a receiving through hole for reducing the height of the array imaging module.

Figure 35B:
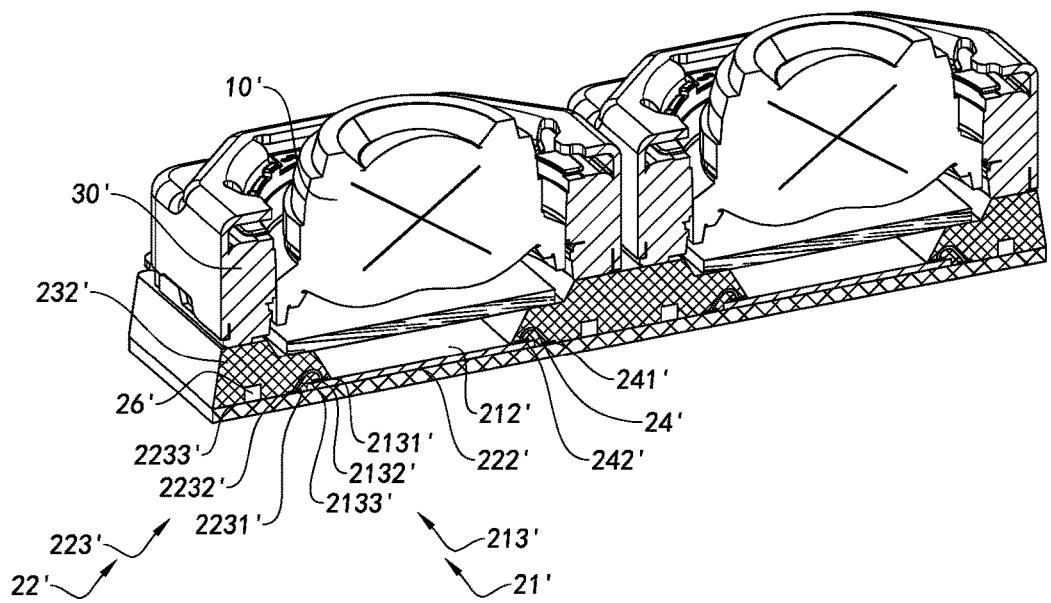
FIG. 35B illustrates a tenth alternative mode of the array imaging module according to the above preferred embodiments of the present invention.

FIG. 35B illustrate a tenth alternative mode of the array imaging module according to the present invention, wherein the array imaging module does not include the supporting member 25'. In particular, after the photosensitive unit 21' and the circuit board 22' are electrically connected with each other, the photosensitive unit 21' and the circuit board 22' are disposed in the mold 100'. The enclosing film 104' is overlappedly placed at the mold engaging surface 1011' of the upper mold body 101', wherein the upper mold body 101' is actuated to press the mold engaging surface 1011' of the upper mold body 101' on the photosensitive unit 21', such that the enclosing film 104' is sandwiched between the mold engaging surface 1011' of the upper mold body 101' and the photosensitive unit 21', so as to protect the photosensitive unit 21' during the molding process. Therefore, the manufacturing process will be simplified to minimize the manufacturing cost of the array imaging module.

Once the molding process is completed, the molded base 23' is formed to directly enclose on the peripheral portion 223' of the circuit board 22' and at least a portion of the non-photosensitive area 213' of the photosensitive unit 21', such that the circuit board 22', the photosensitive unit 21', and the molded base 23' are integrally bonded with each other.

FIG. 35B illustrate another alternative mode of the molded photosensitive assembly 20' of the array imaging module according to the present invention, wherein the supporting body 251' encloses a portion of the peripheral portion 223' of the circuit board 22' and the non-photosensitive area 213' of the photosensitive unit 21' at the chip outer lateral side 2133', the chip connecting portion 2132', and at least a portion of the chip inner lateral side 2131'. Once the molding process is completed, the molded base 23' is formed to enclose a portion of the peripheral portion 223' of the circuit board 22' and at least a portion of the outer lateral side 2503' and the top side 2501' of the supporting body 251'.

It is worth mentioning that the entire lead wire 24' is entirely enclosed by the supporting body 251', such that the lead wire 24' is retained in position before the molded base 23' is formed. During the molding process, the supporting body 251' will prevent the mold material contacting with the lead wires 24', so as to prevent the deformation of the lead wires 24' during the introducing the mold material into the mold cavities 103'. In addition, the supporting body 251' has good heat insulation ability to insulate the lead wires 24' from the heat generated by the mold material in the mold cavities 103' during the solidification process, so as to ensure the electrical conductivity of the lead wires 24'.

In addition, each of the supporting bodies 251' is formed at the portion of the peripheral portion 223' of the circuit board 22' and at least a portion of the non-photosensitive area 213' of the respective photosensitive unit 21' to ensure the electrical connection between the photosensitive units 21' and the circuit board 22'. During the molding process, the supporting bodies 251' will prevent the displacement between the photosensitive units 21' and the circuit board 22' and will ensure the flatness of the photosensitive units 21'.

Furthermore, each of the supporting bodies 251' is formed at the portion of the peripheral portion 223' of the circuit board 22' and at least a portion of the non-photosensitive area 213' of the photosensitive unit 21' to prevent any clearance formed therebetween. During the molding process, the supporting bodies 251' will prevent the mold material entering into the clearance between the peripheral portion 223' of the circuit board 22' and the non-photosensitive areas 213' of the photosensitive units 21' to ensure the photosensitive units 21' being flatten on the circuit board 22' so as to enhance the imaging quality of the array imaging module.

Figure 36A:
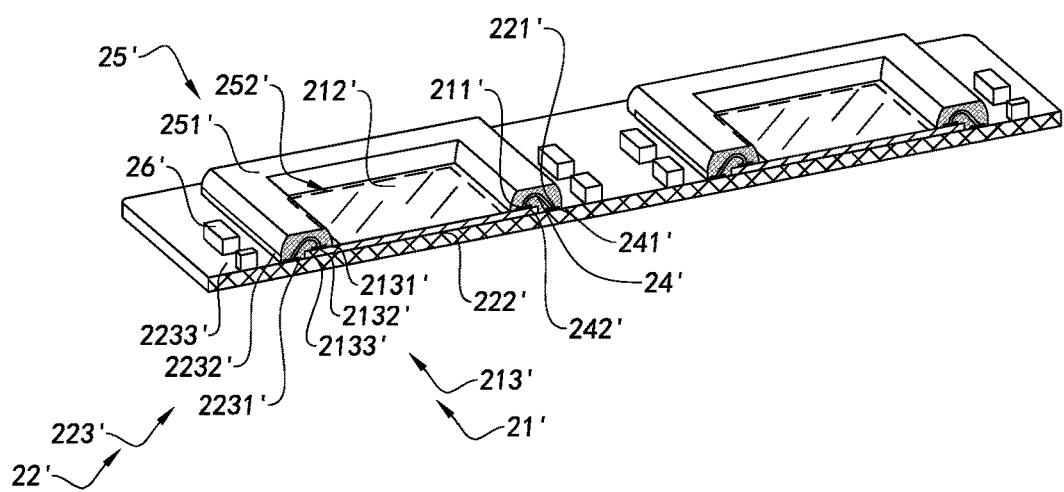
FIG. 36A illustrates a first alternative mode of the semi-product of the array imaging module according to the above preferred embodiments of the present invention, illustrating the supporting body enclosing at least a portion of the peripheral portion of the circuit board, and at least a portion of the circuit board outer lateral side, the circuit board connecting portion, and the circuit board inner lateral side of the photosensitive unit.
Figure 36B:
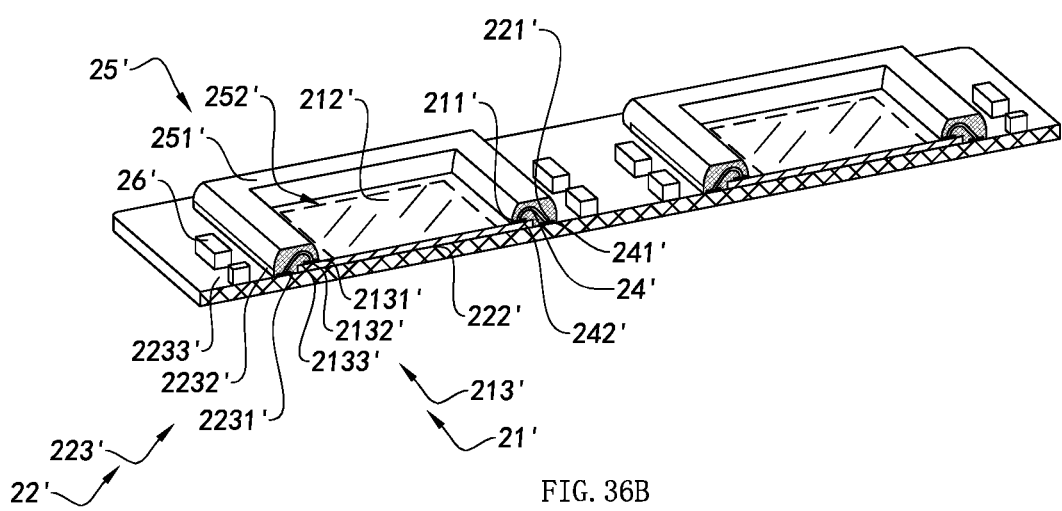
FIG. 36B illustrates a second alternative mode of the semi-product of the array imaging module according to the above preferred embodiments of the present invention, illustrating the supporting body enclosing at least a portion of the peripheral portion of the circuit board, and at least a portion of the circuit board outer lateral side and the circuit board connecting portion of the photosensitive unit.

FIG. 36B illustrates a second alternative mode of the molded photosensitive assembly 20' of the array imaging module according to the present invention, wherein each of the supporting bodies 251' encloses a portion of the peripheral portion 223' of the circuit board 22' and the non-photosensitive area 213' of the respective photosensitive unit 21' with at least a portion the chip outer lateral side 2133' and the chip connecting portion 2132'. Once the molding process is completed, the molded base 23' is formed to enclose a portion of the peripheral portion 223' of the circuit board 22' and at least a portion of the outer lateral side 2503' and the top sides 2501' of the supporting bodies 251'.

Figure 36C:
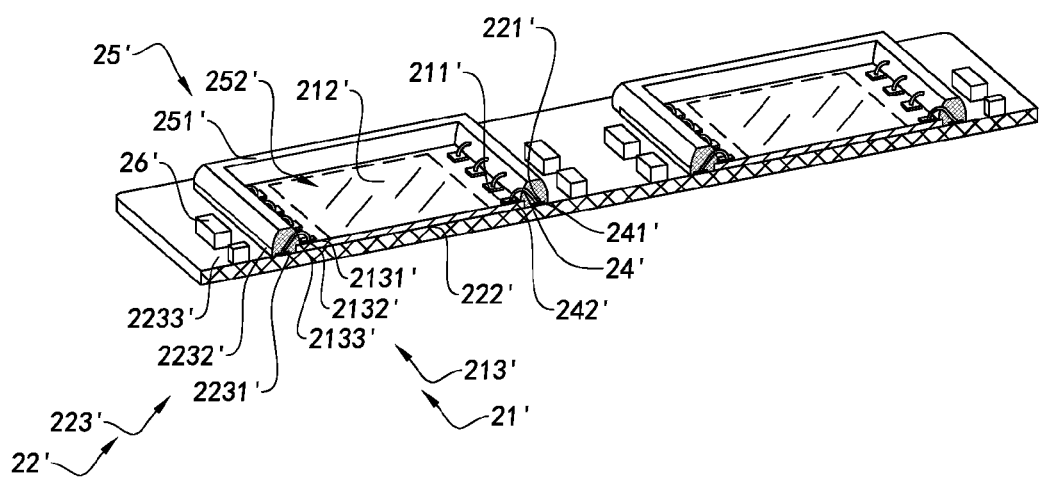
FIG. 36C illustrates a third alternative mode of the semi-product of the array imaging module according to the above preferred embodiments of the present invention, illustrating the supporting body enclosing at least a portion of the peripheral portion of the circuit board, and at least a portion of the circuit board outer lateral side of the photosensitive unit.

FIG. 36C illustrates a third alternative mode of the molded photosensitive assembly 20' of the array imaging module according to the present invention, wherein each of the supporting bodies 251' encloses a portion of the peripheral portion 223' of the circuit board 22' and the non-photosensitive area 213' of the respective photosensitive unit 21' with at least a portion the chip outer lateral side 2133'. Once the molding process is completed, the molded base 23' is formed to enclose a portion of the peripheral portion 223' of the circuit board 22' and at least a portion of the outer lateral side 2503' and the top sides 2501' of the supporting bodies 251'.

It is appreciated that FIGS. 36B and 36C illustrate the molded photosensitive assembly 20' two different alternatives, wherein the supporting body 251' does not have to enclose the chip inner lateral side 2131' of the non-photosensitive area 213' of the photosensitive unit 21', such that the size of the chip inner lateral side 2131' of the photosensitive unit 21' can be further minimized. In other words, the photosensitive area 212' of the photosensitive unit 21' can be further enlarged. As a result, the size of the array imaging module can be selectively controlled to enhance the imaging quality of the array imaging module.

In addition, the supporting body 251' does not have to enclose the chip inner lateral side 2131' of the non-photosensitive area 213' of the photosensitive unit 21'. During the solidification of adhesive to form the supporting body 251', the adhesive is located away from the photosensitive area 212' of the photosensitive unit 21'. In other words, before the solidification of adhesive, the adhesive may flow to the chip inner lateral side 2131' of the photosensitive unit 21' but not to the photosensitive area 212' of the photosensitive unit 21', so as to prevent the contamination thereof. In other words, the chip inner lateral side 2131' of the photosensitive unit 21' provides a safety distance between the supporting body 251' and the photosensitive area 212' of the photosensitive unit 21'.

Figure 36D:
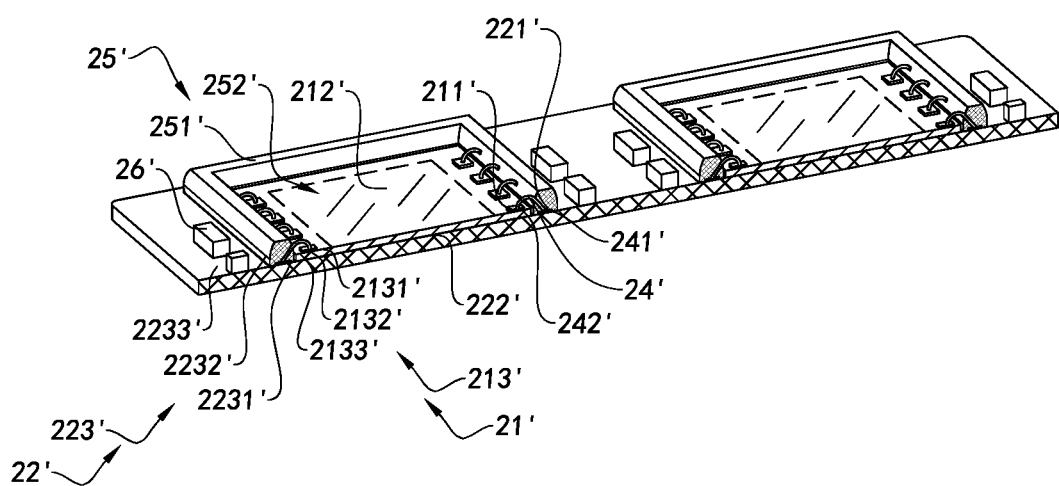
FIG. 36D illustrates a fourth alternative mode of the semi-product of the array imaging module according to the above preferred embodiments of the present invention, illustrating the supporting body enclosing at least a portion of the peripheral portion of the circuit board.

FIG. 36D illustrates a fourth alternative mode of the molded photosensitive assembly 20' of the array imaging module according to the present invention, wherein each of the supporting bodies 251' encloses a portion of the peripheral portion 223' of the circuit board 22'. Once the molding process is completed, the main mold body 232' of the molded base 23' is formed to enclose a portion of the peripheral portion 223' of the circuit board 22' and at least a portion of the outer lateral side 2503' and the top sides 2501' of the supporting bodies 251'.

FIG. 36D illustrates a fourth alternative mode of the molded photosensitive assembly 20' of the array imaging module according to the present invention, wherein there is only one supporting member 25'. The supporting body 251' of the supporting member 25' encloses a portion of the peripheral portion 223' of the circuit board 22' to ensure the photosensitive area 212' of the respective photosensitive unit 21' to align with the through hole 252' of the supporting member 25'. Once the molding process is completed, the main mold body 232' of the molded base 23' is formed to enclose a portion of the peripheral portion 223' of the circuit board 22' and at least a portion of the outer lateral side 2503' and the top side 2501' of the supporting body 251'.

Figure 36E:
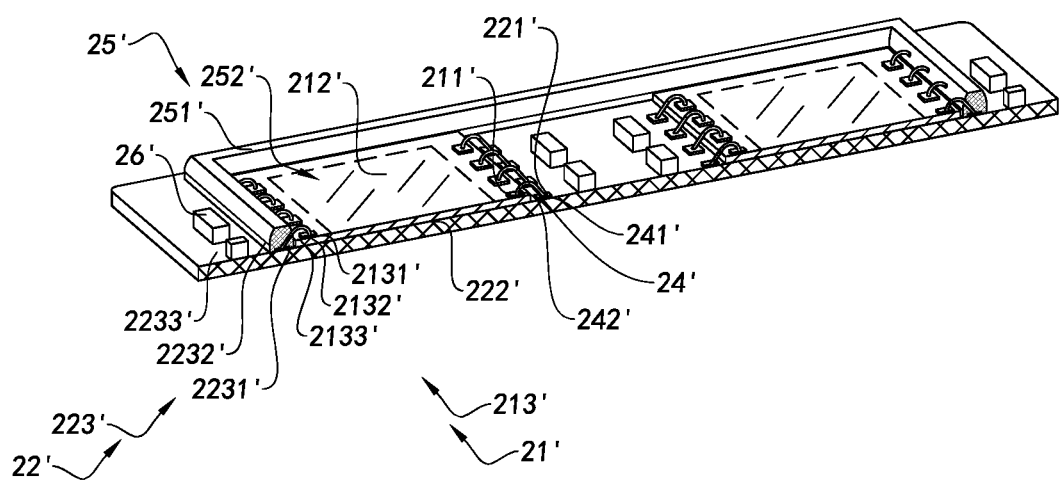
FIG. 36E illustrates a fifth alternative mode of the semi-product of the array imaging module according to the above preferred embodiments of the present invention, illustrating the supporting body enclosing at least a portion of the peripheral portion of the circuit board.

FIGS. 36D and 36E illustrate the molded photosensitive assembly 20' two different alternatives, wherein the supporting body 251' does not have to enclose the non-photosensitive area 213' of the photosensitive unit 21', such that the supporting body 251' is located away from the photosensitive area 212' of the photosensitive unit 21' to prevent the contamination of the photosensitive area 212' of the photosensitive unit 21' during the solidification of adhesive to form the supporting body 251'. Preferably, the supporting body 251' further encloses the connection between the lead wires 24' and circuit connector 221' of the circuit board 22' as shown in FIGS. 36D and 36E. During the molding process, the supporting body 251' will prevent the mold material entering to the connection between the lead wires 24' and circuit connector 221' of the circuit board 22', so as to prevent the disconnection or deformation of the lead wires 24'.

It is appreciated that FIGS. 36A to 36E illustrate different structural configurations of the molded photosensitive assembly 20', the molded photosensitive assembly 20' can be further modified without any restriction. In other words, the supporting body 251' can selectively enclose the circuit board outer lateral side 2233', the circuit board connecting portion 2232', and the circuit board inner lateral side 2231' of the circuit board 22', and at least a portion or at least one of the circuit board outer lateral side 2233', the circuit board connecting portion 2232', and the circuit board inner lateral side 2231' of the photosensitive unit 21. For example, the supporting body 251' can enclose a portion of the circuit board connecting portion 2232' or can entirely enclose the circuit board connecting portion 2232'. It is appreciated that the supporting body 251' can be selectively modified to enclose different areas. In one embodiment, the supporting body 251' can enclose different areas of the peripheral portion 223' of the circuit board 22' and the non-photosensitive areas 213' of the photosensitive units 21'.

Figure 37:
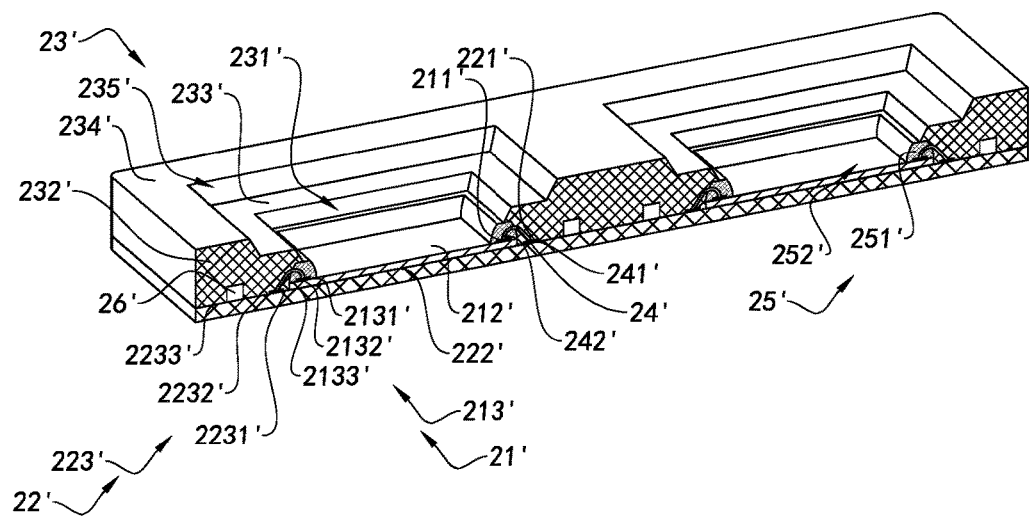
FIG. 37 illustrates an alternative mode of the array imaging module according to the above preferred embodiments of the present invention, illustrating the mold sealer enclosing the outer lateral side of the supporter.

FIG. 37 illustrates another alternative mode of the molded photosensitive assembly 20' according to the present invention, wherein the mold engaging surface 1011' of the upper mold body 101' is contacted with at least a portion of the top sides 2501' of the supporting bodies 251'. Once the molding process is completed, the main mold body 232' of the molded base 23' is formed to enclose the portion of the top sides 2501' of the supporting bodies 251'.

It is worth mentioning that in one embodiment, the array imaging module is constructed to have at least two optical lenses 10' and one molded photosensitive assembly 20', wherein the optical lenses 10' are coupled and located at the optical paths of the photosensitive units 21' of the molded photosensitive assembly 20'.

Figure 38:
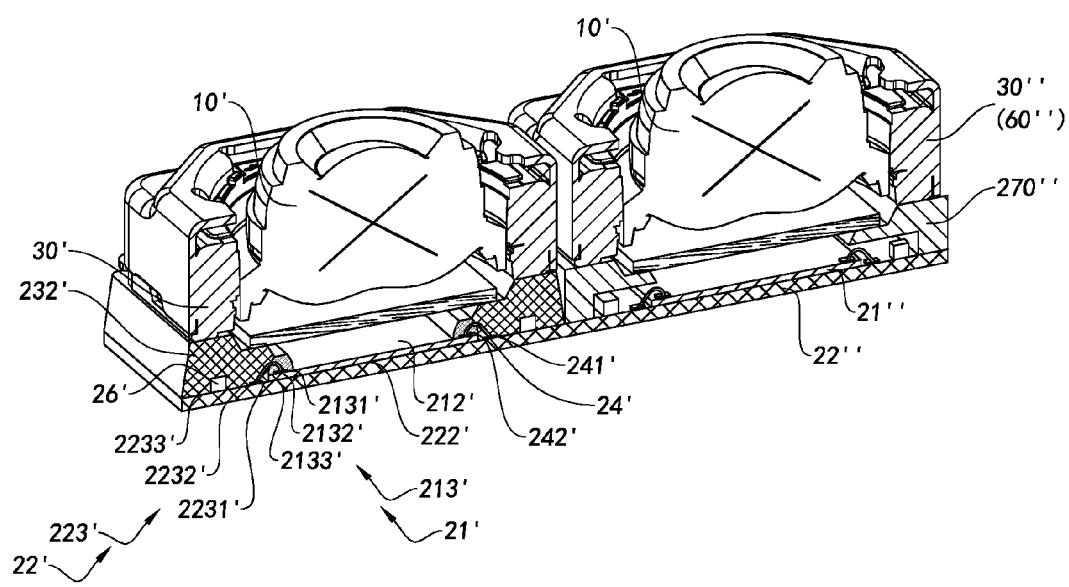
FIG. 38 illustrates a first alternative mode of the structural configuration of the array imaging module according to the above preferred embodiments of the present invention.

FIG. 38 illustrates another embodiment of the array imaging module according to the present invention, which comprises at least two optical lenses 10', a molded photosensitive assembly 20', and at least an additional photosensitive unit 21". Each of the additional photosensitive units 21" is operatively coupled at the circuit board 22' of the molded photosensitive assembly 20', wherein the optical lenses 10' are located along the optical paths of the photosensitive unit 21' of molded photosensitive assembly 20' and the additional photosensitive unit 21" respectively, so as to form the array imaging module. In addition, the array imaging module further comprises at least an additional supporter 270", at least an additional driver 30", and/or at least an additional lens barrel 60". The additional supporters 270" are electrically coupled at the circuit board 22' of the molded photosensitive assembly 20'. The additional drivers 30" and/or the lens barrels 60" are coupled at the circuit board 22'. The optical lenses 10' are operatively coupled at one of the drivers 30', the lens barrels 60", the additional drivers 30", and the additional lens barrels 60". Then, the optical lenses 10' are located along the optical paths of the photosensitive unit 21' of molded photosensitive assembly 20' and the additional photosensitive unit 21'' respectively. In addition, the additional photosensitive unit 21'' is not coupled at the circuit board 22' of the molded photosensitive assembly 20' but is coupled at an additional circuit board 22'' of the array imaging module.

Figure 39:
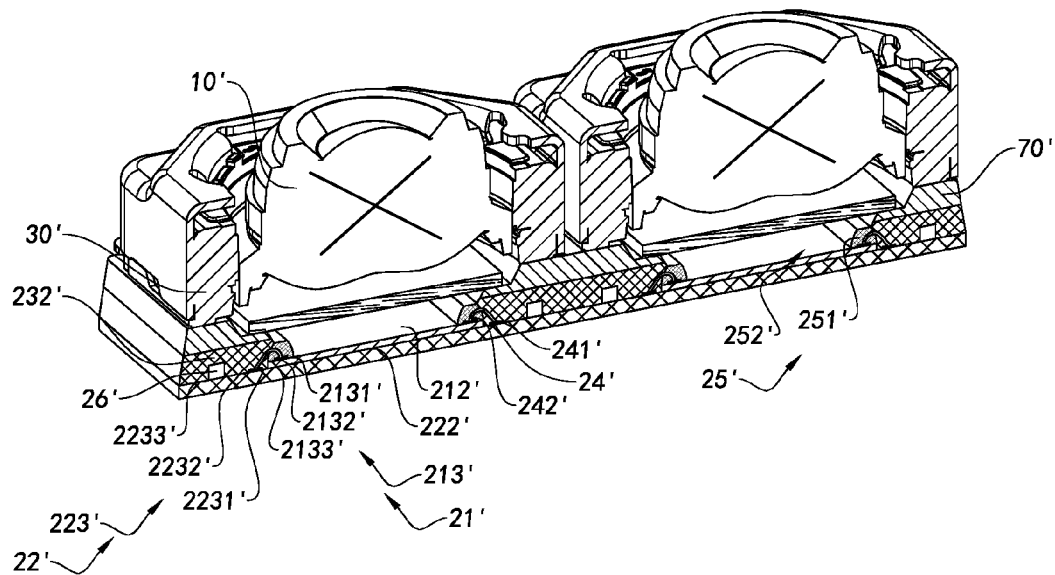
FIG. 39 illustrates a second alternative mode of the structural configuration of the array imaging module according to the above preferred embodiments of the present invention.

FIG. 39 illustrates an alternative mode of the array imaging module according to the present invention, wherein the light filters 40' is not directly coupled to the main mold body 232' of the molded base 23' but at least a light filter supporter 70'. In other words, the light filters 40' are coupled to the light filter supporter 70' respectively, wherein the light filter supporter 70' is coupled at the top side of the main mold body 232' to retain the light filters 40' between the optical lenses 10' and the photosensitive units 21' respectively. Through this configuration, the size of the light filter 40' can be reduced to reduce the manufacturing cost of the array imaging module.

It is worth mentioning that the number of light filter supporter 70' matches with the number of light filter 40', such that the light filter supporter 70' and the light filter 40' are set in a one-to-one manner. For example, when one light filter 40' is used, only one light filter supporter 70' is needed for the light filter 40'. In another embodiment, the number of light filter supporter 70' matches with the number of light filter 40' which matches with the number of the optical lens 10'. For example, in FIG. 24, the number of light filter supporter 70', the number of light filter 40', the number of the optical lens 10' are two, such that two light filter supporters 70', two light filters 40', and two optical lenses 10' are used.

In another embodiment, the number of light filter supporter 70' is different from the number of light filter 40'. For example, when one light filter supporter 70' is used, two or more of the light filters 40' can be incorporated. In particular, the light filters 40' can be supported at different locations of the light filter supporter 70'.

As shown in FIG. 39, the top side of the main mold body 232' of the molded base 23' is a flat surface, wherein after the molded base 23' is formed, the light filter supporter 70' is coupled on the top side of the main mold body 232', and then the driver 30' or the lens barrel 60' is coupled at the light filter supporter 70'. In other words, the driver 30' or the lens barrel 60' is not directly coupled at the top side of the main mold body 232' but is coupled at the light filter supporter 70'.

Figure 40:
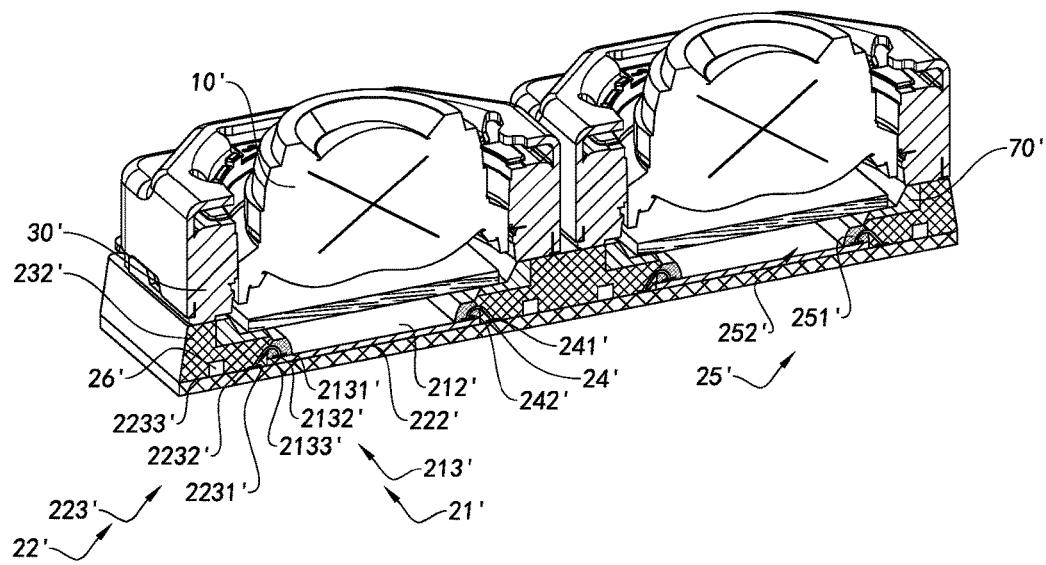
FIG. 40 illustrates a third alternative mode of the structural configuration of the array imaging module according to the above preferred embodiments of the present invention.

FIG. 40 illustrates another alternative mode of the array imaging module, wherein the molded base 23' further has an indention groove 235' indentedly formed at the top side of the main mold body 232'. The light filter supporter 70' is engaged with and received in the indention groove 235' to minimize the height of the array imaging module. Accordingly, the driver 30' or the lens barrel 60' can be directly coupled at the top side of the main mold body 232'.

It is appreciated that the optical lens 10' can be directly coupled at the top side of the main mold body 232' or directly coupled at the top side of the light filter supporter 70'.

Figure 41:
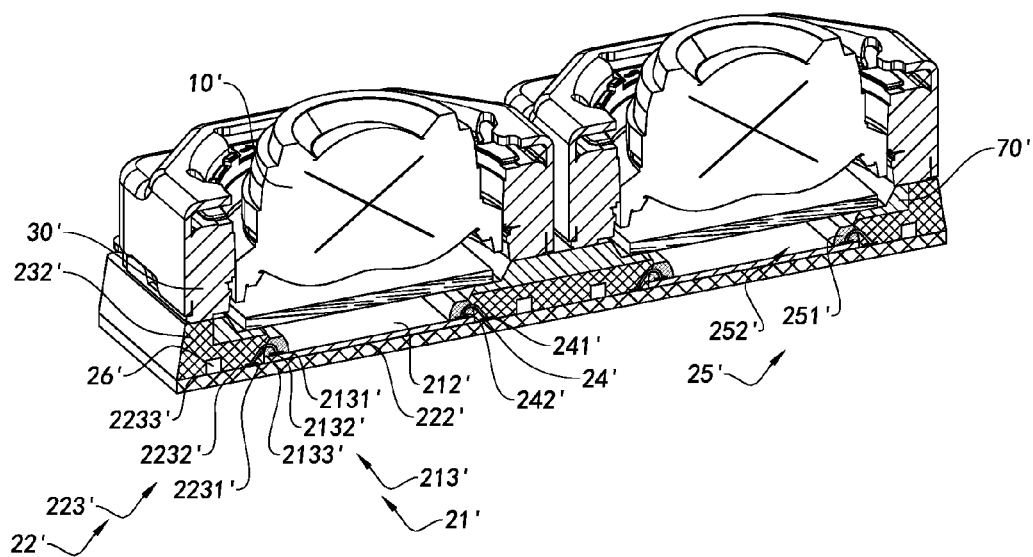
FIG. 41 illustrates a fourth alternative mode of the structural configuration of the array imaging module according to the above preferred embodiments of the present invention.

FIG. 41 illustrates another alternative mode of the array imaging module, wherein there is only one light filter supporter 70' and the light filter supporter 70' has at least two light through slots. Two or more light filters 40' can be coupled to the light filter supporter 70' at a position that the light through slots are aligned with the light filters 40' respectively. Through this configuration, the manufacturing process will be simplified to reduce the manufacturing cost of the array imaging module. Preferably, the light filter supporter 70' is received in the indention groove 235' of the main mold body 232' to further reduce the size of the array imaging module. Therefore, the structure of the array imaging module will be more compact.

Figure 42:
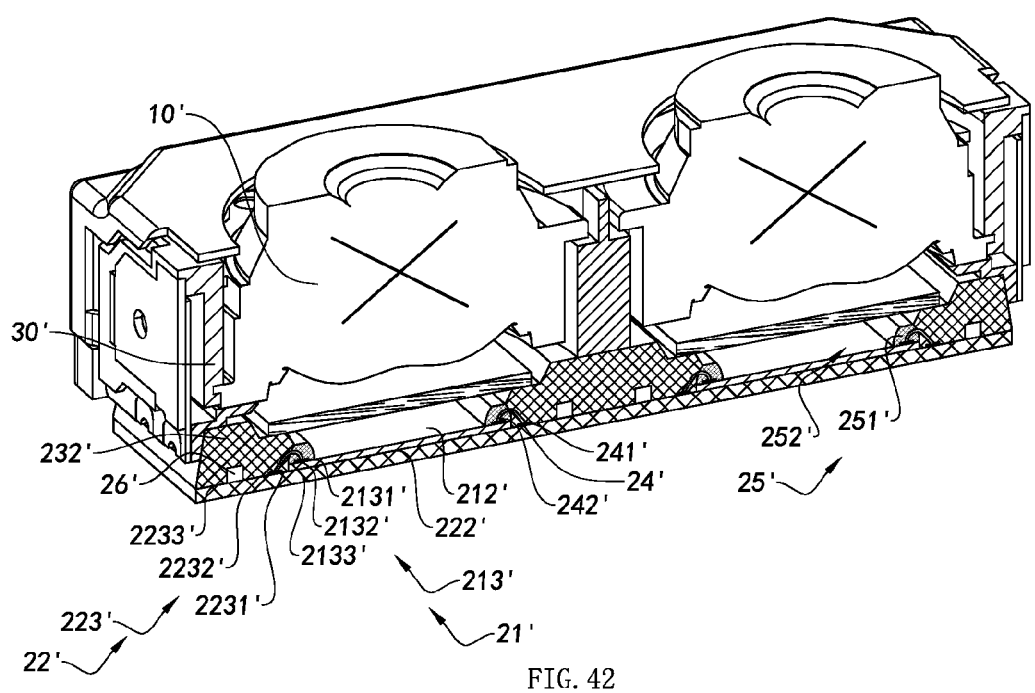
FIG. 42 illustrates a fifth alternative mode of the structural configuration of the array imaging module according to the above preferred embodiments of the present invention.

FIG. 42 illustrates another alternative mode of the array imaging module according to the present invention, which comprises at least two drivers 30 which are integrally formed with a motor carrier 31. For example, the array imaging module comprises two drivers 30, the drivers 30 are integrally formed with the motor carrier 31, such that the drivers 30 can be easily coupled at the top side of the main mold body 23 to minimize a distance between the driver 30 and the optical lens 10, so as to have a compact structure of the array imaging module.

Figure 43:
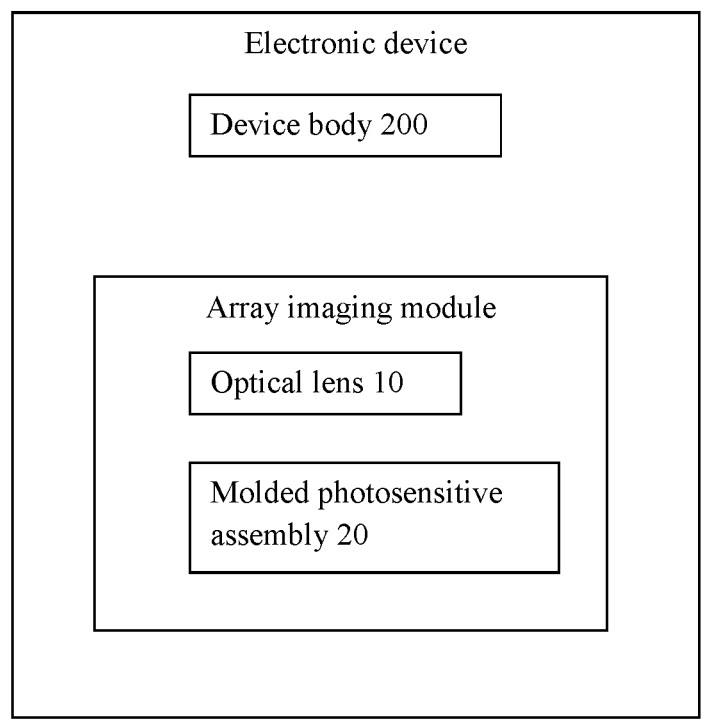
FIG. 43 illustrates an electronic device built-in with the array imaging module according to the above preferred embodiments of the present invention.

As shown in FIG. 43, the present invention provides an electronic device built-in with the array imaging module. The electronic device comprises a device body 200' with a device processor therein, wherein the array imaging module is mounted at the device body 200' to operatively link to the device processor therein for capturing image.

In another embodiment, the present invention further provides a manufacturing process of the molded photosensitive assembly 20 which comprises the following steps.

(a) Electrically connect at least two photosensitive units 21' to at least one circuit board 22' via at least a lead wire 24'.

(b) Dispose the photosensitive units 21' and the circuit board 22' in one of the upper mold body 101' and the lower mold body 102' of a mold 100'.

(c) During the coupling of the upper mold body 101' and the lower mold body 102' with each other to close the mold 100', retain the mold engaging surface 1011' of the upper mold body 101' by at least a supporting member 25' to prevent the lead wire 24' being pressed by the mold engaging surface 1011' of the upper mold body 101'.

(d) Form at least a mold cavity 103' between the upper mold body 101' and the lower mold body 102', and introduce a mold material into the mold cavity 103', wherein the mold material forms a molded base 23' after it is solidified. The molded base 23' comprises a main mold body 232' and has at least two optical windows 231'. The main mold body 232' is formed to cover at and bond with at least a portion of the peripheral portion 223' of the circuit board 22' and at least a portion of the supporting member 25'. The photosensitive areas 212' of the photosensitive units 21' are aligned with the optical windows 231' respectively.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A manufacturing method of a molded photosensitive assembly of an array imaging module, comprising the steps of:

(a) providing a circuit board, having at least two sets of electronic elements coupled at a peripheral portion thereof, electrically coupled with at least two photosensitive units each having a photosensitive area and a non-photosensitive area encircling said photosensitive area, one or more connecting elements connecting said two non-photosensitive areas of said at least two photosensitive units with said circuit board;

(b) providing an enclosing film at a mold engaging surface of a first mold body of a mold;

(c) receiving said circuit board in said mold and positioning between said first mold body and a second mold body, wherein when said first mold body and said second mold body are coupled with each other in mold closing state, a mold cavity is formed between said first mold body and said second mold body, wherein said peripheral portion of said circuit board and a center portion of said circuit board are correspondingly disposed in said mold cavity, wherein said mold engaging surface of said first mold body is shielded by said enclosing film from directly contacting with said circuit board and said photosensitive units that provides a buffering effect at said mold engaging surface of said first mold body to prevent said circuit board and said photosensitive units from being directly impacted when said first mold body and said second mold body are closed and coupled with each other, as well as a sealing effect between said mold engaging surface of said first mold body and said photosensitive areas of said photosensitive units to ensure a sealing engagement therebetween;

(d) introducing a fluid state mold material into said closed mold to fill said mold cavity and enclose said electronic elements and said connecting elements, wherein said sealing engagement of said enclosing film prevents said mold material in fluid state flowing to said photosensitive areas of said photosensitive units from said mold cavity;

(e) solidifying said mold material in said mold cavity and forming a molded base integrated with said circuit board and said electronic elements and said connecting elements, wherein said molded base encapsulates and encloses said electronic elements and said connecting elements therein to prevent each of said electronic elements and said connecting elements from exposing and contacting outside, and isolate said electronic elements and said connecting elements with each other to prevent mutual interference by other said electronic elements and connecting elements adjacent thereof while a distance between every two of said electronic elements is able to be reduced and enabling more electronic elements to be arranged electrically coupled at said board, so as to improve an imaging quality and reduce a size of said molded photosensitive assembly; and (f) separating said first mold body and said second mold body and obtaining a molded photosensitive assembly which is an integrated body of said circuit board, said electronic elements and said connecting elements, wherein at least two optical windows are formed in said molded base and aligned along two optical paths of said at least two photosensitive units on said circuit board respectively to define at least two light channels respectively, wherein said first mold body is configured for forming each of said optical windows having a tapered size that a cross section of said optical window is gradually increased from bottom to top, wherein said enclosing film also facilitates such a mold drafting step.

2. The manufacturing method, as recited in claim 1, after the step (f), further comprising a step of:

(g) installing at least two light filters on said molded base, wherein said two light filters are installed at said two optical windows and located along said two optical paths of said two photosensitive units respectively, such that said optical windows of said molded base are sealed by said light filters respectively.

3. The manufacturing method, as recited in claim 2, wherein the step (f) further comprises a step of forming at least two inner lateral top surfaces and at least two outer lateral top surfaces around said two optical windows on a top side of said molded base respectively and, in the step (g), said two light filters are coupled at said two inner lateral top surfaces respectively while two optical lenses are able to be coupled at said two outer lateral top surfaces respectively.

4. The manufacturing method, as recited in claim 3, wherein each of said inner lateral top surface and said respective outer lateral top surface form a step-ladder configuration to define an indention slot, wherein said respective light filters are coupled at said two inner lateral top surfaces within said two indention slots respectively.

5. The manufacturing method, as recited in claim 4, wherein in the step (f), at least two blocking protrusion are protruded from said top side of said molded base, wherein said blocking protrusions are annular partition walls protruded between said inner lateral top surfaces and said outer lateral top surfaces respectively, wherein said optical lenses are installed at said two outer lateral top surfaces of said top side of said molded base respectively for blocking adhesive applied on said outer lateral top surfaces of said top surface of said molded base respectively to adhere the optical lenses respectively from entering into said inner lateral top surfaces where said light filters are mounted thereon respectively to prevent any adhesive contaminating said optical paths and said photosensitive units.

6. The manufacturing method, as recited in claim 1, wherein in the step (a), further comprises a step of forming at least two receiving chambers in a top lateral side of said circuit board.

7. The manufacturing method, as recited in claim 6, after the step (f), further comprising a step of:

(g) receiving and installing said two photosensitive units in said two receiving chambers respectively: and (h) electrically connecting said two photosensitive units with said circuit board through said connecting elements.

8. The manufacturing method, as recited in claim 7, wherein said at least two receiving chambers are indented grooves provided in said top lateral side of said circuit board and each of said receiving chambers has a depth smaller than a thickness of said circuit board.

9. The manufacturing method, as recited in claim 7, wherein said at least two receiving chambers are through holes.

10. The manufacturing method, as recited in claim 1, wherein in the step (a), further comprises a step of forming at least two receiving chambers, wherein said at least two receiving chambers are indented grooves provided in a bottom lateral side of said circuit board and said circuit board further forms at least two conductive channels therein to communicate said at least two receiving chambers with said at least two optical windows of said molded base respectively.

11. The manufacturing method, as recited in claim 8, after the step (g), further comprising a step of:

(i) installing at least two light filters on said molded base, wherein said two optical filters are installed at said two optical windows and located along said two optical paths of said two photosensitive units respectively, such that said optical windows of said molded base are sealed by said light filters respectively.

12. The manufacturing method, as recited in claim 11, wherein the step (f) further comprises a step of forming at least two inner lateral top surfaces and at least two outer lateral top surfaces around said two optical windows on a top side of said molded base respectively and, in the step (i), said two light filters are coupled at said two inner lateral top surfaces respectively while the optical lenses are able to be coupled at said two outer lateral top surfaces respectively.

13. The manufacturing method, as recited in claim 12, wherein each of said inner lateral top surface and said respective outer lateral top surface form a step-ladder configuration to define an indention slot, wherein said respective light filters are coupled at said two inner lateral top surfaces within said two indention slots respectively.

14. The manufacturing method, as recited in claim 13, wherein in the step (f), at least two blocking protrusion are protruded from said top side of said molded base, wherein said blocking protrusions are annular partition walls protruded between said inner lateral top surfaces and said outer lateral top surfaces respectively, wherein said optical lenses are installed at said two outer lateral top surfaces of said top side of said molded base respectively for blocking adhesive applied on said outer lateral top surfaces of said top surface of said molded base respectively to adhere the optical lenses respectively from entering into said inner lateral top surfaces where said light filters are mounted thereon respectively to prevent any adhesive contaminating said optical paths and said photosensitive units.

15. The manufacturing method, as recited in claim 9, after the step (h), further comprising a step of:
(i) installing at least two light filters on said molded base, wherein said two optical filters are installed at said two optical windows and located along said two optical paths of said two photosensitive units respectively, such that said optical windows of said molded base are sealed by said light filters respectively.

16. The manufacturing method, as recited in claim 15, wherein the step (f) further comprises a step of forming at least two inner lateral top surfaces and at least two outer lateral top surfaces around said two optical windows on a top side of said molded base respectively and, in the step (i), said two light filters are coupled at said two inner lateral top surfaces respectively while the optical lenses are able to be coupled at said two outer lateral top surfaces respectively.

17. The manufacturing method, as recited in claim 16, wherein each of said inner lateral top surface and said respective outer lateral top surface form a step-ladder configuration to define an indention slot, wherein said respective light filters are coupled at said two inner lateral top surfaces within said two indention slots respectively.

18. The manufacturing method, as recited in claim 17, wherein in the step (f), at least two blocking protrusion are protruded from said top side of said molded base, wherein said blocking protrusions are annular partition walls protruded between said inner lateral top surfaces and said outer lateral top surfaces respectively, wherein said optical lenses are installed at said two outer lateral top surfaces of said top side of said molded base respectively for blocking adhesive applied on said outer lateral top surfaces of said top surface of said molded base respectively to adhere the optical lenses respectively from entering into said inner lateral top surfaces where said light filters are mounted thereon respectively to prevent any adhesive contaminating said optical paths and said photosensitive units.

19. The manufacturing method, as recited in claim 10, after the step (h), further comprising a step of:
(i) installing at least two light filters on said molded base, wherein said two optical filters are installed at said two optical windows and located along said two optical paths of said two photosensitive units respectively, such that said optical windows of said molded base are sealed by said light filters respectively.

20. The manufacturing method, as recited in claim 19, wherein the step (f) further comprises a step of forming at least two inner lateral top surfaces and at least two outer lateral top surfaces around said two optical windows on a top side of said molded base respectively and, in the step (i), said two light filters are coupled at said two inner lateral top surfaces respectively while the optical lenses are able to be coupled at said two outer lateral top surfaces respectively.

21. The manufacturing method, as recited in claim 20, wherein each of said inner lateral top surface and said respective outer lateral top surface form a step-ladder configuration to define an indention slot, wherein said respective light filters are coupled at said two inner lateral top surfaces within said two indention slots respectively.

22. The manufacturing method, as recited in claim 21, wherein in the step (f), at least two blocking protrusion are protruded from said top side of said molded base, wherein said blocking protrusions are annular partition walls protruded between said inner lateral top surfaces and said outer lateral top surfaces respectively, wherein said optical lenses are installed at said two outer lateral top surfaces of said top side of said molded base respectively for blocking adhesive applied on said outer lateral top surfaces of said top surface of said molded base respectively to adhere the optical lenses respectively from entering into said inner lateral top surfaces where said light filters are mounted thereon respectively to prevent any adhesive contaminating said optical paths and said photosensitive units.

23. The manufacturing method, as recited in claim 1, wherein in the step (e), said molded base is integrally molded on each of said photosensitive units in such a manner that said molded base has an inner surface which is integrally and inclinedly extended from said non-photosensitive area of each of said photosensitive units.

24. The manufacturing method, as recited in claim 1, further comprising the steps of:
Installing at least one supporter with at least one light filter at said molded base, wherein said at least one supporter has at least a through hole located above at least one of said optical windows, wherein said at least one light filter is installed at said at least one supporter and located along said photosensitive path of one of said photosensitive units correspondingly.

\* \* \* \* \*